US010373676B2

(12) United States Patent
Takahashi et al.

(10) Patent No.: US 10,373,676 B2

(45) Date of Patent: Aug. 6, 2019

(54) SEMICONDUCTOR DEVICE, DISPLAY PANEL, AND ELECTRONIC DEVICE

(71) Applicant: Semiconductor Energy Laboratory Co., Ltd., Kanagawa-ken (JP)

(72) Inventors: Kei Takahashi, Kanagawa (JP); Takayuki Ikeda, Kanagawa (JP); Naoaki Tsutsui, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/383,100

(22) Filed: Dec. 19, 2016

(65) Prior Publication Data

US 2018/0174647 A1 Jun. 21, 2018

(30) Foreign Application Priority Data

Dec. 22, 2015 (JP) ................................ 2015-249242

(51) Int. Cl.

| | |
|---|---|
| ***G11C 11/4074*** | (2006.01) |
| ***G11C 11/419*** | (2006.01) |
| ***H01L 27/12*** | (2006.01) |
| ***G09G 3/36*** | (2006.01) |
| ***G09G 5/00*** | (2006.01) |
| ***G11C 11/4072*** | (2006.01) |
| ***G11C 7/02*** | (2006.01) |
| ***G11C 11/405*** | (2006.01) |
| ***G11C 11/408*** | (2006.01) |
| *H01L 29/786* | (2006.01) |
| *H01L 29/78* | (2006.01) |
| *H01L 29/24* | (2006.01) |

(52) U.S. Cl.

CPC .............. *G11C 11/419* (2013.01); *G09G 3/36* (2013.01); *G09G 5/00* (2013.01); *G11C 7/02* (2013.01); *G11C 11/405* (2013.01); *G11C 11/4072* (2013.01); *G11C 11/4074* (2013.01); *G11C 11/4085* (2013.01); *H01L 27/1207* (2013.01); *H01L 27/1211* (2013.01); *H01L 29/24* (2013.01); *H01L 29/7851* (2013.01); *H01L 29/7869* (2013.01)

(58) Field of Classification Search

CPC ........ G09G 3/36; G09G 5/00; G11C 11/4072; G11C 11/4074

See application file for complete search history.

(56) References Cited

U.S. PATENT DOCUMENTS 5,001,539 A * 3/1991 Inoue .................. H01L 27/0688 257/903

7,859,510 B2 12/2010 Umezaki (Continued)

*Primary Examiner* — Hoai V Ho

*Assistant Examiner* — Jay W. Radke

(74) *Attorney, Agent, or Firm* — Husch Blackwell LLP

(57) ABSTRACT

Objects are to provide a semiconductor device with a novel structure, to provide a semiconductor device with high resistance to noise, to provide a semiconductor device with a small chip area, and to provide a semiconductor device with low power consumption. In a memory cell included in a frame memory, a transistor containing an oxide semiconductor and a transistor containing silicon are used in combination to retain charge, whereby data is retained. In this structure, turning off the transistor containing an oxide semiconductor can prevent data fluctuations even if power noise through a wiring is generated.

15 Claims, 38 Drawing Sheets

(56) References Cited

U.S. PATENT DOCUMENTS

| | | | | |
|---|---|---|---|---|
| 8,400,817 | B2 | 3/2013 | Yamazaki et al. | |
| 8,411,480 | B2 | 4/2013 | Nagatsuka et al. | |
| 8,472,231 | B2 | 6/2013 | Takemura | |
| 8,634,228 | B2 | 1/2014 | Matsuzaki et al. | |
| 9,508,276 | B2 | 11/2016 | Hirakata et al. | |
| 2004/0125681 | A1* | 7/2004 | Yamaoka | G11C 11/417 365/229 |
| 2006/0114210 | A1* | 6/2006 | Chen | G09G 3/3611 345/98 |
| 2007/0008776 | A1* | 1/2007 | Scheuerlein | G11C 14/0063 365/185.17 |
| 2008/0037358 | A1* | 2/2008 | Yabuuchi | G11C 5/147 365/230.06 |
| 2008/0186266 | A1 | 8/2008 | Takahashi | |
| 2010/0254179 | A1* | 10/2010 | Kim | G11C 11/4076 365/149 |
| 2011/0121286 | A1* | 5/2011 | Yamazaki | G11C 11/403 257/43 |
| 2011/0128777 | A1* | 6/2011 | Yamazaki | G11C 11/405 365/149 |
| 2011/0157254 | A1 | 6/2011 | Yamazaki et al. | |

* cited by examiner crystal structure of $InMZnO_4$

SEMICONDUCTOR DEVICE, DISPLAY PANEL, AND ELECTRONIC DEVICE

BACKGROUND OF THE INVENTION

1. Field of the Invention

One embodiment of the present invention relates to a semiconductor device, a display panel, and an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

A source driver integrated circuit (IC) in which a frame memory and a source driver are embedded has been known (e.g., see Patent Document 1). For the frame memory, static random access memory (SRAM) is generally used.

PATENT DOCUMENT

Patent Document 1: United States Published Patent Application No. 2008/0186266

SUMMARY OF THE INVENTION

SRAM is capable of retaining data while power is on. Meanwhile, the amount of data retained in SRAM increases along with higher definition of a display device. To deal with the increase in data amount, transistors that constitute SRAM have been miniaturized to reduce the cell area. However, transistor miniaturization causes the increase in leakage current. As a result, power consumption is increased in a source driver IC embedded with a frame memory using SRAM.

The leakage current of SRAM can be suppressed to some extent by lowering the power supply voltage; however, the amount of flowing current is reduced. Thus, the read speed is decreased in a source driver IC embedded with a frame memory using SRAM.

Moreover, when the power supply voltage is lowered, data retained in SRAM is affected by noise from a wiring that supplies the power supply voltage. Thus, a source driver IC embedded with a frame memory using SRAM is susceptible to power noise.

Since SRAM has a large number of transistors and a large cell area, the chip area of a source driver IC embedded with a frame memory using SRAM is increased.

An object of one embodiment of the present invention is to provide a novel semiconductor device that has a structure different from that of an existing semiconductor device functioning as a source driver IC, a novel display panel, and a novel electronic device. Another object of one embodiment of the present invention is to provide a semiconductor device or the like with a novel structure and low power consumption, as a semiconductor device functioning as a source driver IC embedded with a frame memory. Another object of one embodiment of the present invention is to provide a semiconductor device or the like that has a novel structure and is capable of suppressing the reduction in read speed, as a semiconductor device functioning as a source driver IC embedded with a frame memory. Another object of one embodiment of the present invention is to provide a semiconductor device or the like that has a novel structure and is highly resistant to power noise, as a semiconductor device functioning as a source driver IC embedded with a frame memory. Another object of one embodiment of the present invention is to provide a semiconductor device or the like with a novel structure and a small chip area, as a semiconductor device functioning as a source driver IC embedded with a frame memory.

Note that the objects of one embodiment of the present invention are not limited to the above objects. The objects described above do not preclude the existence of other objects. The other objects are objects that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device including a frame memory and a source driver. The frame memory includes a memory cell including a first transistor and a second transistor. One of a source and a drain of the first transistor is electrically connected to a gate of the second transistor. The first transistor in an off state has a function of making the gate of the second transistor retain charge corresponding to data.

One embodiment of the present invention is a semiconductor device including a frame memory and a source driver. The frame memory includes a memory cell including a first transistor and a second transistor. The source driver includes a buffer circuit including an operational amplifier. The operational amplifier is supplied with a positive power supply voltage and a negative power supply voltage. One of a source and a drain of the first transistor is electrically connected to a gate of the second transistor. The first transistor in an off state has a function of making the gate of the second transistor retain charge corresponding to data. A voltage applied to a gate of the first transistor to turn off the first transistor is lower than the negative power supply voltage.

In one embodiment of the present invention, the semiconductor device preferably includes a voltage generator circuit that has a function of generating the positive power supply voltage, the negative power supply voltage, and the voltage applied to the gate of the first transistor.

In one embodiment of the present invention, the semiconductor device preferably includes a display controller that has a function of transferring the data retained in the frame memory to the source driver in a period during which an output voltage of the buffer circuit is stable in one gate scan period.

In the semiconductor device of one embodiment of the present invention, a channel formation region of the first transistor preferably contains an oxide semiconductor.

In the semiconductor device of one embodiment of the present invention, a channel formation region of the second transistor preferably contains silicon.

In the semiconductor device of one embodiment of the present invention, a layer including the first transistor is preferably placed above a layer including the second transistor.

Note that other embodiments of the present invention will be shown in the following embodiments and the drawings.

One embodiment of the present invention can provide a novel semiconductor device, a novel display panel, and a novel electronic device. Another embodiment of the present invention can provide a semiconductor device or the like with a novel structure and low power consumption, as a semiconductor device functioning as a source driver IC embedded with a frame memory. Another embodiment of the present invention can provide a semiconductor device or the like that has a novel structure and is capable of suppressing the reduction in read speed, as a semiconductor device functioning as a source driver IC embedded with a frame memory. Another embodiment of the present invention can provide a semiconductor device or the like that has a novel structure and is highly resistant to power noise, as a semiconductor device functioning as a source driver IC embedded with a frame memory. Another embodiment of the present invention can provide a semiconductor device or the like with a novel structure and a small chip area, as a semiconductor device functioning as a source driver IC embedded with a frame memory.

Note that the effects of one embodiment of the present invention are not limited to the above effects. The effects described above do not preclude the existence of other effects. The other effects are effects that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

DETAILED DESCRIPTION OF THE INVENTION

Figure 1A:
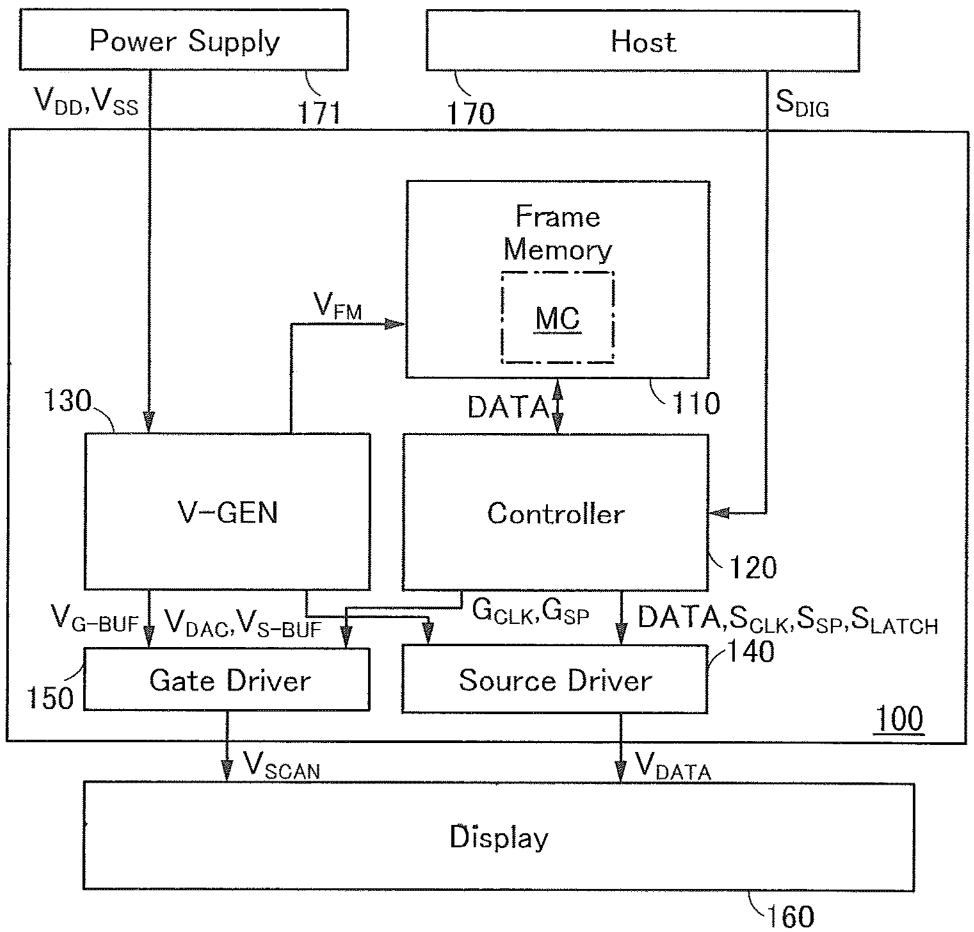
FIGS. 1A and 1B illustrate an example of a block diagram and a circuit diagram.

Embodiments will be described below with reference to the accompanying drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components. For example, in this specification and the like, a "first" component in one embodiment can be referred to as a "second" component in other embodiments or claims or can be omitted in other embodiments or claims.

The same elements or elements having similar functions, elements formed using the same material, elements formed at the same time, or the like in the drawings are sometimes denoted by the same reference numerals, and the description thereof is not repeated in some cases.

(Embodiment 1)

In this embodiment, an example of a semiconductor device functioning as a source driver IC will be described.

FIG. 1A illustrates an example of a block diagram that schematically shows a structure of a semiconductor device.

A semiconductor device 100 illustrated in FIG. 1A includes a frame memory 110 (shown as "Frame Memory"), a display controller 120 (shown as "Controller"), a voltage generator circuit 130 (shown as "V-GEN"), a source driver 140 (shown as "Source Driver"), and a gate driver 150 (shown as "Gate Driver"). The frame memory 110 includes a memory cell MC.

The frame memory 110 retains display data DATA for performing display in a display device 160 (shown as "Display"). The frame memory 110 writes and reads the display data DATA to/from the memory cell MC under the control of the display controller 120. A voltage $V_{FM}$ is supplied to the frame memory 110 from the voltage generator circuit 130.

A digital signal $S_{DIG}$ output from a host processor 170 (shown as "Host") is input to the display controller 120 through an interface. On the basis of the digital signal $S_{DIG}$, the display controller 120 controls control signals of the source driver 140 and the gate driver 150 and controls writing and reading of the display data DATA to/from the frame memory 110. The control signals of the source driver 140 are a clock signal $S_{CLK}$, a start pulse $S_{SP}$, and a latch signal $S_{LATCH}$, for example. The control signals of the gate driver 150 are a clock signal $G_{CLK}$ and a start pulse $G_{SP}$, for example.

A voltage $V_{DD}$ and a voltage $V_{SS}$ that serve as reference voltages output from a power supply 171 (shown as "Power Supply") are input to the voltage generator circuit 130. Note that the voltage $V_{SS}$ is preferably a ground voltage GND. The voltage generator circuit 130 generates voltages for driving the frame memory 110, the source driver 140, and the gate driver 150 on the basis of the voltage $V_{DD}$ and the voltage $V_{SS}$. A voltage output to the frame memory 110 is the voltage $V_{FM}$, for example. Voltages output to the source driver 140 are a voltage $V_{DAC}$ and a voltage $V_{S\text{-}BUF}$, for example. A voltage output to the gate driver 150 is a voltage $V_{G\text{-}BUF}$, for example.

The source driver 140 converts the display data DATA into a data voltage $V_{DATA}$ in accordance with the voltage $V_{DAC}$, the voltage $V_{S\text{-}BUF}$, and the control signals (the clock signal $S_{CLK}$, the start pulse $S_{SP}$, and the latch signal $S_{LATCH}$) and outputs the data voltage $V_{DATA}$ to the display device 160.

The gate driver 150 outputs a scan voltage $V_{SCAN}$ to the display device 160 in accordance with the voltage $V_{G\text{-}BUF}$ and the control signals (the clock signal $G_{CLK}$ and the start pulse $G_{SP}$).

Figure 1B:
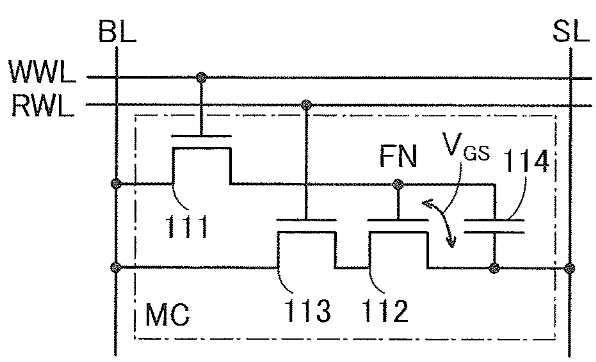

FIG. 1B illustrates an example of a circuit diagram of the memory cell MC included in the frame memory 110.

The memory cell MC illustrated in FIG. 1B includes a transistor 111, a transistor 112, a transistor 113, and a capacitor 114. The transistors 111 to 113 are n-channel transistors in FIG. 1B but may be p-channel transistors.

A gate of the transistor 111 is connected to a write word line WWL. One of a source and a drain of the transistor 111 is connected to a bit line BL, and the other of the source and the drain is connected to a gate of the transistor 112 and one electrode of the capacitor 114. One of a source and drain of the transistor 112 is connected to a source line SL, and the other of the source and the drain is connected to one of a source and drain of the transistor 113. A gate of the transistor 113 is connected to a read word line RWL. The other of the source and the drain of the transistor 113 is connected to the bit line BL. The other electrode of the capacitor 114 is connected to the source line SL.

In FIG. 1B, a node where one of the source and the drain of the transistor 111, one electrode of the capacitor 114, and the gate of the transistor 112 are connected becomes electrically floating when the transistor 111 is turned off. For that reason, the node is referred to as floating node FN as illustrated in FIG. 1B.

To write data to the memory cell MC in FIG. 1B, for example, the transistor 111 is turned on while a voltage corresponding to "1" or "0" is supplied to the bit line BL, so that the potentials of the bit line BL and the floating node FN become equal to each other. After that, the transistor 111 is turned off. Charge corresponding to the written voltage is retained at the floating node FN; thus, data retention can be performed.

Data is read from the memory cell MC in FIG. 1B by turning on the transistor 113. The on/off state of the transistor 112 is switched in response to the voltage corresponding to "1" or "0," which is retained at the floating node FN. When both the transistor 112 and the transistor 113 are on, the voltage of the bit line BL changes, and data "1" is read, for example. When the transistor 112 is off and the transistor 113 is on, the voltage of the bit line BL does not change, and data "0" is read.

In the memory cell MC capable of performing data retention described above, even if the voltage of the bit line BL and/or the source line SL changes because of generation of power noise, charge does not enter or leave the floating node FN, and thus the voltage of the floating node FN changes in the same manner. Consequently, the memory cell MC makes retained data to be less likely to be corrupted even if power noise is generated.

In the memory cell MC, the voltage of the floating node FN changes in the same manner as the voltage of the source line SL, and accordingly, a gate-source voltage ($V_{GS}$) of the transistor 112 does not change. A current that flows when data is read from the memory cell MC does not change. In other words, in the semiconductor device 100 including the frame memory 110 having the memory cell MC with the above circuit configuration, the data reading speed can be constant.

The memory cell MC can retain data without an inverter circuit, which SRAM requires. Thus, power consumption due to a leakage current that flows through an inverter circuit can be eliminated. That is, power consumption can be reduced in the semiconductor device 100 including the frame memory 110 having the memory cell MC with the above circuit configuration.

The number of transistors per memory cell MC is smaller than that per SRAM cell; thus, the cell area of the memory cell MC can be decreased. That is, the increase in chip area can be inhibited in the semiconductor device 100 including the frame memory 110 having the memory cell MC with the above circuit configuration.

Note that the transistor 111 is preferably a transistor that exhibits a low current flowing in the off state (low off-state current). As a transistor with a low off-state current, a transistor containing an oxide semiconductor in a channel formation region (OS transistor) can be used, for example. It is preferable to provide a layer including an OS transistor above a layer including a transistor that contains silicon in a channel formation region (Si transistor) because the memory cell area can be reduced. That is, the semiconductor device 100 including the frame memory 110 having the memory cell MC with the above circuit configuration can inhibit the increase in chip area owing to OS transistors.

Figure 2:
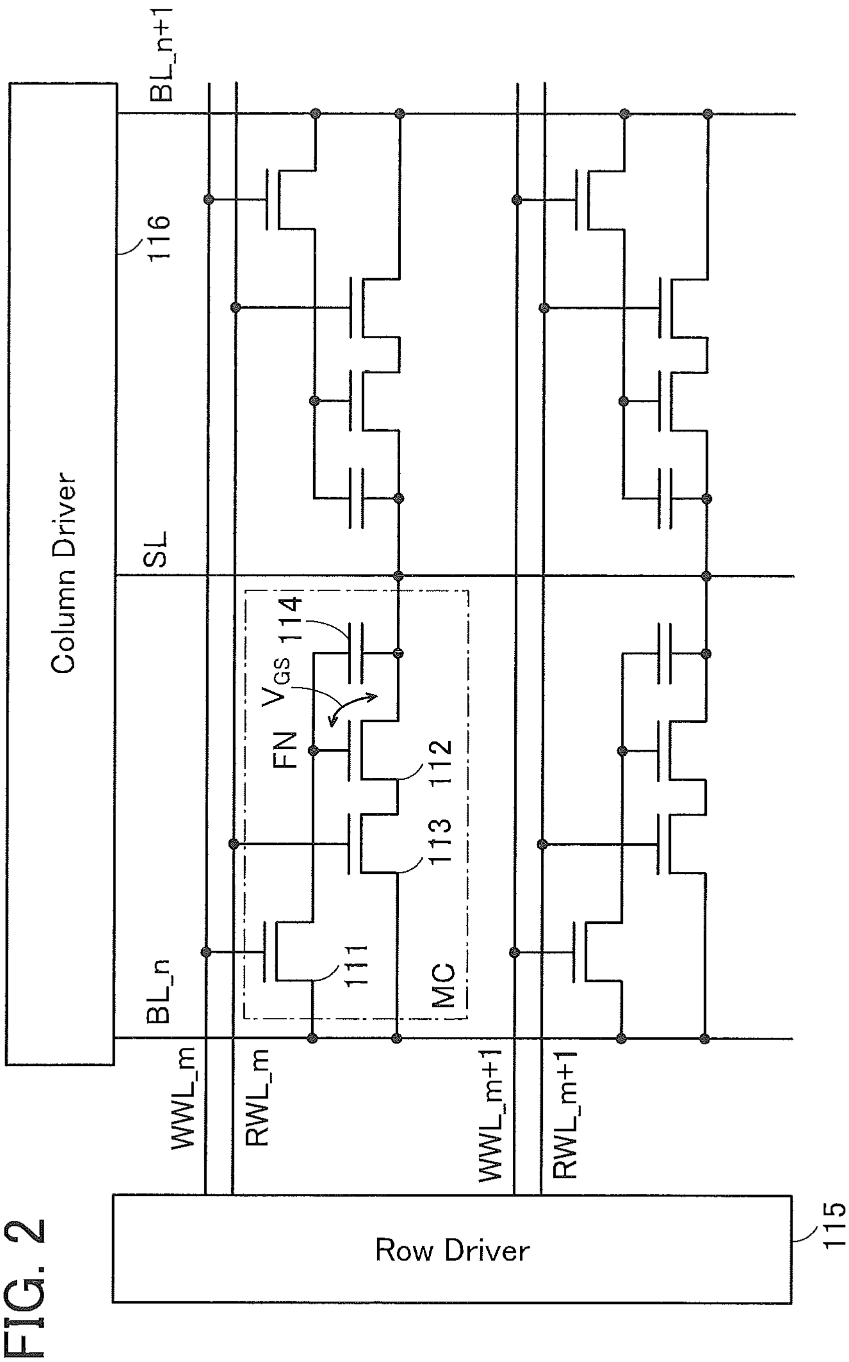
FIG. 2 illustrates an example of a circuit diagram.

FIG. 2 illustrates an example of a circuit diagram showing the memory cells MC included in the frame memory 110 and peripheral circuits for driving the memory cells MC. FIG. 2 shows the memory cells MC of two rows and two columns, bit lines BL_n and BL_n+1, the source line SL, write word lines WWL_m and WWL_m+1, and read word lines RWL_m and RWL_m+1 (m and n are each a natural number).

FIG. 2 also illustrates a row driver 115 (shown as "Row Driver") for driving the write word lines WWL_m and WWL_m+1 and the read word lines RWL_m and RWL_m+1, and a column driver 116 (shown as "Column Driver") for driving the bit lines BL_n and BL_n+1 and the source line SL.

The row driver 115 generates signals for controlling the on/off state of the transistor 111 and the transistor 113 and supplies the signals to the write word lines WWL_m and WWL_m+1 and the read word lines RWL_m and RWL_m+1. The column driver 116 generates signals for data writing and reading and supplies the signals to the bit lines BL_n and BL_n+1 and the source line SL.

Figure 3:
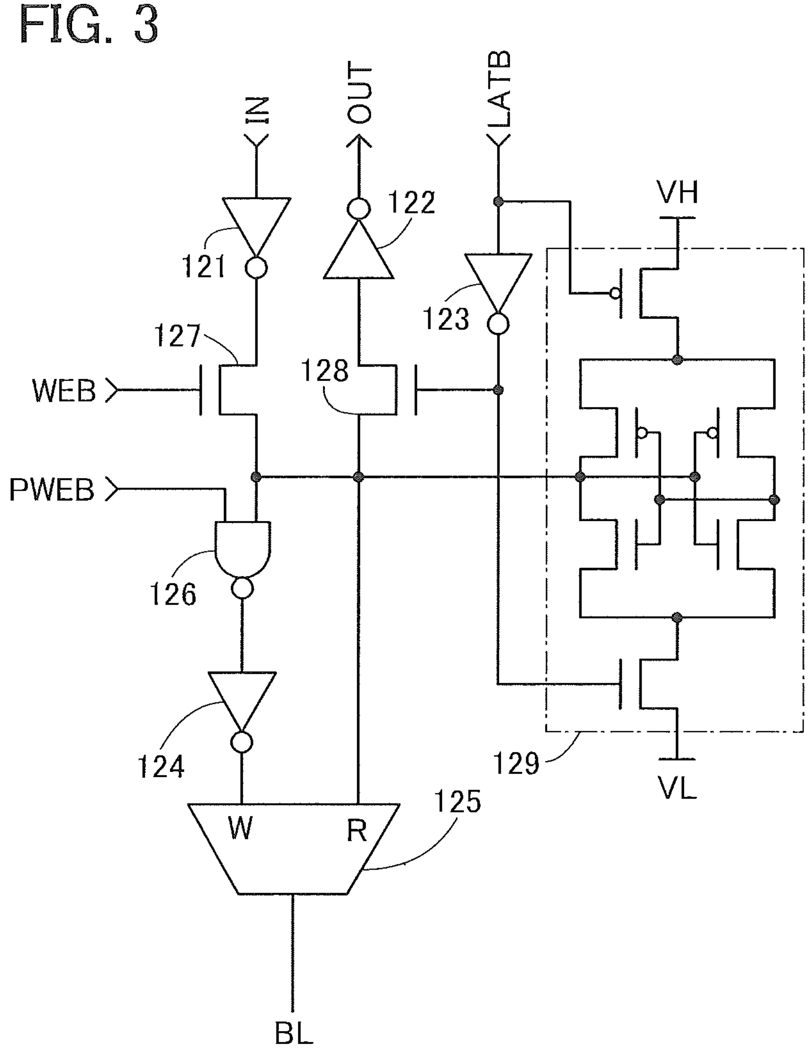
FIG. 3 illustrates an example of a circuit diagram.

FIG. 3 illustrates an example of a circuit in the column driver 116 for transmitting signals for data writing and reading to the bit line BL.

FIG. 3 illustrates an inverter circuit 121, an inverter circuit 122, an inverter circuit 123, an inverter circuit 124, a selector circuit 125, a NAND circuit 126, a transistor 127, a transistor 128, and a latch circuit 129. The transistor 127 and the transistor 128 are n-channel transistors.

The circuit illustrated in FIG. 3 supplies a signal IN corresponding to data to be written, and obtains a signal OUT corresponding to the read data. The latch circuit 129 retains data to be written and read data. A voltage VH supplied to the latch circuit 129 is a voltage retained in the memory cell MC and is preferably higher than the voltage $V_{DD}$. A voltage VL supplied to the latch circuit 129 is preferably the voltage $V_{SS}$, that is, the ground voltage GND. A signal LATB is a signal for controlling the latch circuit 129. A signal WEB is a signal for controlling supply of data to be written, to the latch circuit 129. A signal PWEB is a signal for controlling supply of data retained in the latch circuit 129 to the bit line BL through the selector circuit 125.

Figure 4A:
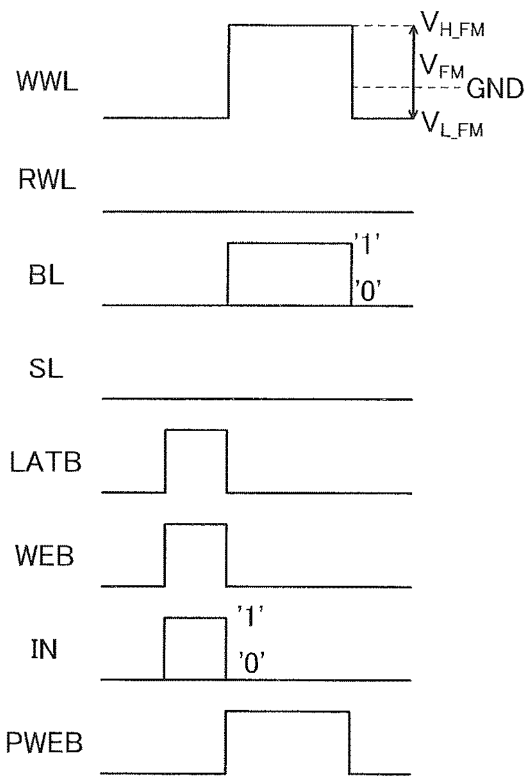
FIGS. 4A and 4B each illustrate an example of a timing chart.
Figure 4B:
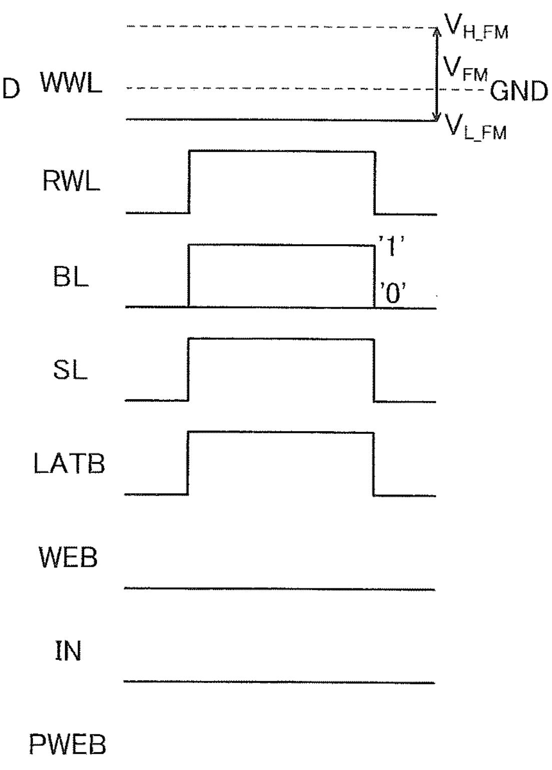

FIGS. 4A and 4B show an example of timing charts for explaining the operation of the circuits illustrated in FIG. 2 and FIG. 3. FIG. 4A is a timing chart showing data writing, and FIG. 4B is a timing chart showing data reading. Note that in the following description, a voltage written to the floating node FN of the memory cell MC is H level for data "1" and L level for data "0."

The voltage $V_{FM}$ supplied from the voltage generator circuit 130 to the frame memory 110 is used in a buffer circuit of the row driver 115. That is, the amplitude voltage of the write word line WWL is the voltage $V_{FM}$. An H-level voltage $V_{FM}$ is represented as a voltage $V_{H\_FM}$, and an L-level voltage $V_{FM}$ is represented as a voltage $V_{L\_FM}$.

Figure 5:
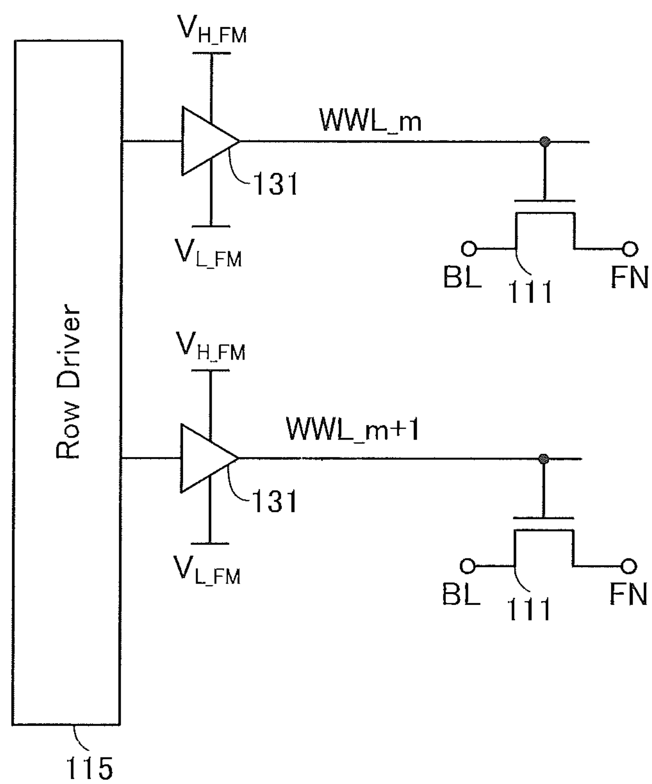
FIG. 5 illustrates an example of a circuit diagram.

FIG. 5 illustrates a circuit around the row driver 115 to explain the voltage $V_{H\_FM}$ and the voltage $V_{L\_FM}$ used in the buffer circuit of the row driver 115. In FIG. 5, the voltage $V_{H\_FM}$ and the voltage $V_{L\_FM}$ for applying the voltage $V_{FM}$ are supplied to a buffer circuit 131. The voltages of the write word lines WWL_m and WWL_m+1 connected to the buffer circuits 131 become the voltage $V_{H\_FM}$ or the voltage $V_{L\_FM}$ and supplied to the gates of the transistors 111 in the memory cells MC.

In the data writing operation in FIG. 4A, first, the signal LATB is set to H level to stop the function of the latch circuit 129. In this state, the signal WEB is set to H level, and an H-level or L-level signal IN is supplied as data. After the signal IN is supplied, the signal LATB is set to L level to restore the function of the latch circuit 129. Thus, the signal IN is retained in the latch circuit 129. The signal retained in the latch circuit 129 is supplied to the bit line BL by setting the signal PWEB to H level. By setting the write word line WWL to H level, the transistor 111 in the memory cell MC is turned on, and a voltage corresponding to the data is written to the floating node FN. After data writing to the memory cell MC is completed, the write word line WWL is set to L level. Note that the source line SL and the read word line RWL remain at L level.

As illustrated in FIG. 4A, the L-level voltage $V_{L\_FM}$ of the write word line WWL is lower than the ground voltage. That is, the L-level voltage of the write word line WWL is supplied to the transistor 111 in the memory cell MC on the basis of the voltage applied to a wiring different from a ground line that supplies the ground voltage. Thus, the L-level voltage of the write word line WWL can be stable, and the transistor 111 can be turned off more reliably.

In the data reading operation in FIG. 4B, the read word line RWL is set to H level to turn on the transistor 113. The bit line BL is made floating with an L-level voltage. The source line SL is set to the voltage VH. When the memory cell MC retains data "0," that is, an L-level voltage, the transistor 112 is turned off because $V_{GS}$ of the transistor 112 becomes lower than or equal to the threshold voltage. Thus, no current flows between the source line SL and the bit line BL, and the voltage of the bit line BL remains at L level. Meanwhile, when the memory cell MC retains data "1," that is, an H-level voltage, the transistor 112 is turned on because $V_{GS}$ of the transistor 112 exceeds the threshold voltage. Consequently, a current flows between the source line SL and the bit line BL, and the voltage of the bit line BL becomes H level. The change in voltage of the bit line BL is retained in the latch circuit 129 by setting the signal LATB to H level and is output as the signal OUT.

Figure 6A:
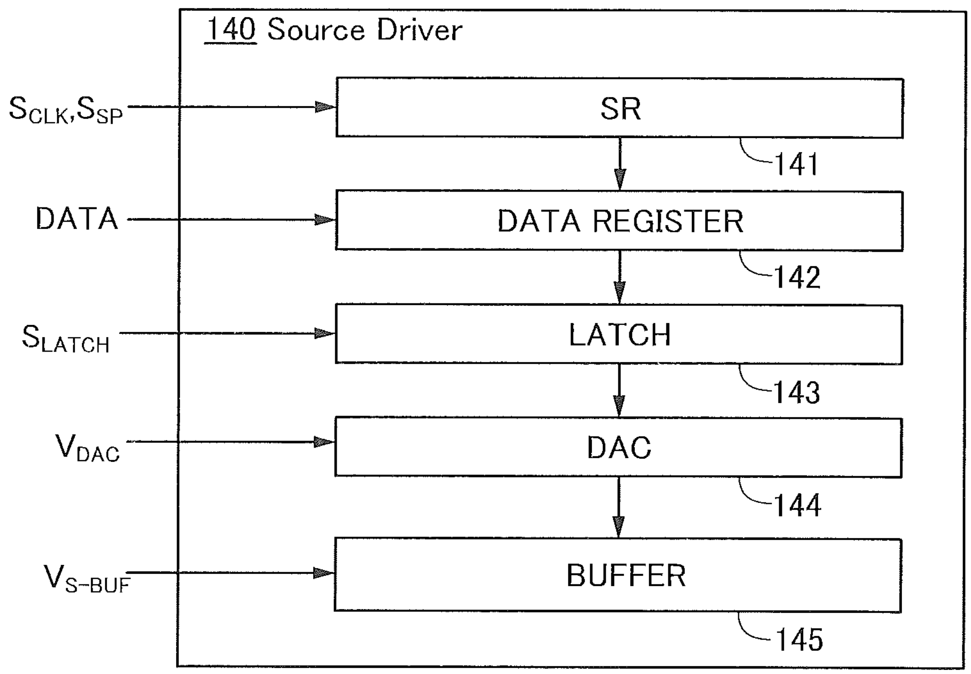
FIGS. 6A and 6B illustrate an example of a block diagram and a circuit diagram.

FIG. 6A is an example of a block diagram of the source driver.

The source driver 140 illustrated in FIG. 6A includes a shift register 141 (shown as "SR"), a data register 142 (shown as "DATA REGISTER"), a latch circuit 143 (shown as "LATCH"), a digital-to-analog converter circuit 144 (shown as "DAC"), and a buffer circuit 145 (shown as "BUFFER"). The clock signal $S_{CLK}$ and the start pulse $S_{SP}$ illustrated in FIG. 1A are signals for driving the shift register 141. The data DATA illustrated in FIG. 1A is a signal retained in the data register 142. The latch signal $S_{LATCH}$ illustrated in FIG. 1A is a signal for driving the latch circuit 143. The voltage $V_{DAC}$ illustrated in FIG. 1A is a voltage for generating the data voltage ($V_{DATA}$), which is a gray level voltage, in the digital-to-analog converter circuit 144. The voltage $V_{S\text{-}BUF}$ illustrated in FIG. 1A is a voltage applied as power for an operational amplifier in the buffer circuit 145.

Figure 6B:
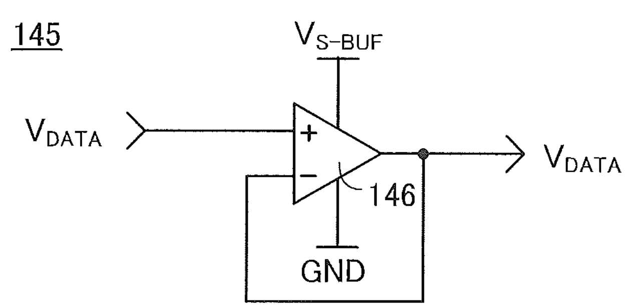

FIG. 6B is an example of a circuit diagram of the operational amplifier included in the buffer circuit 145.

An operational amplifier 146 included in the buffer circuit 145 illustrated in FIG. 6B is supplied with the voltage $V_{S\text{-}BUF}$ and outputs the data voltage $V_{DATA}$. An L-level voltage $V_{S\text{-}BUF}$ is the ground voltage GND, and an H-level voltage $V_{S\text{-}BUF}$ is the voltage $V_{S\text{-}BUF}$.

Figure 7:
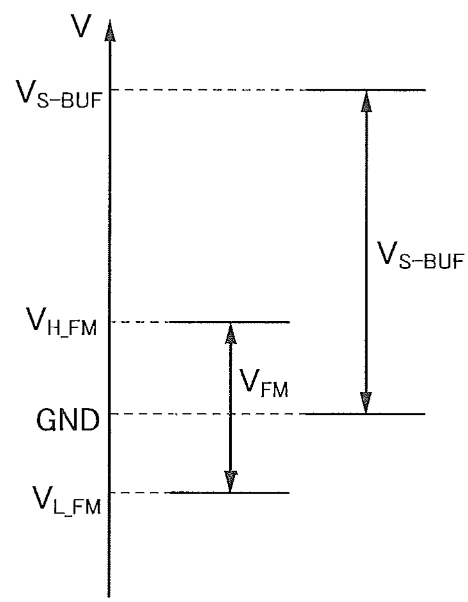
FIG. 7 illustrates a magnitude relation between voltages.

FIG. 7 illustrates the magnitude relation between the following four voltages. The voltage $V_{H\_FM}$ and the voltage $V_{L\_FM}$, which are shown in FIG. 5, are a positive power supply voltage and a negative power supply voltage, respectively, used in the buffer circuit of the row driver 115 and are supplied to the write word line WWL for the memory cell MC. The voltage $V_{S\text{-}BUF}$ and the voltage GND, which are shown in FIGS. 6A and 6B, are supplied to the operational amplifier in the buffer circuit 145 of the source driver 140.

As illustrated in FIG. 7, the voltage $V_{L\_FM}$ supplied to the write word line WWL is different from the ground voltage GND, which is applied to the operational amplifier in the buffer circuit 145 of the source driver 140. Moreover, the voltage $V_{L\_FM}$ supplied to the write word line WWL is lower than the ground voltage GND.

Charge needs to be supplied to the operational amplifier in the buffer circuit 145 in accordance with the amplitude of the data voltage $V_{DATA}$. Thus, because of charge and discharge, a large amount of charge enters or leaves a ground line that supplies the ground voltage GND; hence, the voltage varies and the ground line serves as a noise generation source. In view of this, the use of different wirings for supplying the ground voltage GND and for supplying the voltage $V_{L\_FM}$ (voltage for retaining data) can eliminate most of the influences of power noise on the memory cell MC. Moreover, by making the voltage $V_{L\_FM}$ lower than the ground voltage GND, the L-level voltage of the write word line WWL can be stable, and the transistor 111 can be turned off more reliably.

Figure 8:
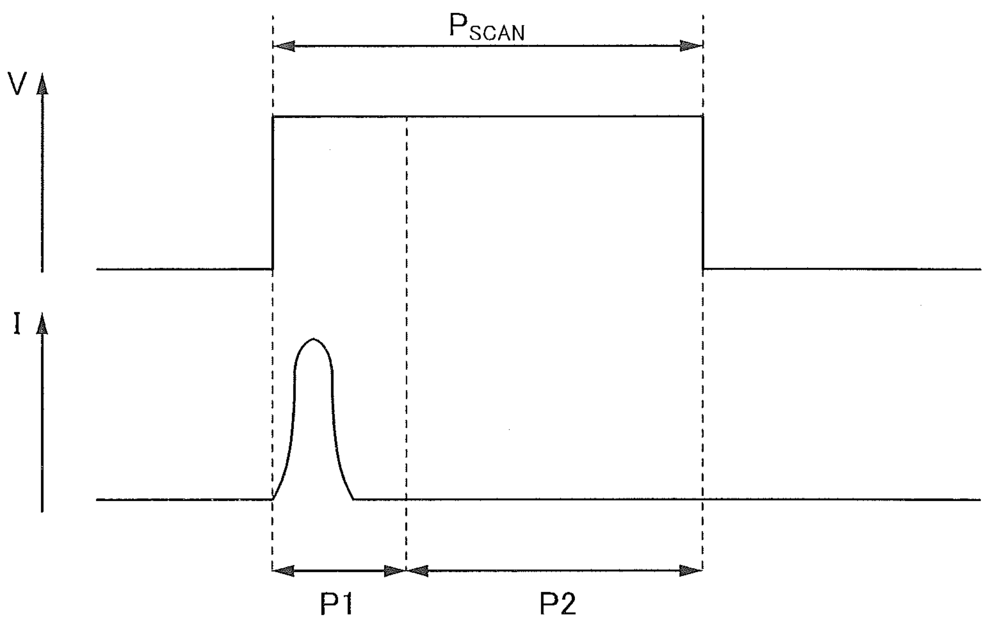
FIG. 8 illustrates an example of a timing chart.

FIG. 8 is a timing chart that schematically illustrates the current amount of the operational amplifier of the buffer circuit 145 in one scan selection period in the display device 160.

FIG. 8 schematically shows a signal of a scan line of the display device in the upper part, and the amount of current flowing through the operational amplifier of the buffer circuit 145 in the lower part. In one scan selection period $P_{SCAN}$ in FIG. 8, when the scan line is set to H level, a transistor in a pixel is turned on, so that charge flows into the pixel (period P1). With this inflow of charge, the amount of charge that enters or leaves the operational amplifier in the buffer circuit 145 is instantaneously increased, and a large amount of current flows through the operational amplifier. After a large amount of current flows through the operational amplifier, the change in voltage of a signal line decreases, so that the amount of current flowing through the operational amplifier decreases (period P2). Thus, power noise is reduced in the period P2. When data writing or reading to/from the frame memory 110 is performed in the period P2, influences of power noise on the frame memory 110 can be further reduced.

Figure 9A:
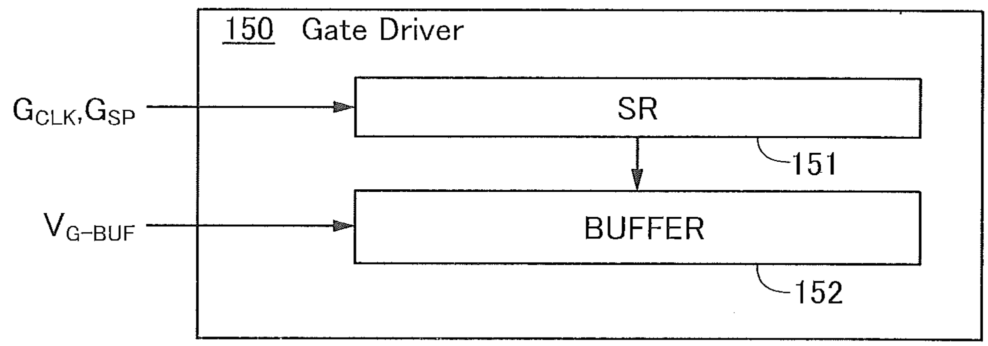
FIGS. 9A and 9B illustrate an example of a block diagram and a circuit diagram.

FIG. 9A is an example of a block diagram of the gate driver.

The gate driver 150 illustrated in FIG. 9A includes a shift register 151 (shown as "SR") and a buffer circuit 152 (shown as "BUFFER"). The clock signal $G_{CLK}$ and the start pulse $G_{SP}$ illustrated in FIG. 1A are signals for driving the shift register 151. The voltage $V_{G\text{-}BUF}$ illustrated in FIG. 1A is a voltage applied as power for an operational amplifier in the buffer circuit 152.

Figure 9B:
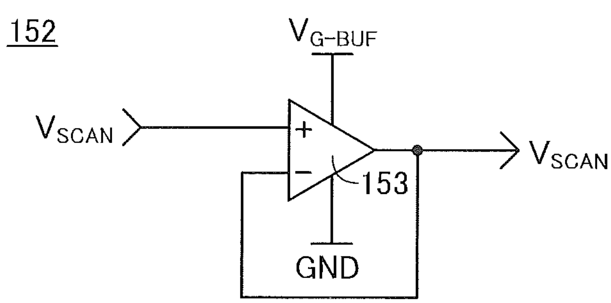

FIG. 9B is an example of a circuit diagram of the operational amplifier included in the buffer circuit 152.

An operational amplifier 153 included in the buffer circuit 152 illustrated in FIG. 9B is supplied with the voltage $V_{G\text{-}BUF}$ and outputs the scan voltage $V_{SCAN}$. An L-level voltage $V_{G\text{-}BUF}$ is the ground voltage GND, and an H-level voltage $V_{G\text{-}BUF}$ is the voltage $V_{G\text{-}BUF}$.

Figure 10A:
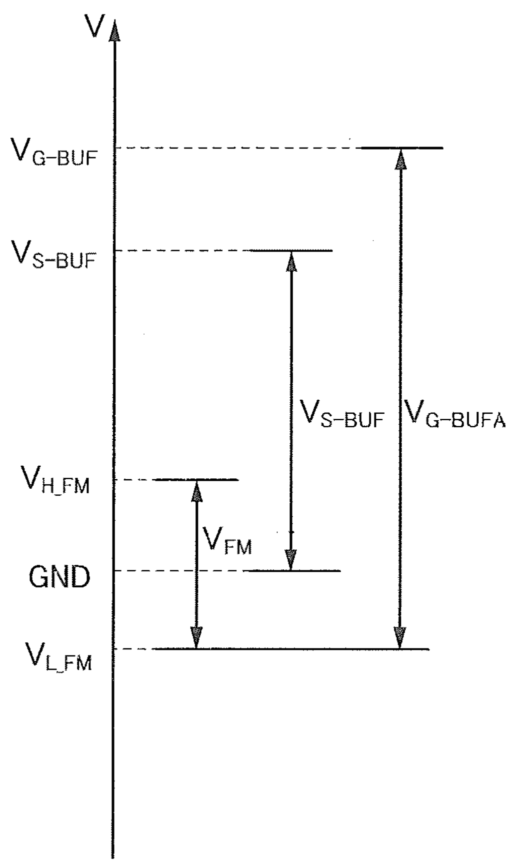
FIGS. 10A and 10B each illustrate a magnitude relation between voltages.
Figure 10B:
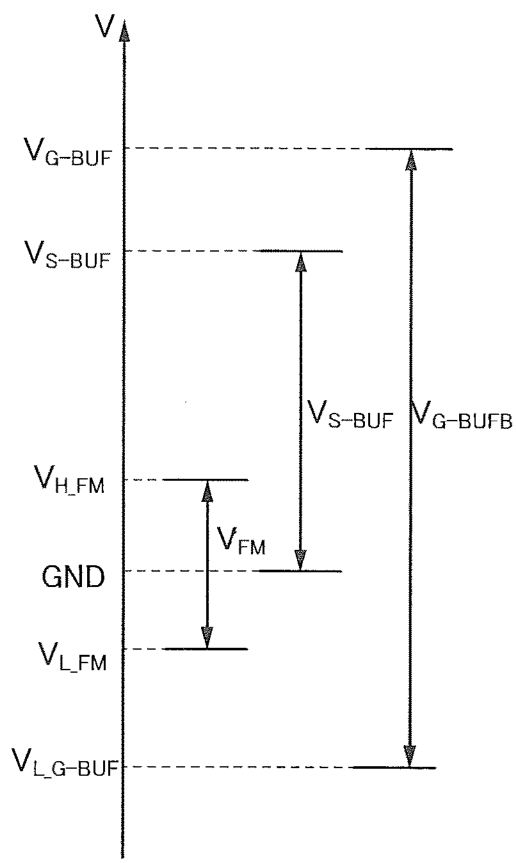

FIGS. 10A and 10B illustrate the magnitude relation between the voltage $V_{H\_FM}$ and the voltage $V_{L\_FM}$ shown in FIG. 5, the voltage $V_{S\text{-}BUF}$ and the voltage GND shown in FIGS. 6A and 6B, and the voltage $V_{G\text{-}BUF}$ and the voltage GND, which are shown in FIGS. 9A and 9B, supplied to the operational amplifier in the buffer circuit 152 of the gate driver 150. As has been described, the voltage $V_{H\_FM}$ and the voltage $V_{L\_FM}$ are the positive power supply voltage and the negative power supply voltage used in the buffer circuit of the row driver 115 and supplied to the write word line WWL for the memory cell MC. The voltage $V_{S\text{-}BUF}$ and the voltage GND are supplied to the operational amplifier in the buffer circuit 145 of the source driver 140.

As illustrated in FIGS. 10A and 10B, the voltage $V_{L\_FM}$ supplied to the write word line WWL can be different from the ground voltage GND, which is supply voltage applied to the operational amplifier in the buffer circuit 152 of the gate driver 150. Specifically, the negative power supply voltage supplied to the operational amplifier in the buffer circuit 152 of the gate driver 150 can be the same voltage as the voltage $V_{L\_FM}$ supplied to the frame memory 110 as illustrated in FIG. 10A, thereby obtaining a voltage $V_{G\text{-}BUFA}$ between the voltage $V_{L\_FM}$ and the voltage $V_{G\text{-}BUF}$. Alternatively, as illustrated in FIG. 10B, the negative power supply voltage supplied to the operational amplifier in the buffer circuit 152 of the gate driver 150 can be a voltage $V_{L\_G\text{-}BUF}$ that is lower than the voltage $V_{L\_FM}$ supplied to the frame memory 110, thereby obtaining a voltage $V_{G\text{-}BUFB}$ between the voltage $V_{L\_G\text{-}BUF}$ and the voltage $V_{G\text{-}BUF}$.

Figure 11A:
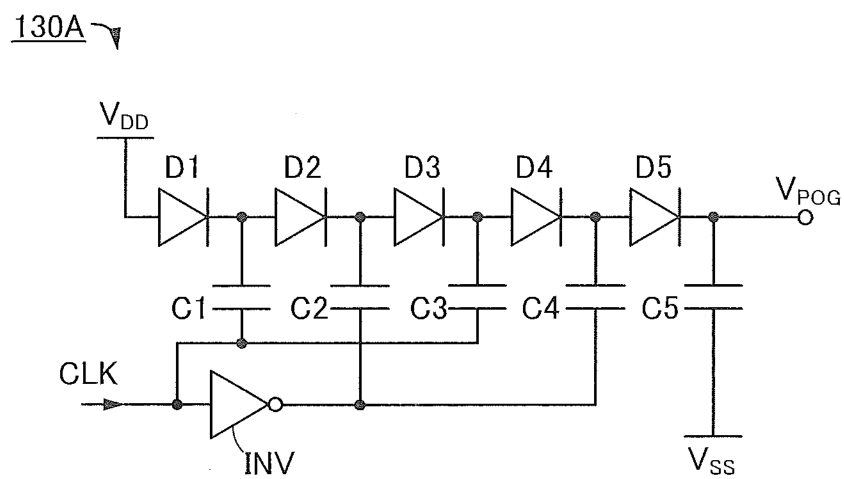
FIGS. 11A and 11B each illustrate an example of a circuit diagram.
Figure 11B:
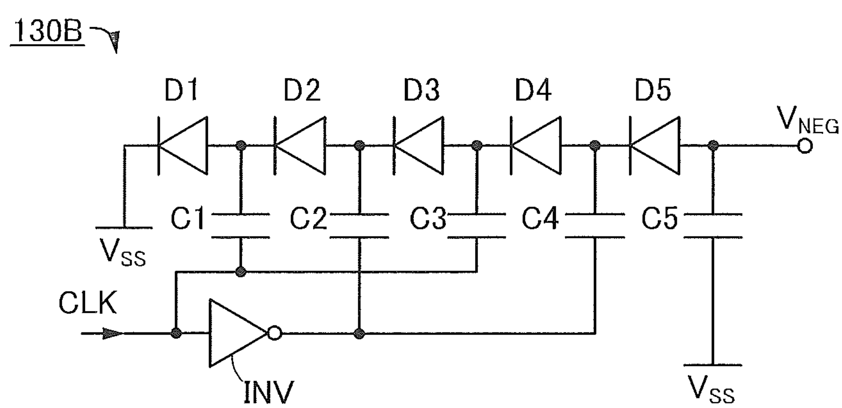

FIGS. 11A and 11B illustrate examples of a circuit for generating a higher or lower voltage from the voltage $V_{DD}$ and the voltage $V_{SS}$, which are the reference voltages in the voltage generator circuit 130.

A voltage generator circuit 130A illustrated in FIG. 11A is a circuit that generates a voltage $V_{POG}$. The voltage generator circuit 130A can generate the voltage $V_{POG}$ on the basis of the voltage $V_{DD}$ and the voltage $V_{SS}$ supplied from the external power supply 171. Thus, the semiconductor device 100 can operate based on the single power supply voltage supplied from the outside.

The voltage generator circuit 130A in FIG. 11A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{DD}$ and the voltage $V_{SS}$, the voltage $V_{POG}$ that is increased to a positive voltage with a positively quintupled value of the voltage $V_{DD}$ by application of the clock signal CLK can be obtained. Note that a forward voltage of the diodes D1 to D5 is 0 V. A desired voltage $V_{POG}$ can be obtained by changing the number of stages of the charge pump.

A voltage generator circuit 130B illustrated in FIG. 11B is a circuit that generates a voltage $V_{NEG}$. The voltage generator circuit 130B can generate the voltage $V_{NEG}$ on the basis of the voltage $V_{DD}$ and the voltage $V_{SS}$ supplied from the external power supply 171. Thus, the semiconductor device 100 can operate based on the single power supply voltage supplied from the outside.

The voltage generator circuit 130B in FIG. 11B is a four-stage charge pump including the diodes D1 to D5, the capacitors C1 to C5, and the inverter INV. The clock signal CLK is supplied to the capacitors C1 to C5 directly or through the inverter INV. When the power supply voltage of the inverter INV is a voltage applied on the basis of the voltage $V_{DD}$ and the voltage $V_{SS}$, the voltage $V_{NEG}$ that is decrease from the voltage $V_{SS}$ to a negative voltage with a negatively quadrupled value of the voltage $V_{DD}$ by application of the clock signal CLK can be obtained. Note that the forward voltage of the diodes D1 to D5 is 0 V. A desired voltage $V_{NEG}$ can be obtained by changing the number of stages of the charge pump.

FIGS. 12A to 12D illustrate circuit configuration examples of a memory cell different from the memory cell MC illustrated in FIG. 1B.

Figure 12A:
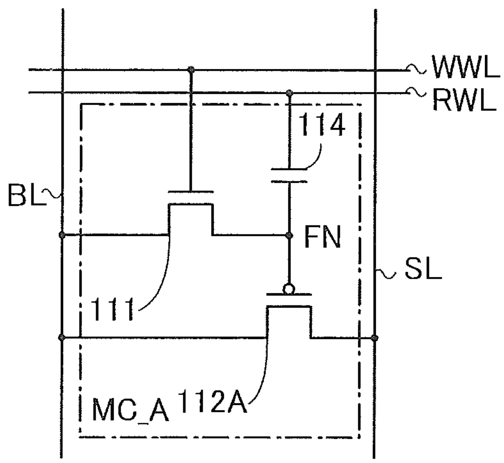
FIGS. 12A to 12D each illustrate an example of a circuit diagram.

A memory cell MC_A illustrated in FIG. 12A includes the transistor 111, a transistor 112A, and the capacitor 114. The transistor 112A is a p-channel transistor. Turning off the transistor 111 allows the floating node FN to retain charge corresponding to data. The memory cell MC in FIG. 1A can employ the configuration in FIG. 12A.

Figure 12B:
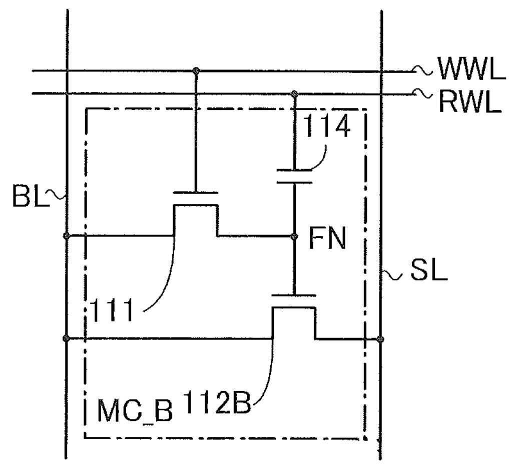

A memory cell MC_B illustrated in FIG. 12B includes the transistor 111, a transistor 112B, and the capacitor 114. The transistor 112B is an n-channel transistor. Turning off the transistor 111 allows the floating node FN to retain charge corresponding to data. The memory cell MC in FIG. 1A can employ the configuration in FIG. 12B.

Figure 12C:
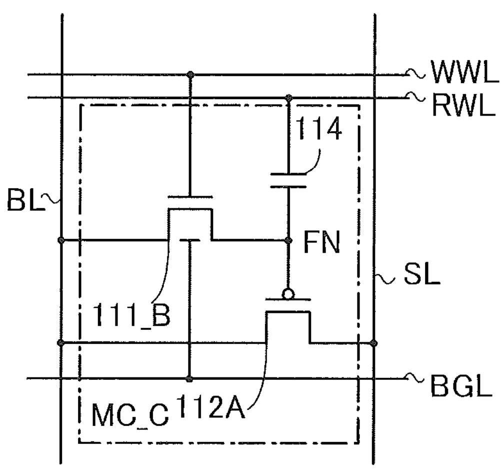

A memory cell MC_C illustrated in FIG. 12C includes a transistor 111_B, the transistor 112A, and the capacitor 114. The transistor 111_B has a backgate that can be controlled by a backgate control line BGL. This structure enables control of the threshold voltage of the transistor 111_B. Turning off the transistor 111_B allows the floating node FN to retain charge corresponding to data. The memory cell MC in FIG. 1A can employ the configuration in FIG. 12C.

Figure 12D:
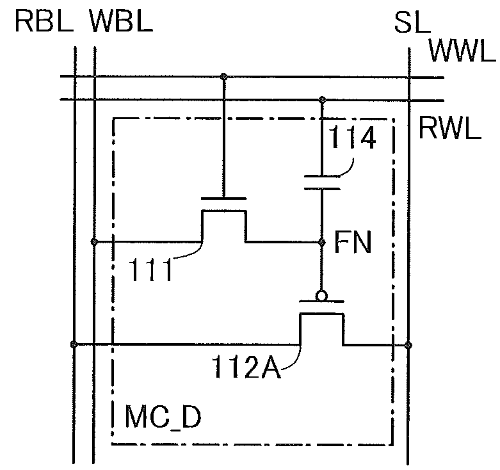

A memory cell MC_D illustrated in FIG. 12D includes the transistor 111, the transistor 112A, and the capacitor 114. The transistor 111 is connected to a write bit line WBL, and the transistor 112A is connected to a read bit line RBL. Turning off the transistor 111 allows the floating node FN to retain charge corresponding to data. The memory cell MC in FIG. 1A can employ the configuration in FIG. 12D.

Figure 13:
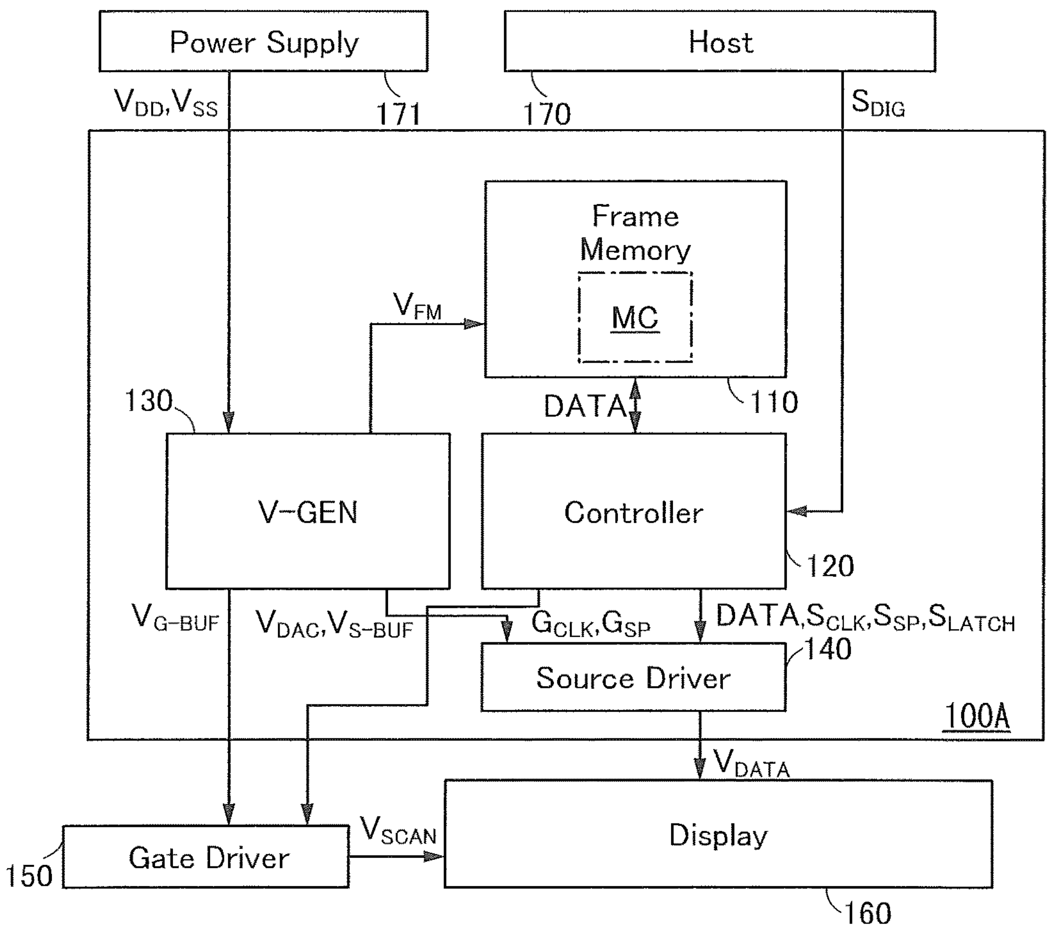
FIG. 13 illustrates an example of a block diagram.

FIG. 13 illustrates an example of a block diagram of a semiconductor device different from that in FIG. 1A.

Unlike in the semiconductor device 100 in FIG. 1A, the gate driver 150 is provided outside a semiconductor device 100A illustrated in FIG. 13. For example, the gate driver 150 can be configured with transistors formed over a substrate where transistors included in pixels of the display device 160 are formed.

Figure 14:
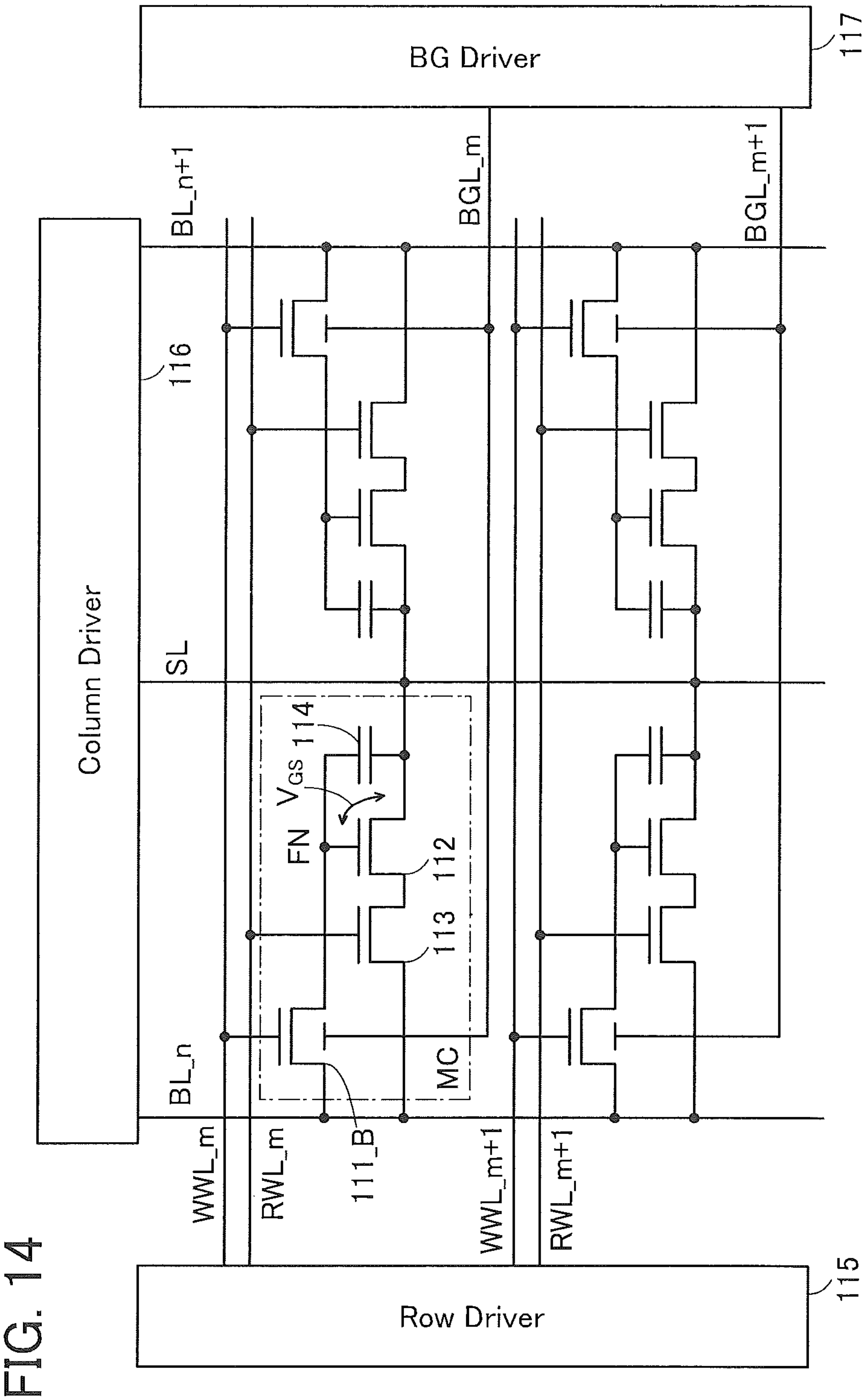
FIG. 14 illustrates an example of a circuit diagram.

The memory cell MC illustrated in FIG. 14 includes the transistor 111_B with a backgate as illustrated in FIG. 12C. As the backgate control line BGL for controlling the backgate of the transistor 111_B, a backgate control line BGL_m and a backgate control line BGL_m+1 are shown in FIG. 14. The backgate control line BGL is connected to a backgate driver 117 (shown as "BG Driver").

Figure 15A:
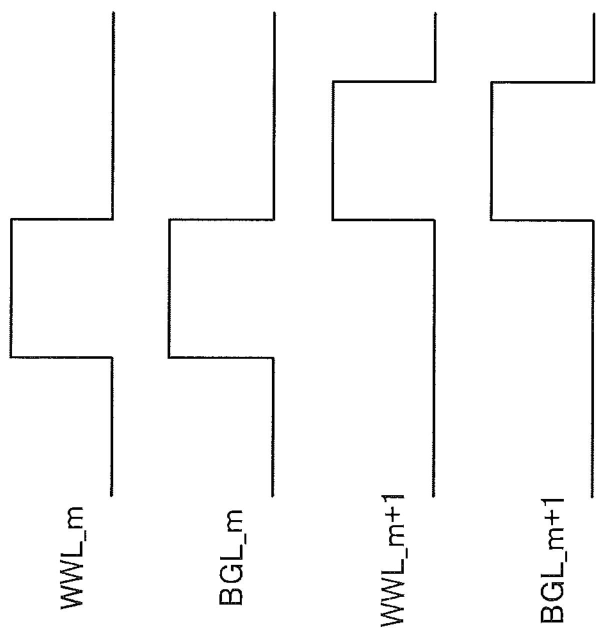
FIGS. 15A and 15B each illustrate an example of a timing chart.
Figure 15B:
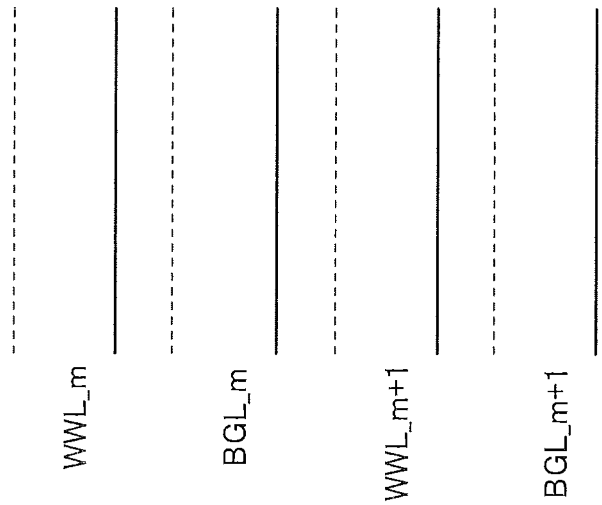

FIGS. 15A and 15B are timing charts for explaining the operation of the backgate driver 117. FIG. 15A shows the operation for data writing, and FIG. 15B shows the operation for data retention.

In FIG. 15A, the backgate driver 117 operates to scan the backgate control line BGL_m and the backgate control line BGL_m+1 sequentially in a manner similar to scanning of the write word line WWL_m and the write word line WWL_m+1. In FIG. 15A, to turn on the transistor 111_B, a signal of the backgate control line is set to H level so that the threshold voltage of the transistor 111_B is shifted in the negative direction to increase the amount of current flowing through the transistor 111_B. In periods other than the data writing period, to turn off the transistor 111_B, a signal of the backgate control line is set to L level as illustrated in FIG. 15B so that the threshold voltage of the transistor 111_B is shifted in the positive direction to decrease the amount of current.

To supply the same signal to the write word line WWL and the backgate of the transistor 111_B, it is possible to consider a structure where the write word line WWL and the backgate are connected through an opening provided in the memory cell MC. However, such a structure results in the increase in memory cell area because the opening is provided within the memory cell MC. In contrast, with the structure explained using FIG. 14 and FIGS. 15A and 15B, the write word line WWL and the backgate are controlled by different control circuits to perform the same operation. With this structure, the backgate and the write word line WWL can be supplied with the same signal, without providing an opening in the memory cell MC. Thus, the increase in on-state current and the decrease in off-state current can be achieved without the increase in cell area.

(Embodiment 2)

This embodiment will describe the semiconductor device that is explained in Embodiment 1 and functions as a source driver IC, a display device driven by the semiconductor device, and their variation examples.

Figure 16:
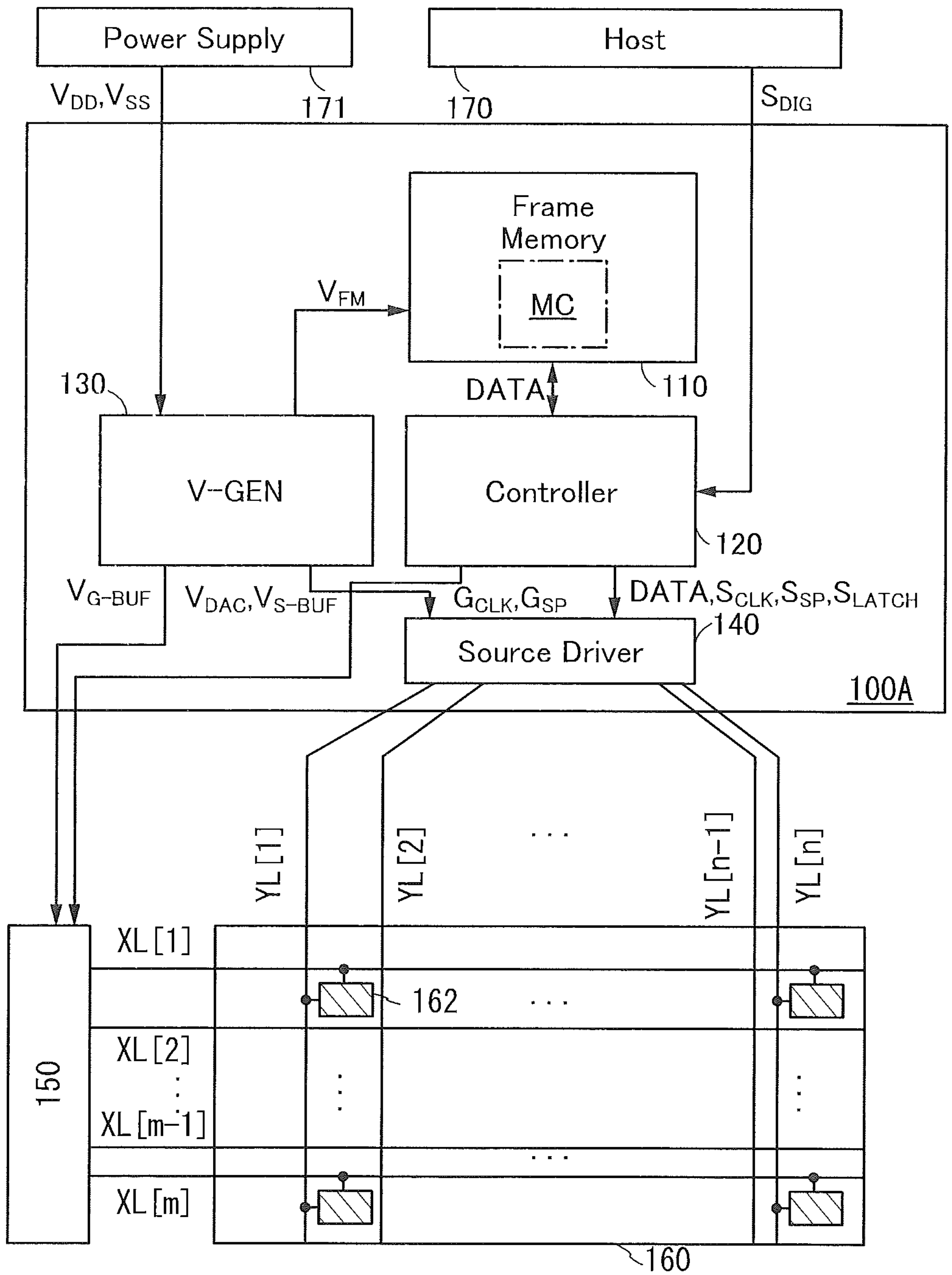
FIG. 16 illustrates an example of a block diagram.

A block diagram of FIG. 16 illustrates the semiconductor device 100A, the host processor 170, the power supply 171, the gate driver 150, and the display device 160. In FIG. 16, scan lines XL[1] to XL[m], signal lines YL[1] to YL[n], and pixels 162 are shown in the display device 160. The semiconductor device 100A has a structure similar to that shown in FIG. 13 of Embodiment 1.

In the display device 160, the scan lines XL[1] to XL[m] and the signal lines YL[1] to YL[n] are provided to intersect at substantially right angles. The pixel 162 is provided at the intersection of the scan line and the signal line. For color display, the pixels 162 corresponding to the respective colors of red, green, and blue (RGB) are arranged in sequence. Note that the pixels of RGB can be arranged in a stripe pattern, a mosaic pattern, a delta pattern, or the like as appropriate. Without limitation to RGB, a pixel corresponding to white, yellow, or the like may be added for color display.

Figure 17:
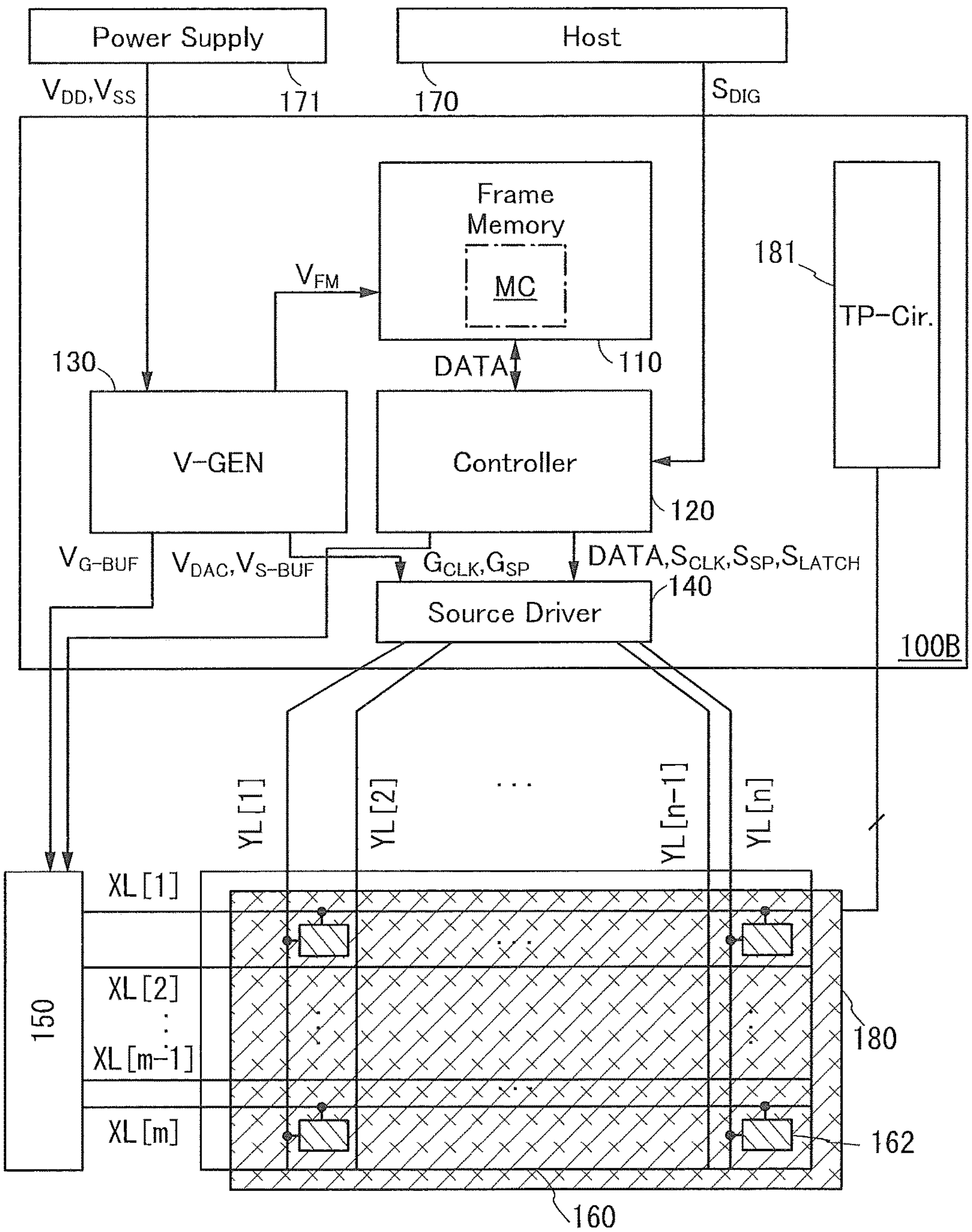
FIG. 17 illustrates an example of a block diagram.

To add a touch sensor function to the display device 160, a touch sensor 180 is added as illustrated in FIG. 17. Note that it is possible to obtain an in-cell touch panel by combining the touch sensor 180 and the display device 160. A signal obtained by the touch sensor 180 can be processed by a semiconductor device 100B that includes a touch sensor driver circuit 181 in addition to the components of the semiconductor device 100A. In the structure of FIG. 17, controlling driving of the touch sensor and driving of the display device at different timings enables the reduction in malfunction of the touch sensor due to noise.

Figure 18:
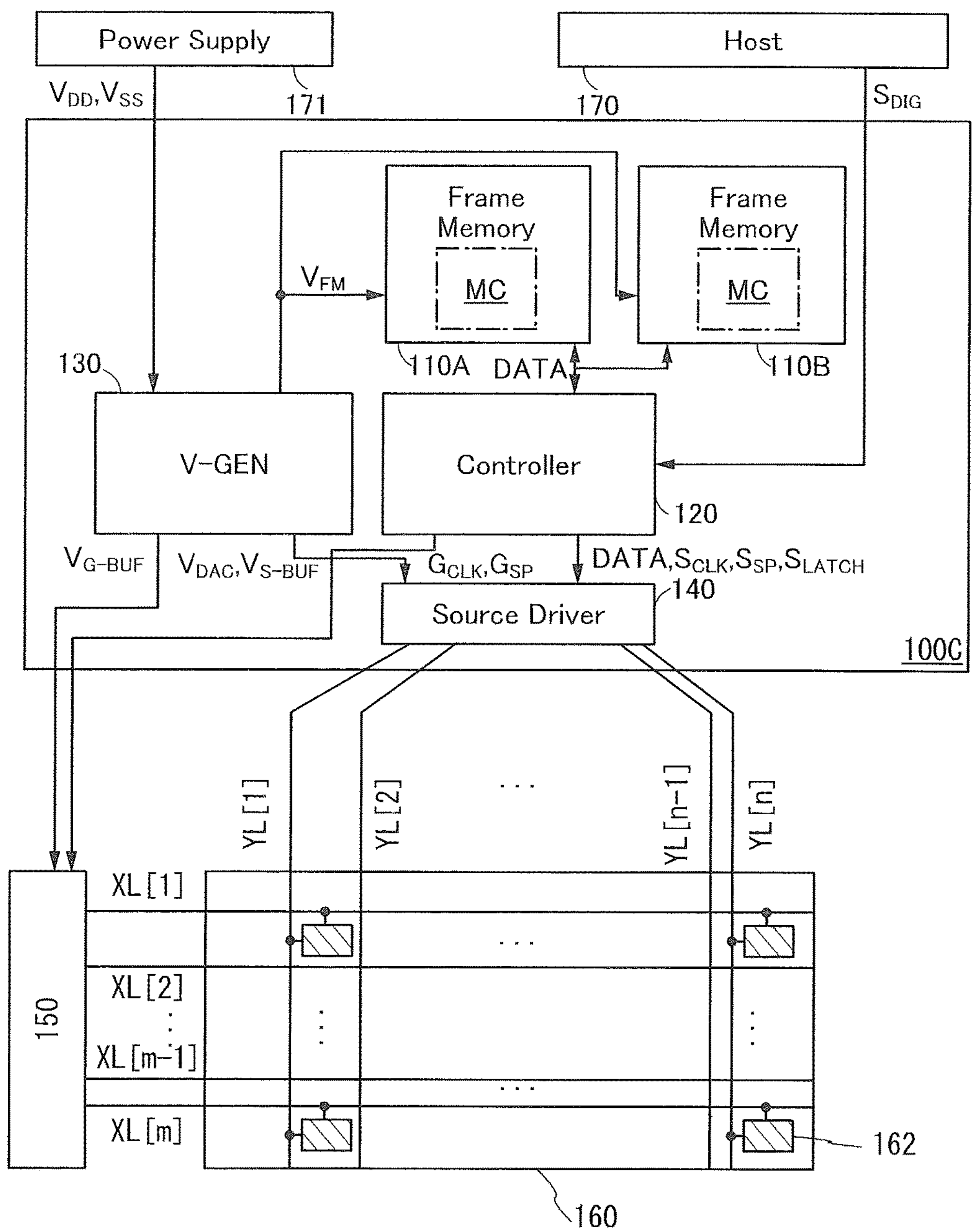
FIG. 18 illustrates an example of a block diagram.

In a block diagram of FIG. 18, the semiconductor device 100A in the block diagram of FIG. 16 is replaced with a semiconductor device 100C. The semiconductor device 100C includes a plurality of frame memories 110A and 110B. The semiconductor device 100C including the plurality of frame memories 110A and 110B can retain data for different frames. Thus, display can be performed in such a manner that data for different frames that are retained in the frame memories 110A and 110B are compared, and data to be displayed is updated when the compared data are different and is not updated when the compared data are the same. Such a display method can decrease the frequency of driving the source driver 140 and thus is effective in reducing power consumption.

Figure 19:
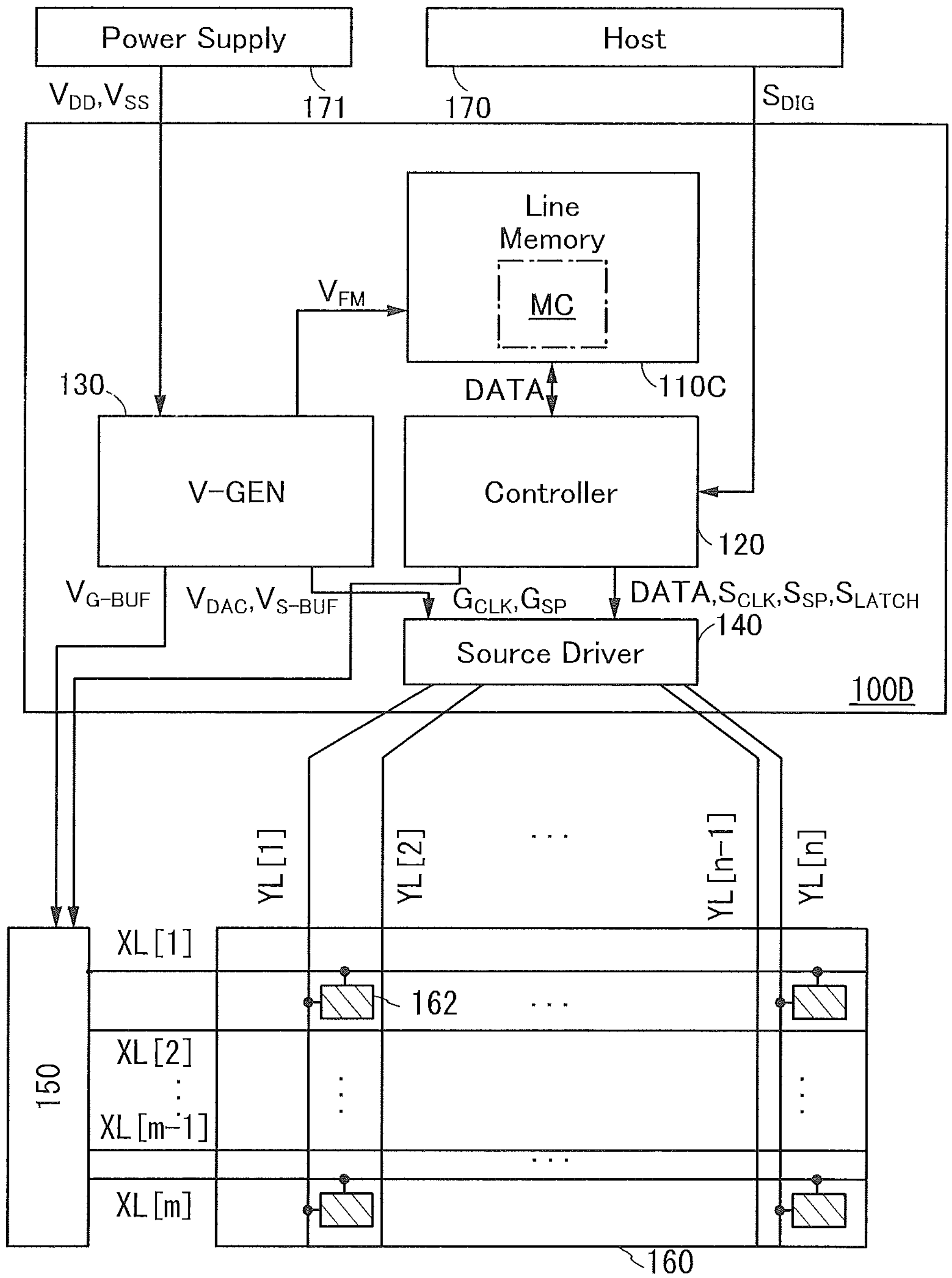
FIG. 19 illustrates an example of a block diagram.

In a block diagram of FIG. 19, the semiconductor device 100A in the block diagram of FIG. 16 is replaced with a semiconductor device 100D. The semiconductor device 100D includes a line memory 110C. The semiconductor device 100D including the line memory 110C can retain a smaller amount of data than a semiconductor device including a frame memory. Using the memory cell MC in the line memory 110C results in the semiconductor device with a reduced chip area.

Figure 20:
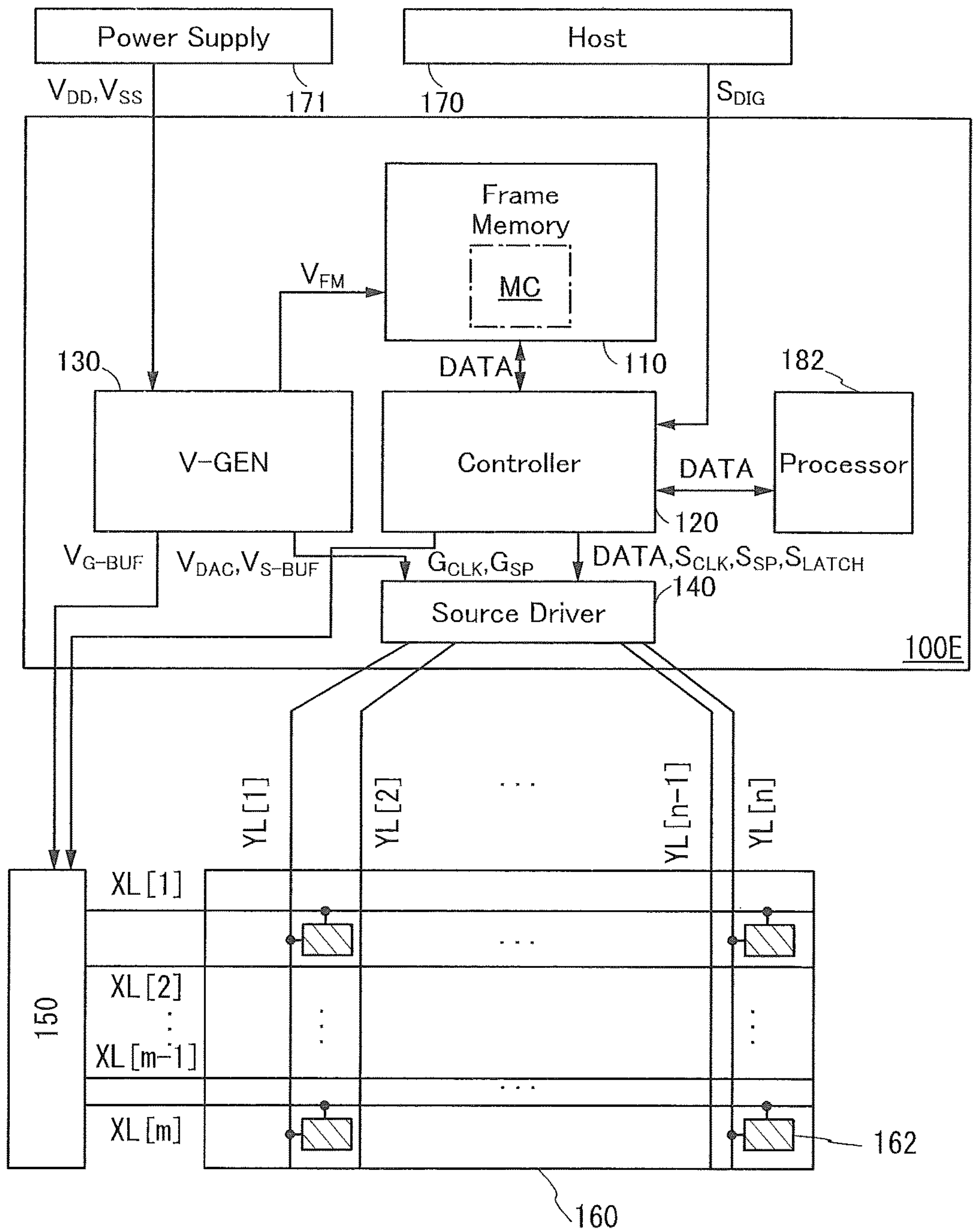
FIG. 20 illustrates an example of a block diagram.

In a block diagram of FIG. 20, the semiconductor device 100A in the block diagram of FIG. 16 is replaced with a semiconductor device 100E. The semiconductor device 100E includes a processor 182. The processor 182 has a function of performing arithmetic processing on data. As arithmetic processing, the processor 182 can execute image rotation processing, control for turning on or off a backlight, or super-resolution processing, for example. Including the processor 182 enables the semiconductor device 100E to achieve higher performance.

Figure 21A:
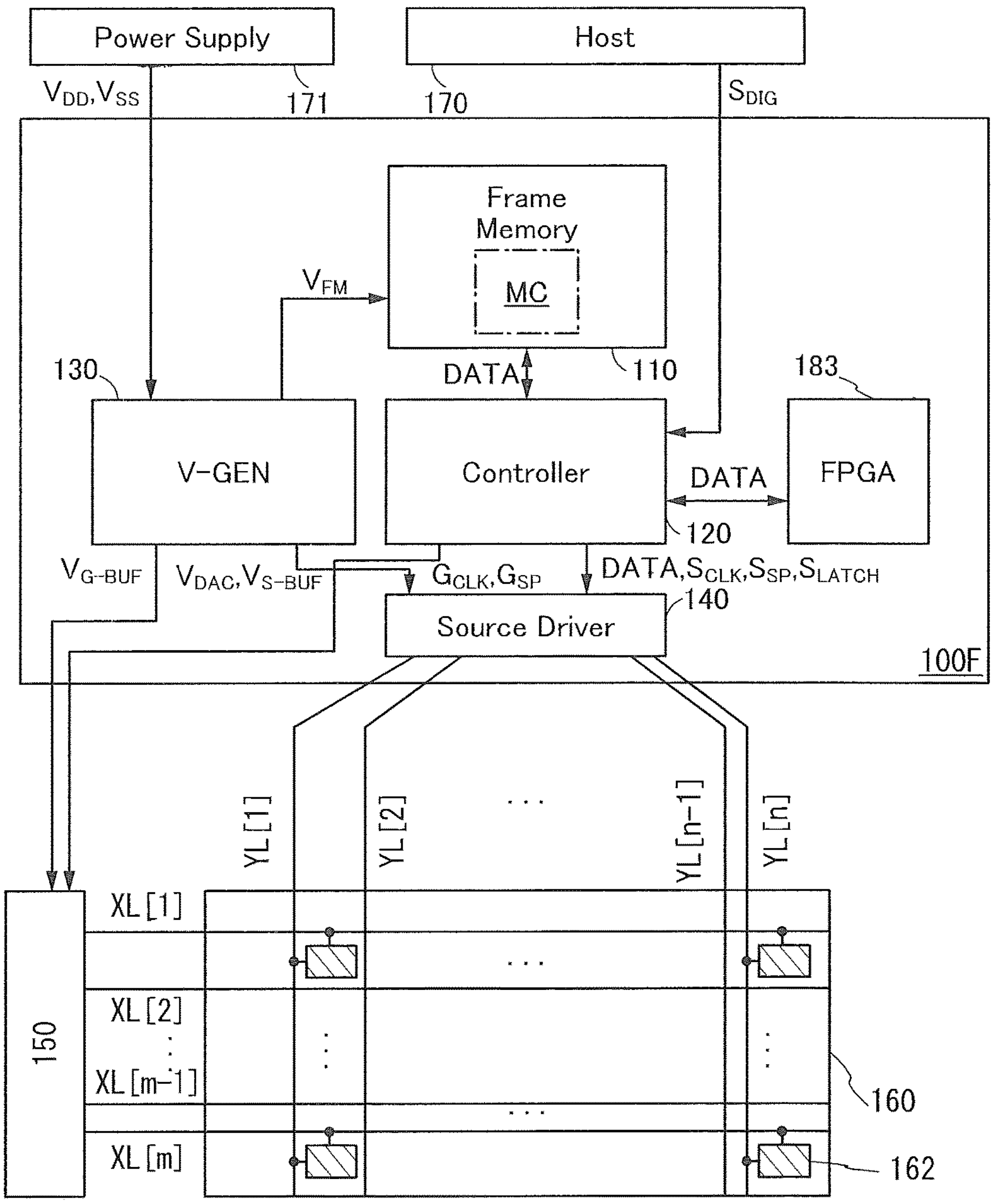
FIGS. 21A to 21C illustrate examples of block diagrams and a circuit diagram.

In a block diagram of FIG. 21A, the semiconductor device 100A in the block diagram of FIG. 16 is replaced with a semiconductor device 100F. The semiconductor device 100F includes an FPGA 183. The FPGA 183 has a function of performing arithmetic processing on data in accordance with configuration data. Like the processor 182, the FPGA 183 can execute arithmetic processing such as image rotation processing, control for turning on or off a backlight, or super-resolution processing, for example.

Figure 21B:
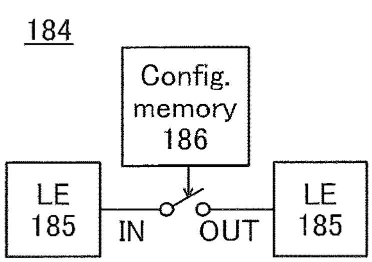
Figure 21C:
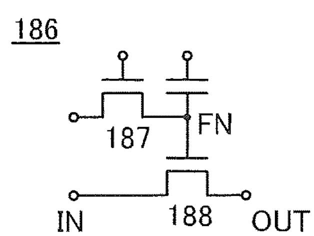

FIG. 21B is a block diagram for showing a configuration memory that retains configuration data. For example, the on/off state of a switch 184 for controlling connection between logic elements 185 is controlled by a configuration memory 186. FIG. 21C illustrates an example of a circuit configuration applicable to the configuration memory 186. The configuration memory 186 includes transistors 187 and 188 and retains charge corresponding to configuration data at the floating node FN. The function of the switch 184 is achieved by switching the on/off state of the transistor 188 in accordance with the voltage of the floating node FN. The circuit configuration in FIG. 21C can be similar to that of the memory cell MC described in Embodiment 1, in which case it is useful to use a transistor containing an oxide semiconductor as the transistor 187. Consequently, the configuration memory 186 in the FPGA 183 can be fabricated in the same steps as the memory cell MC.

Figure 22A:
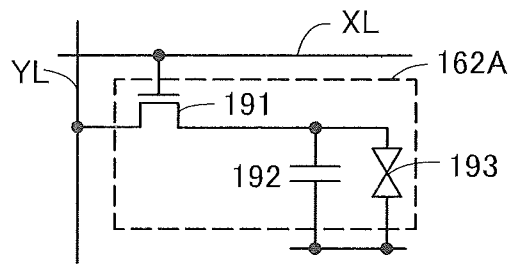
FIGS. 22A and 22B each illustrate an example of a circuit diagram.
Figure 22B:
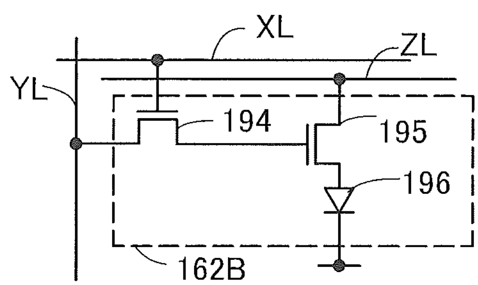

FIGS. 22A and 22B illustrate configuration examples of the pixel 162.

A pixel 162A in FIG. 22A is an example of a pixel included in a liquid crystal display device and includes a transistor 191, a capacitor 192, and a liquid crystal element 193.

The transistor 191 serves as a switching element for controlling the connection between the liquid crystal element 193 and the signal line YL. The on/off state of the transistor 191 is controlled by a scan voltage input to its gate through the scan line XL.

The capacitor 192 is an element formed by stacking conductive layers, for example.

The liquid crystal element 193 includes a common electrode, a pixel electrode, and a liquid crystal layer, for example. Alignment of the liquid crystal material of the liquid crystal layer is changed by the action of an electric field generated between the common electrode and the pixel electrode.

A pixel 162B in FIG. 22B is an example of a pixel included in an EL display device and includes a transistor 194, a transistor 195, and an EL element 196. FIG. 22B illustrates a current supply line ZL in addition to the scan line XL and the signal line YL. The current supply line ZL is a wiring for supplying current to the EL element 196.

The transistor 194 serves as a switching element for controlling the connection between a gate of the transistor 195 and the signal line YL. The on/off state of the transistor 194 is controlled by a scan voltage input to its gate through the scan line XL.

The transistor 195 has a function of controlling current flowing between the current supply line ZL and the EL element 196, in accordance with voltage applied to the gate of the transistor 195.

The EL element 196 is, for example, an element including a light-emitting layer provided between electrodes. The luminance of the EL element 196 can be controlled by the amount of current that flows through the light-emitting layer.

(Embodiment 3)

In this embodiment, an example of a cross-sectional structure of the semiconductor device in one embodiment of the present invention will be described with reference to FIG. 23 to FIG. 35.

The semiconductor device shown in any of the foregoing embodiments can be fabricated by stacking a layer including a transistor containing silicon (Si transistor), a layer including a transistor containing an oxide semiconductor (OS transistor), and a wiring layer.

<Layer Structure of Semiconductor Device>

Figure 23:
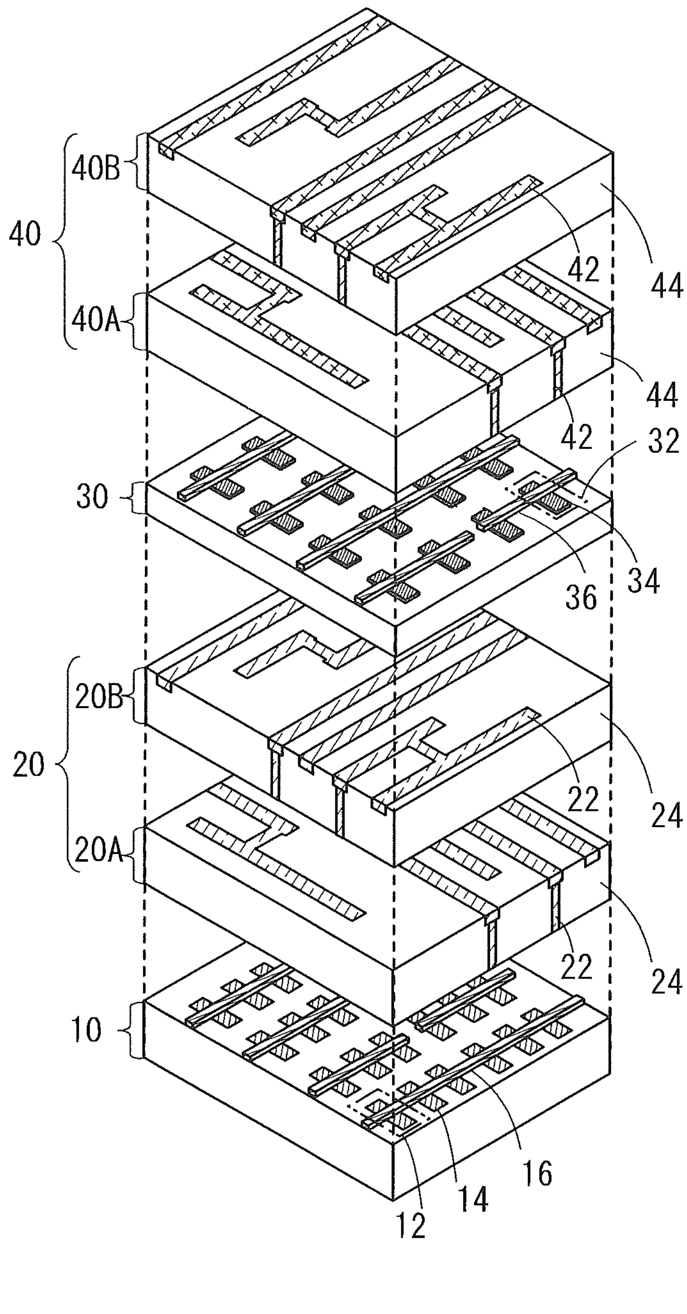
FIG. 23 illustrates an example of a schematic cross-sectional view.

FIG. 23 is a schematic diagram of a layer structure of a semiconductor device. A transistor layer 10, a wiring layer 20, a transistor layer 30, and a wiring layer 40 are provided to overlap each other in this order. The wiring layer 20 shown as an example includes a wiring layer 20A and a wiring layer 20B. The wiring layer 40 includes a wiring layer 40A and a wiring layer 40B. In the wiring layer 20 and/or the wiring layer 40, a capacitor can be formed such that an insulator is sandwiched between conductors.

The transistor layer 10 includes a plurality of transistors 12. The transistor 12 includes a semiconductor layer 14 and a gate electrode 16. Although a layer processed into an island shape is shown as the semiconductor layer 14, the semiconductor layer 14 may be a semiconductor layer obtained by isolation from a semiconductor substrate. Although a gate electrode for a top-gate transistor is shown as the gate electrode 16, the gate electrode 16 may be a gate electrode for a bottom-gate, double-gate, or dual-gate transistor, for example.

Each of the wiring layers 20A and 20B includes a wiring 22 that is embedded in an opening provided in an insulating layer 24. The wiring 22 functions as a wiring for connecting elements such as transistors.

The transistor layer 30 includes a plurality of transistors 32. The transistor 32 includes a semiconductor layer 34 and a gate electrode 36. Although a layer processed into an island shape is shown as the semiconductor layer 34, the semiconductor layer 34 may be obtained by isolation from a semiconductor substrate. Although a gate electrode for a top-gate transistor is shown as the gate electrode 36, the gate electrode 36 may be a gate electrode for a bottom-gate, double-gate, or dual-gate transistor, for example.

Each of the wiring layers 40A and 40B includes a wiring 42 that is embedded in an opening provided in an insulating layer 44. The wiring 42 functions as a wiring for connecting elements such as transistors.

The semiconductor layer 14 is formed using a semiconductor material different from that for the semiconductor layer 34. For example, given that the transistor 12 is a Si transistor and the transistor 32 is an OS transistor, the semiconductor material for the semiconductor layer 14 is silicon and that for the semiconductor layer 34 is an oxide semiconductor.

[Structure Example]

Figure 24A:
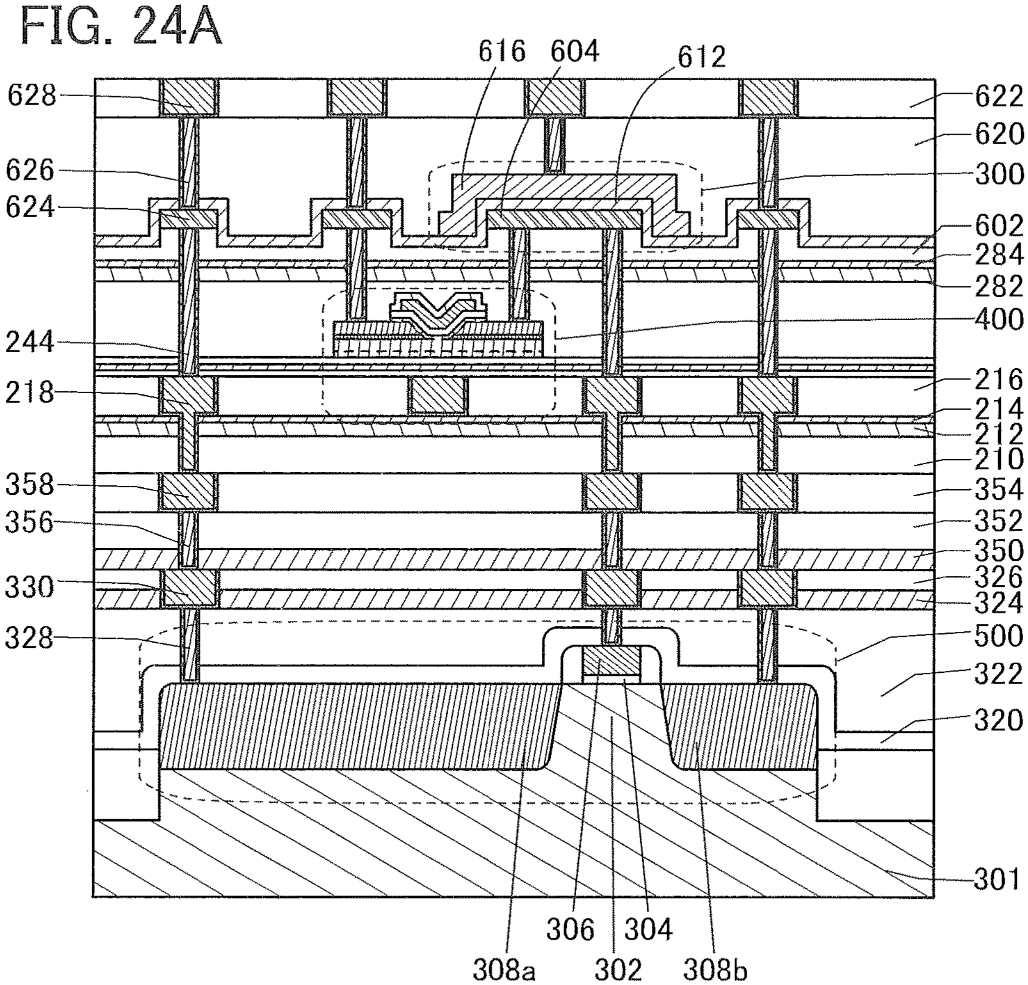
FIGS. 24A and 24B illustrate a structure example of a semiconductor device.
Figure 24B:
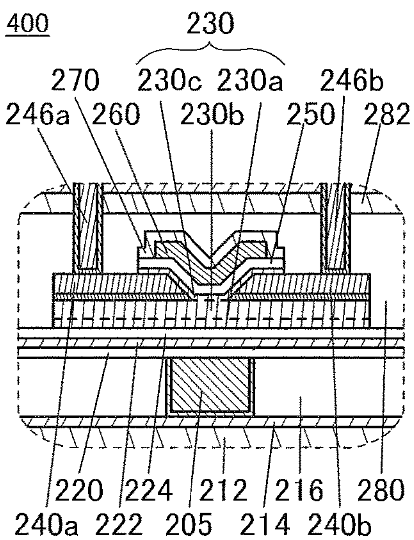

FIG. 24A illustrates an example of a cross-sectional view of a semiconductor device. FIG. 24B is an enlarged view of part of the structure in FIG. 24A.

The semiconductor device illustrated in FIG. 24A includes a capacitor 300, a transistor 400, and a transistor 500.

The capacitor 300 is provided over an insulator 602 and includes a conductor 604, an insulator 612, and a conductor 616.

The conductor 604 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. When the conductor 604 is formed concurrently with another component such as a plug or a wiring, a low-resistance metal material such as copper (Cu) or aluminum (Al) can be used.

The insulator 612 is provided to cover a side surface and a top surface of the conductor 604. The insulator 612 has a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

The conductor 616 is provided to cover the side surface and the top surface of the conductor 604 with the insulator 612 positioned therebetween.

Note that the conductor 616 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. When the conductor 616 is formed concurrently with another component such as a plug or a wiring, a low-resistance metal material such as copper (Cu) or aluminum (Al) can be used.

With the structure where the conductor 616 included in the capacitor 300 covers the side surfaces and the top surface of the conductor 604 with the insulator 612 positioned therebetween, the capacitance per projected area of the capacitor 300 can be increased. Thus, the semiconductor device can be reduced in area, highly integrated, and miniaturized.

The transistor 500 is provided over a substrate 301 and includes a conductor 306, an insulator 304, a semiconductor region 302 that is part of the substrate 301, and low-resistance regions 308*a* and 308*b* functioning as a source region and a drain region.

The transistor 500 is either a p-channel transistor or an n-channel transistor.

A channel formation region of the semiconductor region 302, a region around the channel formation region, the low-resistance regions 308*a* and 308*b* serving as a source region and a drain region, and the like contain preferably a semiconductor such as a silicon-based semiconductor, more preferably single crystal silicon. Alternatively, they may contain a material containing germanium (Ge), silicon germanium (SiGe), gallium arsenide (GaAs), gallium aluminum arsenide (GaAlAs), or the like. They may contain silicon whose effective mass is controlled by applying stress to the crystal lattice and thereby changing the lattice spacing. Alternatively, the transistor 500 may be a high-electron-mobility transistor (HEMT) using GaAs and GaAlAs, or the like.

The low-resistance regions 308*a* and 308*b* contain an element that imparts n-type conductivity (e.g., arsenic or phosphorus) or an element that imparts p-type conductivity (e.g., as boron) in addition to a semiconductor material used for the semiconductor region 302.

The conductor 306 functioning as a gate electrode can be formed using a semiconductor material such as silicon containing an element that imparts n-type conductivity (e.g., arsenic or phosphorus) or an element that imparts p-type conductivity (e.g., boron), or a conductive material such as a metal material, an alloy material, or a metal oxide material.

Note that the threshold voltage of the transistor 500 can be adjusted by setting the work function of the gate electrode with a material of the conductor 306. Specifically, it is preferable to use titanium nitride, tantalum nitride, or the like as the conductor 306. Furthermore, in order to ensure the conductivity and embeddability of the conductor, it is preferable to use a laminated layer of metal materials such as tungsten and aluminum as the conductor 306. In particular, tungsten is preferable in terms of heat resistance.

In the transistor 500 illustrated in FIG. 24A, the semiconductor region 302 (part of the substrate 301) in which a channel is formed includes a protruding portion. Furthermore, the conductor 306 is provided to cover a side surface and a top surface of the semiconductor region 302 with the insulator 304 therebetween. Note that the conductor 306 may be formed using a material for adjusting a work function. The transistor 500 with such a structure is also referred to as FIN transistor because it utilizes a protruding portion of the semiconductor substrate. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

Note that the transistor 500 illustrated in FIG. 24A is just an example; without limitation to the structure shown in FIG. 24A, an appropriate transistor can be used in accordance with a circuit configuration or a driving method. For example, a planar transistor 500A illustrated in FIG. 25A may be used.

An insulator 320, an insulator 322, an insulator 324, and an insulator 326 are sequentially stacked and cover the transistor 500.

The insulator 322 functions as a planarization film for eliminating a level difference caused by the transistor 500 or the like underlying the insulator 322. A top surface of the insulator 322 may be planarized by planarization treatment using a chemical mechanical polishing (CMP) method or the like to increase the level of planarity.

The insulator 324 functions as a barrier film that prevents hydrogen or impurities from diffusing from the substrate 301, the transistor 500, or the like into a region where the transistor 400 is formed. For example, the insulator 324 can be formed nitride such as silicon nitride.

A conductor 328, a conductor 330, and the like that are electrically connected to the capacitor 300 or the transistor 400 are embedded in the insulator 320, the insulator 322, the insulator 324, and the insulator 326. The conductor 328 and the conductor 330 each function as a plug or a wiring. Note that a plurality of conductors functioning as plugs or wirings are collectively denoted by the same reference numeral in some cases, as described later. Furthermore, in this specification and the like, a wiring and a plug electrically connected to the wiring may be a single component. That is, there are cases where part of a conductor functions as a wiring and where part of a conductor functions as a plug.

For each of the plugs and wirings (e.g., the conductor 328 and the conductor 330), a single-layer structure or a stacked-layer structure using a conductive material such as a metal material, an alloy material, or a metal oxide material can be used. It is preferable to use a high-melting-point material that has both heat resistance and conductivity, such as tungsten or molybdenum, and it is particularly preferable to use tungsten. It is particularly preferable to use a low-resistance conductive material such as aluminum or copper. The use of the above material can reduce the wiring resistance.

A wiring layer may be provided over the insulator 326 and the conductor 330. For example, an insulator 350, an insulator 352, and an insulator 354 are sequentially stacked in FIG. 24A. A conductor 356 and a conductor 358 are embedded in the insulator 350, the insulator 352, and the insulator 354. The conductor 356 and the conductor 358 each function as a plug or a wiring.

Note that for example, the insulator 350 is preferably formed using an insulator with a barrier property against hydrogen, like the insulator 324. The conductor 356 and the conductor 358 are preferably formed using a conductor with a barrier property against hydrogen. The conductor with a barrier property against hydrogen is formed in an opening in the insulator 350 with a barrier property against hydrogen. This structure can separate the transistor 500 and the transistor 400 by the barrier layer, and thus can prevent diffusion of hydrogen from the transistor 500 to the transistor 400.

As a conductor with a barrier property against hydrogen, tantalum nitride can be used, for example. Stacking tantalum nitride and tungsten, which has high conductivity, can prevent diffusion of hydrogen from the transistor 500 while the conductivity of a wiring is ensured.

The transistor 400 is provided over the insulator 354. FIG. 24B is an enlarged view of the transistor 400. Note that the transistor 400 illustrated in FIG. 24B is just an example; without limitation to the structure shown in FIG. 24B, an appropriate transistor can be used in accordance with a circuit configuration or a driving method.

The transistor 400 is a transistor in which a channel is formed in a semiconductor layer containing an oxide semiconductor. The off-state current of the transistor 400 is low; thus, using the transistor 400 in a frame memory of a semiconductor device enables stored data to be retained for a long time.

An insulator 210, an insulator 212, an insulator 214, and an insulator 216 are sequentially stacked over the insulator 354. A conductor 218, a conductor 205, and the like are embedded in the insulator 210, the insulator 212, the insulator 214, and the insulator 216. The conductor 218 functions as a plug or a wiring that is electrically connected to the capacitor 300 or the transistor 500. The conductor 205 functions as a gate electrode of the transistor 400.

A material with a barrier property against oxygen or hydrogen is preferably used for any of the insulators 210, 212, 214, and 216. In particular, in the case of using an oxide semiconductor in the transistor 400, the reliability of the transistor 400 can be increased when an insulator including an oxygen excess region is provided as an interlayer film or the like around the transistor 400. Accordingly, in order to diffuse oxygen from the interlayer film around the transistor 400 to the transistor 400 efficiently, layers with barrier properties against hydrogen and oxygen are preferably provided such that the transistor 400 and the interlayer film are sandwiched therebetween.

For example, aluminum oxide, hafnium oxide, or tantalum oxide is preferably used for the barrier layers. Stacking the barrier layers achieves the function of diffusing oxygen more reliably.

An insulator 220, an insulator 222, and an insulator 224 are sequentially stacked over the insulator 216. Part of a conductor 244 is embedded in the insulator 220, the insulator 222, and the insulator 224.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). When such an insulator containing excess oxygen is provided in contact with an oxide 230 in which a channel region of the transistor 400 is formed, oxygen vacancies in the oxide can be filled. Note that the insulators 220 and 224 are not necessarily formed of the same material.

The insulator 222 preferably has a single-layer structure or a stacked-layer structure using an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), $(Ba,Sr)TiO_3$ (BST), or the like. Aluminum oxide, bismuth oxide, germanium oxide, niobium oxide, silicon oxide, titanium oxide, tungsten oxide, yttrium oxide, or zirconium oxide, for example, may be added to the insulator. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material and may be formed of different materials.

When the insulator 222 containing a high-k material is provided between the insulator 220 and the insulator 224, electrons can be trapped in the insulator 222 under specific conditions, resulting in higher threshold voltage. In other words, the insulator 222 is negatively charged in some cases.

For example, when the insulator 220 and the insulator 224 are formed using silicon oxide and the insulator 222 is formed using a material having a lot of electron trap states (e.g., hafnium oxide, aluminum oxide, or tantalum oxide), electrons move from the oxide 230 toward the conductor 205 under the following conditions: the potential of the conductor 205 is kept higher than the potential of a source electrode and a drain electrode for 10 milliseconds or longer, typically 1 minute or longer at temperatures higher than the operating temperature or the storage temperature of the semiconductor device (e.g., at temperatures ranging from 125° C. to 450° C., typically from 150° C. to 300° C.). At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and the threshold voltage can be controlled accordingly. The transistor 400 having this structure is a normally-off transistor, which is in a non-conduction state (also referred to as off state) even when the gate voltage is 0 V.

The treatment for trapping the electrons can be performed in the manufacturing process of the transistor. For example, the treatment can be performed at any step before factory shipment, such as after the formation of a conductor connected to a source electrode or a drain electrode of the transistor, after the wafer process, after a wafer-dicing step, or after packaging.

The insulator 222 is preferably formed using a material with a barrier property against oxygen or hydrogen. The use of such a material can prevent release of oxygen from the oxide 230 and entry of impurities such as hydrogen from the outside.

An oxide 230*a*, an oxide 230*b*, and an oxide 230*c* are formed using a metal oxide such as an In-M-Zn oxide (M is Al, Ga, Y, or Sn). An In—Ga oxide or In—Zn oxide may be used as the oxide 230*a*, the oxide 230*b*, and the oxide 230*c*. Hereinafter the oxide 230*a*, the oxide 230*b*, and the oxide 230*c* may be collectively referred to as the oxide 230.

The oxide 230 according to the present invention is described below.

An oxide used as the oxide 230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide contains indium, an element M, and zinc is considered. The element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide according to the present invention are described with reference to FIGS. 26A to 26C. Note that the proportion of oxygen atoms is not shown in FIGS. 26A to 26C. The terms of the atomic ratio of indium, the element M, and zinc contained in the oxide are denoted by [In], [M], and [Zn], respectively.

Figure 26A:
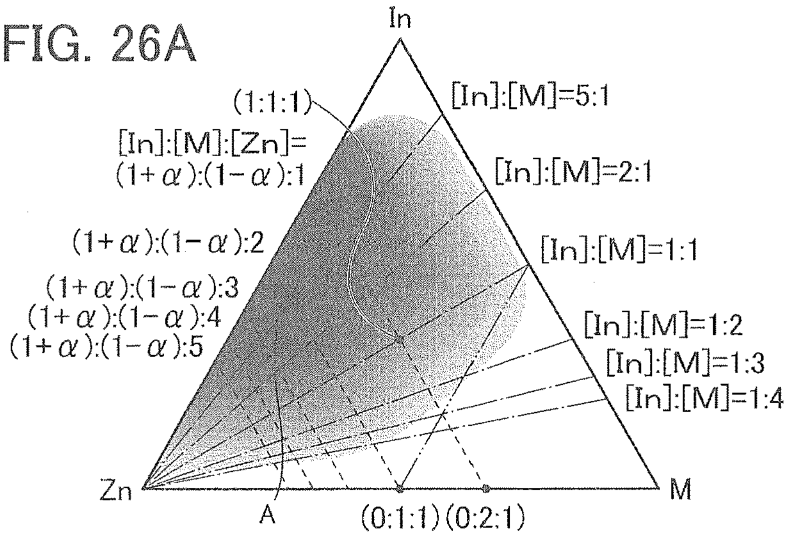
FIGS. 26A to 26C each illustrate an atomic ratio range of an oxide semiconductor.
Figure 26B:
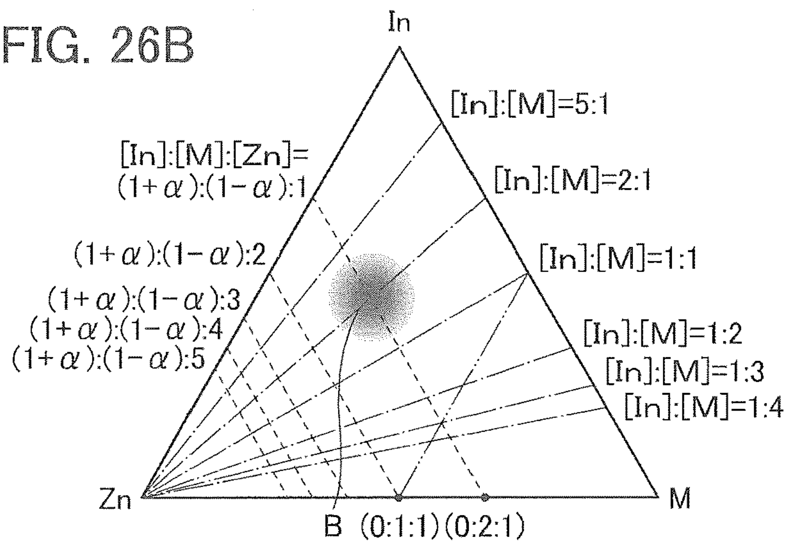
Figure 26C:
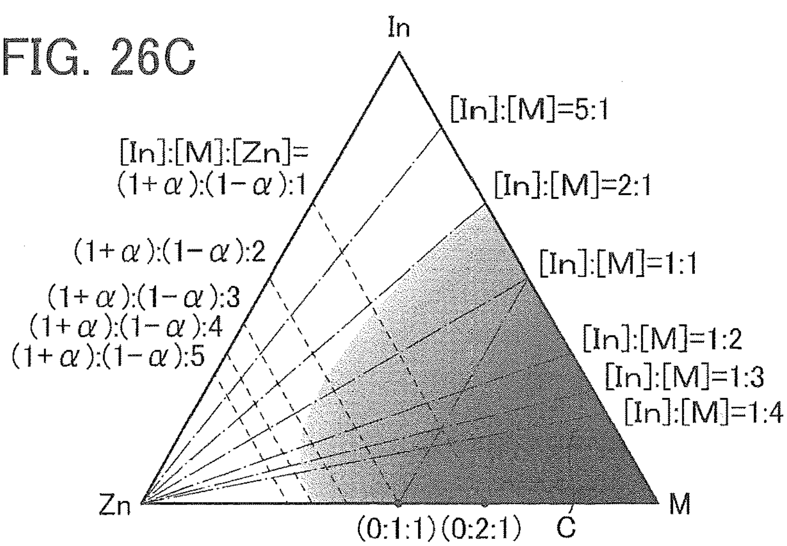

In FIGS. 26A to 26C, broken lines indicate a line where the atomic ratio [In]:[M]:[Zn] is $(1+\alpha):(1-\alpha):1$ (where $-1\leq\alpha\leq1$), a line where the atomic ratio [In]:[M]:[Zn] is $(1+\alpha):(1-\alpha):2$, a line where the atomic ratio [In]:[M]:[Zn] is $(1+\alpha):(1+\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta\geq0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

A dashed double-dotted line indicates a line where the atomic ratio [In]:[M]:[Zn] is $(1+\gamma):2:(1-\gamma)$, where $-1\leq\gamma\leq1$. An oxide with the atomic ratio [In]:[M]:[Zn] of 0:2:1 or around 0:2:1 in FIGS. 26A to 26C tends to have a spinel crystal structure.

FIGS. 26A and 26B illustrate examples of the preferred ranges of the atomic ratio of indium, the element M, and zinc contained in an oxide of one embodiment of the present invention.

Figure 27:
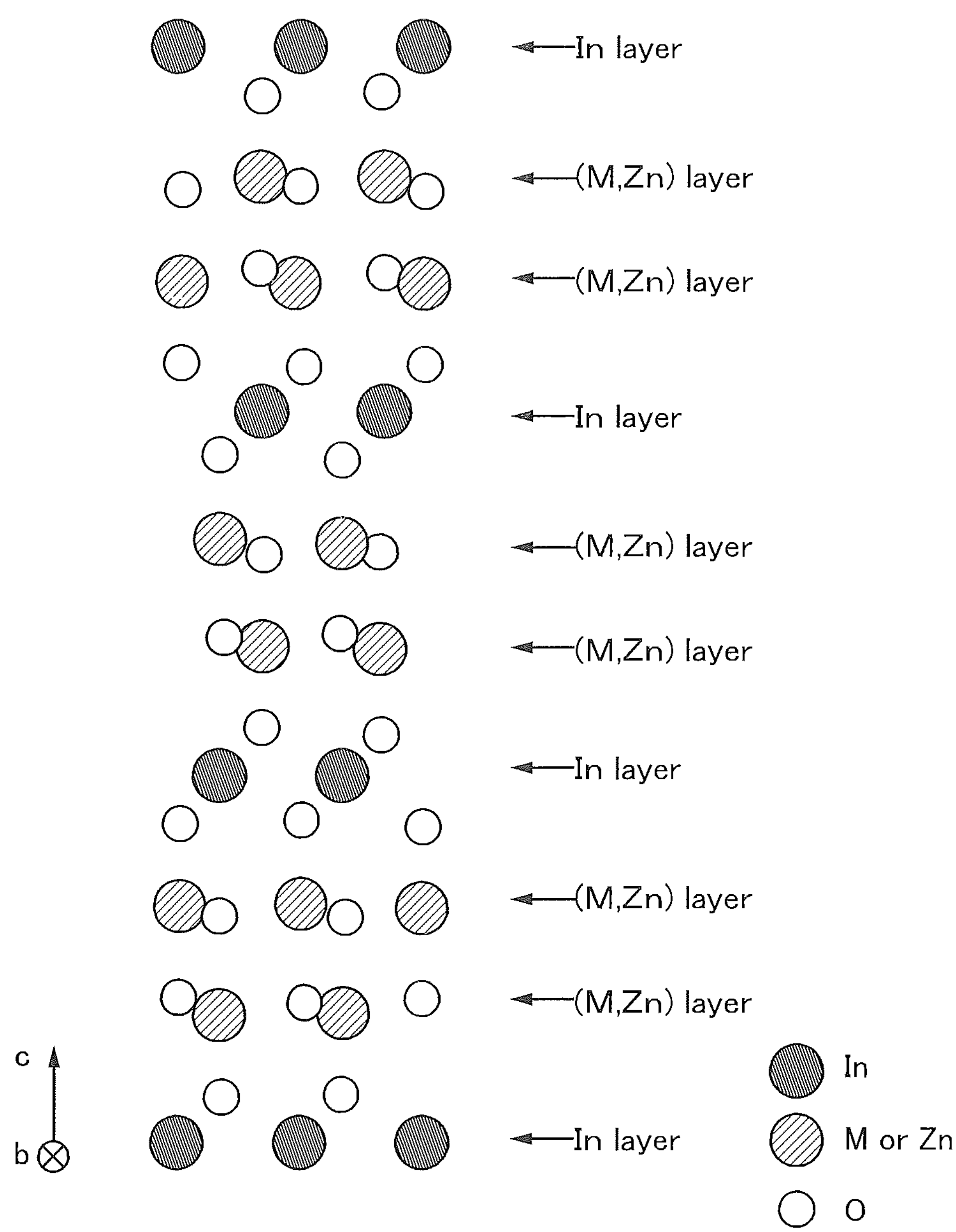
FIG. 27 illustrates an $InMZnO_4$ crystal.

FIG. 27 illustrates an example of the crystal structure of $InMZnO_4$ with an atomic ratio [In]:[M]:[Zn] of 1:1:1. The crystal structure illustrated in FIG. 27 is $InMZnO_4$ observed from a direction parallel to the b-axis. Note that a metal element in a layer that contains the element M, Zn, and oxygen (hereinafter this layer is referred to as "(M,Zn) layer") in FIG. 27 represents the element M or zinc. In that case, the proportion of the element M is the same as the proportion of zinc. The element M and zinc can be replaced with each other, and their arrangement is random.

Note that $InMZnO_4$ has a layered crystal structure (also referred to as layered structure) and includes two (M,Zn) layers that contain the element M, zinc, and oxygen with respect to one layer that contains indium and oxygen (hereinafter referred to as In layer), as illustrated in FIG. 27.

Indium and the element M can be replaced with each other. Accordingly, when the element M in the (M,Zn) layer is replaced by indium, the layer can also be referred to as (In,M,Zn) layer. In that case, a layered structure that includes two (In,M,Zn) layers with respect to one In layer is obtained.

An oxide with an atomic ratio [In]:[M]:[Zn] of 1:1:2 has a layered structure that includes three (M,Zn) layers with respect to one In layer. In other words, if [Zn] is larger than [In] and [M], the proportion of the (M,Zn) layer to the In layer becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of [In]:[M]:[Zn]=1:1:1.5, the oxide may have a mix of a layered structure including one In layer for every two (M,Zn) layers and a layered structure including one In layer for every three (M,Zn) layers.

For example, when the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] close to 0:2:1, two phases of a spinel crystal structure and a layered crystal structure are likely to exist. In addition, with an atomic ratio [In]:[M]:[Zn] close to 1:0:0, two phases of a bixbyite crystal structure and a layered crystal structure are likely to exist. In the case where a plurality of phases exist in the oxide, a grain boundary might be formed between different crystal structures.

In addition, the oxide with a higher content of indium can have high carrier mobility (electron mobility). This is because in an oxide containing indium, the element M, and zinc, the s orbital of heavy metal mainly contributes to carrier transfer, and a higher indium content in the oxide enlarges a region where the s orbitals of indium atoms overlap; therefore, an oxide with a high indium content has higher carrier mobility than an oxide with a low indium content.

In contrast, when the indium content and the zinc content in an oxide become lower, the carrier mobility becomes lower. Thus, with an atomic ratio [In]:[M]:[Zn] of 0:1:0 or around 0:1:0 (e.g., a region C in FIG. 26C), insulation performance becomes better.

Accordingly, an oxide in one embodiment of the present invention preferably has an atomic ratio represented by a region A in FIG. 26A. With this atomic ratio, a layered structure with high carrier mobility and a few grain boundaries is easily obtained.

A region B in FIG. 26B represents an atomic ratio [In]:[M]:[Zn] of 4:2:3 to 4:2:4.1 and the vicinity thereof. The vicinity includes an atomic ratio [In]:[M]:[Zn] of 5:3:4. An oxide with an atomic ratio represented by the region B is an excellent oxide that has particularly high crystallinity and high carrier mobility.

Note that a condition where an oxide has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described. When the oxide is used for a transistor, carrier scattering or the like at a grain boundary can be reduced; thus, the transistor can have high field-effect mobility. Moreover, the transistor can have high reliability.

An oxide with a low carrier density is preferably used for a transistor. For example, an oxide whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide has few carrier generation sources and thus can have a low carrier density. A highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide with a high density of trap states has unstable electrical characteristics in some cases.

In view of the above, to obtain stable electrical characteristics of a transistor, it is effective to reduce the concentration of impurities in the oxide. To reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

Here, the influence of impurities in the oxide is described.

When silicon or carbon, which is a Group 14 element, is contained in the oxide, defect states are formed in the oxide. Thus, the concentration of silicon or carbon in the oxide and around an interface with the oxide (the concentration obtained by secondary ion mass spectrometry (SIMS)) is set lower than or equal to $2\times10^{18}$ atoms/cm$^3$, preferably lower than or equal to $2\times10^{17}$ atoms/cm$^3$.

When the oxide contains alkali metal or alkaline earth metal, defect states are formed and carriers are generated in some cases. Thus, a transistor using an oxide that contains alkali metal or alkaline earth metal is likely to have normally-on characteristics. Accordingly, it is preferable to reduce the concentration of alkali metal or alkaline earth metal in the oxide. Specifically, the concentration of alkali metal or alkaline earth metal in the oxide measured by SIMS is set lower than or equal to $1\times10^{18}$ atoms/cm$^3$, preferably lower than or equal to $2\times10^{16}$ atoms/cm$^3$.

When the oxide contains nitrogen, the oxide easily becomes n-type by generation of electrons serving as carriers and an increase of carrier density. Thus, a transistor in which an oxide containing nitrogen is used as a semiconductor is likely to have normally-on characteristics. For this reason, nitrogen in the oxide is preferably reduced as much as possible. For example, the nitrogen concentration in the oxide measured by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide that contains hydrogen is likely to have normally-on characteristics. Accordingly, it is preferred that hydrogen in the oxide be reduced as much as possible. Specifically, the hydrogen concentration in the oxide measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide with sufficiently reduced impurity concentration is used for a channel region in a transistor, the transistor can have stable electrical characteristics.

Figure 28A:
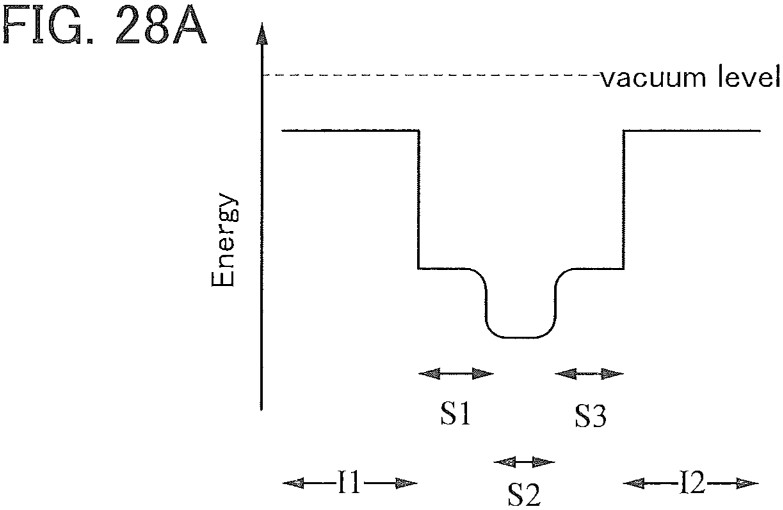
FIGS. 28A to 28C are each a band diagram of a layered structure including an oxide semiconductor.
Figure 28B:
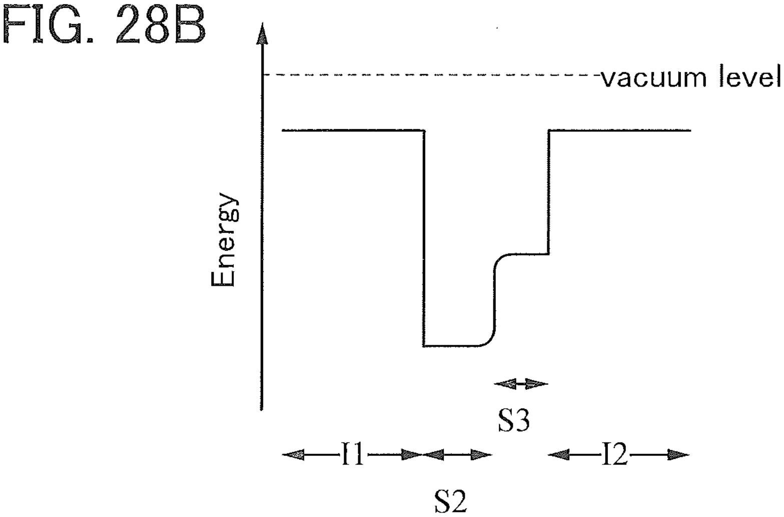
Figure 28C:
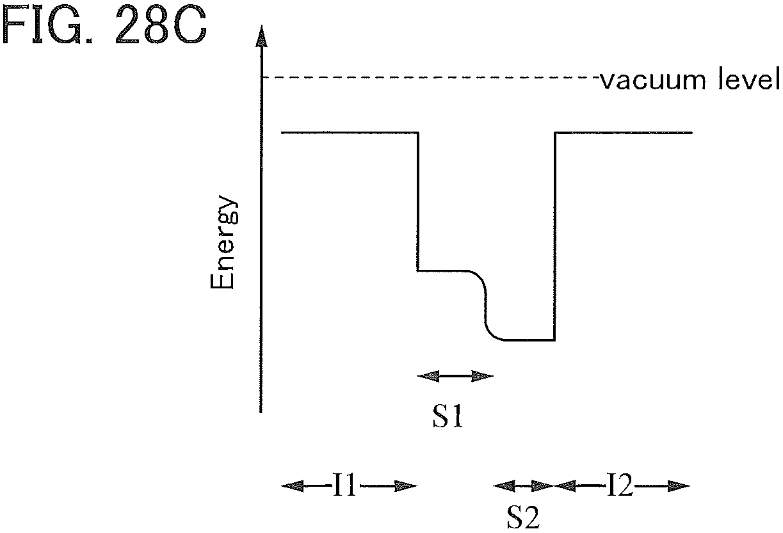

Next, the case where the oxide has a two-layer structure or a three-layer structure will be described. With reference to FIGS. 28A to 28C, the description is made on a band diagram of insulators that are in contact with a layered structure of an oxide S1, an oxide S2, and an oxide S3; a band diagram of insulators that are in contact with a layered structure of the oxide S1 and the oxide S2; and a band diagram of insulators that are in contact with a layered structure of the oxide S2 and the oxide S3.

FIG. 28A is an example of a band diagram of a layered structure including an insulator I1, the oxide S1, the oxide S2, the oxide S3, and an insulator I2 in the thickness direction. FIG. 28B is an example of a band diagram of a layered structure including the insulator I1, the oxide S2, the oxide S3, and the insulator I2 in the thickness direction. FIG. 28C is an example of a band diagram of a layered structure including the insulator I1, the oxide S1, the oxide S2, and the insulator I2 in the thickness direction. Note that for easy understanding, the band diagrams show the conduction band minimum (Ec) of each of the insulator I1, the oxide S1, the oxide S2, the oxide S3, and the insulator I2.

The conduction band minimum of each of the oxides S1 and S3 is closer to the vacuum level than that of the oxide S2. Typically, a difference in the conduction band minimum between the oxide S2 and each of the oxides S1 and S3 is preferably greater than or equal to 0.15 eV or greater than or equal to 0.5 eV, and less than or equal to 2 eV or less than or equal to 1 eV. That is, the difference in the electron affinity between the oxide S2 and each of the oxides S1 and S3 is preferably greater than or equal to 0.15 eV or greater than or equal to 0.5 eV, and less than or equal to 2 eV or less than or equal to 1 eV.

As illustrated in FIGS. 28A to 28C, the conduction band minimum of each of the oxides S1 to S3 is gradually varied. In other words, the conduction band minimum is continuously varied or continuous junction is formed. To obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, when the oxide S2 is an In—Ga—Zn oxide, it is preferable to use an In—Ga—Zn oxide, a Ga—Zn oxide, gallium oxide, or the like as the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and a high on-state current can be obtained.

When an electron is trapped in a trap state, the trapped electron behaves like fixed charge; thus, the threshold voltage of a transistor is shifted in the positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. Accordingly, the oxide S2, the interface between the oxides S1 and S2, and the interface between the oxides S2 and S3 mainly function as a channel region. For example, an oxide with high insulation performance and the atomic ratio represented by the region C in FIG. 26C can be used as the oxides Si and S3. Note that the region C in FIG. 26C represents the atomic ratio [In]:[M]:[Zn] of 0:1:0 or around 0:1:0.

When an oxide with the atomic ratio represented by the region A is used as the oxide S2, each of the oxides S1 and S3 is preferably an oxide with [M]/[In] of 1 or greater, preferably 2 or greater. Moreover, the oxide S3 is preferably an oxide having [M]/([Zn]+[In]) of 1 or greater to obtain sufficiently high insulation performance.

One of a conductor 240*a* and a conductor 240*b* functions as a source electrode, and the other functions as a drain electrode.

The conductor 240*a* and the conductor 240*b* are formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. For example, the conductor 240*a* and the conductor 240*b* can have any of the following structures: a single-layer structure of an aluminum film containing silicon, a two-layer structure in which an aluminum film is stacked over a tantalum film or a tantalum nitride film, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

An insulator 250 can have a single-layer structure or a stacked-layer structure using an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), (Ba, Sr)$TiO_3$ (BST), or the like. Aluminum oxide, bismuth oxide, germanium oxide, niobium oxide, silicon oxide, titanium oxide, tungsten oxide, yttrium oxide, or zirconium oxide, for example, may be added to the insulator. The insulator may be subjected to nitriding treatment. A layer of silicon oxide, silicon oxynitride, or silicon nitride may be stacked over the insulator.

Like the insulator 224, the insulator 250 is preferably an oxide insulator that contains oxygen in excess of that in the stoichiometric composition.

Note that the insulator 250 may have a stacked-layer structure similar to that of the insulator 220, the insulator 222, and the insulator 224. When the insulator 250 contains an insulator in which a necessary amount of electrons is trapped by electron trap states, the threshold voltage of the transistor 400 can be shifted in the positive direction. The transistor 400 having this structure is a normally-off transistor, which is in a non-conduction state (off state) even when the gate voltage is 0 V.

A conductor 260 functioning as a gate electrode can be formed using a metal selected from aluminum, chromium, copper, tantalum, titanium, molybdenum, and tungsten, an alloy containing any of these metals as its component, or an alloy containing any of these metals in combination, for example. Furthermore, one or both of manganese and zirconium may be used. A semiconductor typified by polycrystalline silicon doped with an impurity element such as phosphorus, or a silicide such as nickel silicide may be used. For example, the conductor 260 can have any of the following structures: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order. Alternatively, an alloy film or a nitride film that contains aluminum and one or more elements selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked-layer structure using the above light-transmitting conductive material and the above metal.

An insulator 280 is preferably formed using an oxide material from which oxygen is partly released due to heating.

As the oxide material from which oxygen is released due to heating, an oxide containing oxygen in excess of that in the stoichiometric composition is preferably used. Part of oxygen is released by heating from an oxide film containing oxygen more than that in the stoichiometric composition. The oxide film containing oxygen in excess of that in the stoichiometric composition is an oxide film in which the amount of released oxygen converted into oxygen atoms is greater than or equal to $1.0\times10^{18}$ atoms/$cm^3$, preferably greater than or equal to $3.0\times10^{20}$ atoms/$cm^3$ in thermal desorption spectroscopy (TDS) analysis. Note that the temperature of the film surface in the TDS analysis preferably ranges from 100° C. to 700° C. or from 100° C. to 500° C.

As such a material, a material containing silicon oxide or silicon oxynitride is preferably used, for example. Alternatively, a metal oxide can be used. Note that in this specification, silicon oxynitride refers to a material that has a higher oxygen content than a nitrogen content, and silicon nitride oxide refers to a material that has a higher nitrogen content than an oxygen content.

The insulator 280 covering the transistor 400 may function as a planarization film that covers roughness thereunder.

An insulator 270 may be provided to cover the conductor 260. When the insulator 280 is formed using an oxide material from which oxygen is released, the insulator 270 is formed using a material with a barrier property against oxygen to prevent the conductor 260 from being oxidized by the released oxygen. With this structure, oxidation of the conductor 260 can be prevented, and oxygen released from the insulator 280 can be efficiently supplied to the oxide 230.

An insulator 282 and an insulator 284 are sequentially stacked over the insulator 280. The conductor 244, a conductor 246*a*, a conductor 246*b*, and the like are embedded in the insulator 280, the insulator 282, and the insulator 284. The conductor 244 functions as a plug or a wiring that is electrically connected to the capacitor 300 or the transistor 500. Each of the conductors 246*a* and 246*b* functions as a plug or a wiring that is electrically connected to the capacitor 300 or the transistor 400.

A material with a barrier property against oxygen or hydrogen is preferably used for one or both of the insulator 282 and the insulator 284. Accordingly, oxygen released from the interlayer film around the transistor 400 can be efficiently diffused into the transistor 400.

The capacitor 300 is provided above the insulator 284.

The conductor 604 and a conductor 624 are provided over the insulator 602. The conductor 624 functions as a plug or a wiring that is electrically connected to the transistor 400 or the transistor 500.

The insulator 612 is provided over the conductor 604, and the conductor 616 is provided over the insulator 612. The conductor 616 covers a side surface of the conductor 604 with the insulator 612 placed therebetween. That is, a capacitance is formed also on the side surface of the conductor 604, so that the capacitance per projected area of the capacitor can be increased. Thus, the semiconductor device can be reduced in area, highly integrated, and miniaturized.

Note that the insulator 602 is provided at least in a region overlapped by the conductor 604. For example, as in a capacitor 300A illustrated in FIG. 25B, the insulator 602 may be provided only in regions overlapped by the conductor 604 or the conductor 624 so that the insulator 602 is in contact with the insulator 612.

An insulator 620 and an insulator 622 are sequentially stacked over the conductor 616. A conductor 626 and a conductor 628 are embedded in the insulator 620, the insulator 622, and the insulator 602. Each of the conductors 626 and the conductor 628 functions as a plug or a wiring that is electrically connected to the transistor 400 or the transistor 500.

The insulator 620 covering the capacitor 300 may function as a planarization film that covers roughness thereunder.

The above is the description of the structure example.

[Example of Manufacturing Method]

An example of a method for manufacturing the semiconductor device shown in the above structure example will be described below with reference to FIG. 29A to FIG. 35.

First, the substrate 301 is prepared. A semiconductor substrate is used as the substrate 301. For example, a single crystal silicon substrate (including a p-type semiconductor substrate or an n-type semiconductor substrate) or a compound semiconductor substrate containing silicon carbide or gallium nitride can be used. An SOI substrate may alternatively be used as the substrate 301. The case where a single crystal silicon substrate is used as the substrate 301 is described below.

Next, an element isolation layer is formed in the substrate 301. The element isolation layer can be formed by a local oxidation of silicon (LOCOS) method, a shallow trench isolation (STI) method, or the like.

When a p-channel transistor and an n-channel transistor are formed on one substrate, an n-well or a p-well may be formed in part of the substrate 301. For example, a p-well may be formed by adding an impurity element that imparts p-type conductivity (e.g., boron) to an n-type substrate 301, and an n-channel transistor and a p-channel transistor may be formed on the same substrate.

Then, an insulator to be the insulator 304 is formed on the substrate 301. For example, after surface nitriding treatment, oxidizing treatment may be performed to oxidize the interface between silicon and silicon nitride, whereby a silicon oxynitride film may be formed. For example, a silicon oxynitride film is obtained by performing oxygen radical oxidation after a thermal silicon nitride film is formed on the surface of the substrate 301 at 700° C. in an $NH_3$ atmosphere.

The insulator may be formed by a sputtering method, a chemical vapor deposition (CVD) method (including a thermal CVD method, a metal organic CVD (MOCVD) method, and a plasma-enhanced CVD (PECVD) method), a molecular beam epitaxy (MBE) method, an atomic layer deposition (ALD) method, a pulsed laser deposition (PLD) method, or the like.

Then, a conductive film to be the conductor 306 is formed. It is preferred that the conductive film be formed using a metal selected from tantalum, tungsten, titanium, molybdenum, chromium, niobium, and the like, or an alloy material or a compound material containing any of the metals as its main component. Alternatively, polycrystalline silicon to which an impurity such as phosphorus is added can be used. Further alternatively, a stacked-layer structure of a film of a metal nitride and a film of any of the above metals may be used. As a metal nitride, tungsten nitride, molybdenum nitride, or titanium nitride can be used. When the metal nitride film is provided, adhesiveness of the metal film can be increased; thus, separation can be prevented. Note that the threshold voltage of the transistor 500 can be adjusted by determining a work function of the conductor 306, and therefore, a material of the conductive film is selected as appropriate in accordance with the characteristics that the transistor 500 needs to have.

The conductive film can be formed by a sputtering method, an evaporation method, a CVD method (including a thermal CVD method, an MOCVD method, and a PECVD method), or the like. A thermal CVD method, an MOCVD method, or an ALD method is preferably used to reduce plasma damage.

Next, a resist mask is formed over the conductive film by a photolithography process or the like, and an unnecessary portion of the conductive film is removed. After that, the resist mask is removed, whereby the conductor 306 is formed.

Here, a method for processing a film is described. To process a film finely, a variety of fine processing techniques can be used. For example, it is possible to use a method in which a resist mask formed by a photolithography process or the like is subjected to slimming treatment. Alternatively, it is possible that a dummy pattern is formed by a photolithography process or the like, a sidewall is formed on the dummy pattern, the dummy pattern is then removed, and a film is etched using the remaining sidewall as a resist mask. In order to achieve a high aspect ratio, anisotropic dry etching is preferably used for film etching. Alternatively, a hard mask formed of an inorganic film or a metal film may be used.

As light used to form the resist mask, it is possible to use light with the i-line (wavelength: 365 nm), the g-line (wavelength: 436 nm), or the h-line (wavelength: 405 nm) or light in which the i-line, the g-line, and the h-line are mixed. Alternatively, ultraviolet light, KrF laser light, ArF laser light, or the like can be used. Light exposure may be performed by liquid immersion exposure technique. As the light for the exposure, extreme ultraviolet (EUV) light or X-rays may be used. Moreover, an electron beam can be used instead of the light for the exposure. It is preferable to use EUV light, X-rays, or an electron beam because extremely minute processing can be performed. Note that a photomask is not needed in the case of performing exposure by scanning of a beam such as an electron beam.

An organic resin film having a function of improving the adhesion between a film to be processed and a resist film may be formed before the resist film serving as a resist mask is formed. The organic resin film can be formed by a spin coating method or the like to planarize a surface by covering a step under the film, and thus can reduce variation in thickness of the resist mask over the organic resin film. For fine processing in particular, a material serving as a film preventing reflection of light for the exposure is preferably used for the organic resin film. An example of the organic resin film having such a function includes a bottom anti-reflective coating (BARC) film. The organic resin film can be removed at the same time as the removal of the resist mask or after the removal of the resist mask.

After the conductor 306 is formed, a sidewall covering a side surface of the conductor 306 may be formed. The sidewall can be formed in such a manner that an insulator thicker than the conductor 306 is formed and subjected to anisotropic etching so that the insulator remains only on the side surface of the conductor 306.

The insulator to be the insulator 304 is etched concurrently with the formation of the sidewall, whereby the insulator 304 is formed under the conductor 306 and the sidewall. Alternatively, the insulator 304 may be formed by etching the insulator with the conductor 306 or the resist mask for processing the conductor 306 used as an etching mask after the conductor 306 is formed. In this case, the insulator 304 is formed under the conductor 306. Further alternatively, the insulator can be used as the insulator 304 without being processed by etching.

Then, an element that imparts n-type conductivity (e.g., phosphorus) or an element that imparts p-type conductivity (e.g., boron) is added to a region of the substrate 301 where the conductor 306 (and the sidewall) is not provided.

Subsequently, the insulator 320 is formed, and then heat treatment is performed to activate the aforementioned element that imparts conductivity.

The insulator 320 is formed with a single-layer structure or a stacked-layer structure using silicon oxide, silicon oxynitride, silicon nitride oxide, silicon nitride, aluminum oxide, aluminum oxynitride, aluminum nitride oxide, or aluminum nitride, for example. The insulator 320 is preferably formed using silicon nitride containing oxygen and hydrogen (SiNOH) because the amount of hydrogen released by heating can be increased. The insulator 320 can also be formed using silicon oxide with high step coverage that is formed by reacting tetraethyl orthosilicate (TEOS), silane, or the like with oxygen, nitrous oxide, or the like.

The insulator 320 can be formed by a sputtering method, a CVD method (including a thermal CVD method, an MOCVD method, and a PECVD method), an MBE method, an ALD method, or a PLD method, for example. In particular, the insulator is formed preferably by a CVD method, more preferably a PECVD method because coverage can be further improved. A thermal CVD method, an MOCVD method, or an ALD method is preferably used to reduce plasma damage.

The heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the transistor 500 is completed.

Figure 29A:
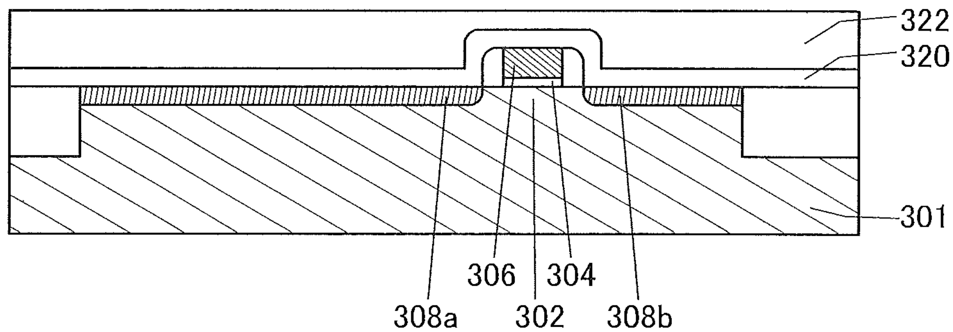
FIGS. 29A to 29D illustrate an example of a method for manufacturing a semiconductor device.

Subsequently, the insulator 322 is formed over the insulator 320. The insulator 322 can be formed using a material and a method similar to those used for forming the insulator 320. Moreover, the top surface of the insulator 322 is planarized by a CMP method or the like (FIG. 29A).

Figure 29B:
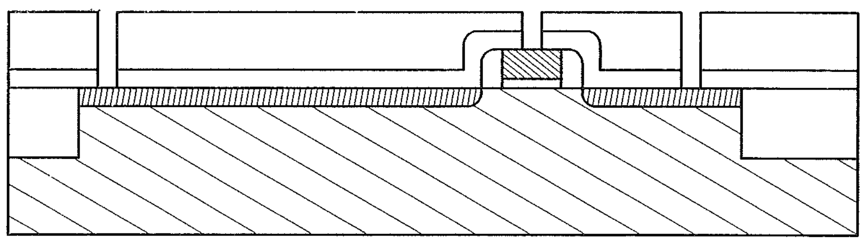
Figure 29C:
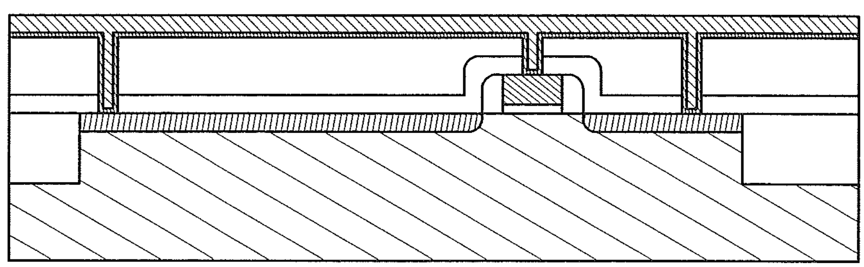

Then, openings that reach the low-resistance region 308*a*, the low-resistance region 308*b*, the conductor 306, and the like are formed in the insulator 320 and the insulator 322 (FIG. 29B). After that, a conductive film is formed to fill the openings (see FIG. 29C). The conductive film can be formed by a sputtering method, a CVD method (including a thermal CVD method, an MOCVD method, and a PECVD method), an MBE method, an ALD method, or a PLD method, for example.

Figure 29D:
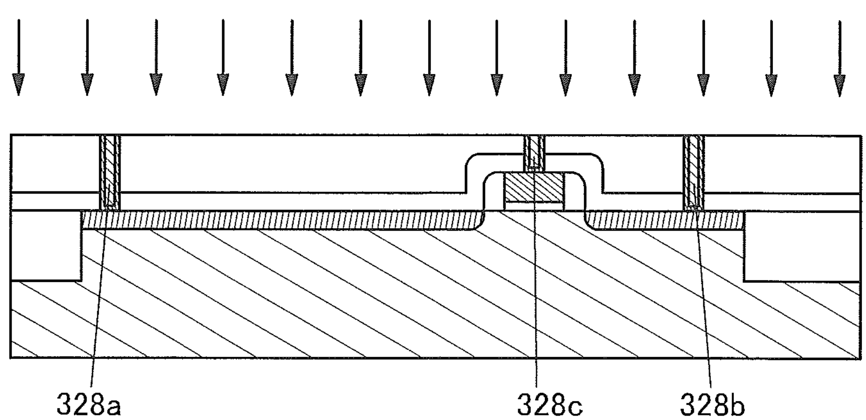

Next, planarization treatment is performed on the conductive film to expose the top surface of the insulator 322, whereby a conductor 328*a*, a conductor 328*b*, a conductor 328*c*, and the like are formed (FIG. 29D). Note that arrows in FIG. 29D represent CMP treatment. In the specification and the drawings, the conductor 328*a*, the conductor 328*b*, and the conductor 328*c* each function as a plug or a wiring and are collectively referred to as "conductor 328" in some cases. Note that in this specification, conductors functioning as a plug or a wiring are treated in a similar manner.

Figure 30A:
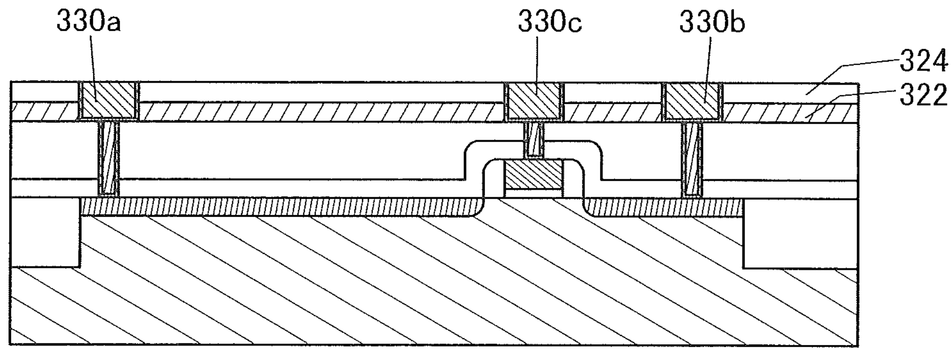
FIGS. 30A to 30C illustrate an example of a method for manufacturing a semiconductor device.

After the insulator 324 is formed over the insulator 322, a conductor 330*a*, a conductor 330*b*, and a conductor 330*c* are formed by a damascene process or the like (FIG. 30A). The insulator 324 can be formed using a material and a method similar to those used for forming the insulator 320. A conductive film to be the conductor 330 can be formed using a material and a method similar to those used for forming the conductor 328.

Figure 30B:
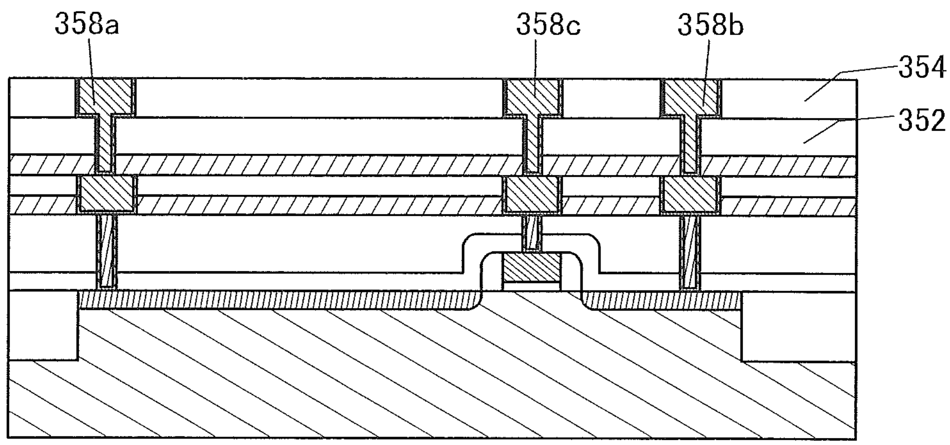

Then, the insulator 352 and the insulator 354 and formed, and after that, a conductor 358*a*, a conductor 358*b*, and a conductor 358*c* are formed in the insulator 352 and the insulator 354 by a dual damascene process or the like (FIG. 30B). The insulator 352 and the insulator 354 can be formed using a material and a method similar to those used for forming the insulator 320. A conductive film to be the conductor 358 can be formed using a material and a method similar to those used for forming the conductor 328.

Next, the transistor 400 is formed in the following manner. After the insulator 210 is formed, the insulator 212 and the insulator 214 that have a barrier property against hydrogen or oxygen are formed. The insulator 210 can be formed using a material and a method similar to those used for forming the insulator 320.

The insulator 212 and the insulator 214 can be formed by a sputtering method, a CVD method (including a thermal CVD method, an MOCVD method, and a PECVD method), an MBE method, an ALD method, or a PLD method, for example. In particular, when the insulator 212 or the insulator 214 is formed by an ALD method, it is possible to form a dense insulator that includes a small number of defects such as cracks or pinholes or has a uniform thickness.

Figure 30C:
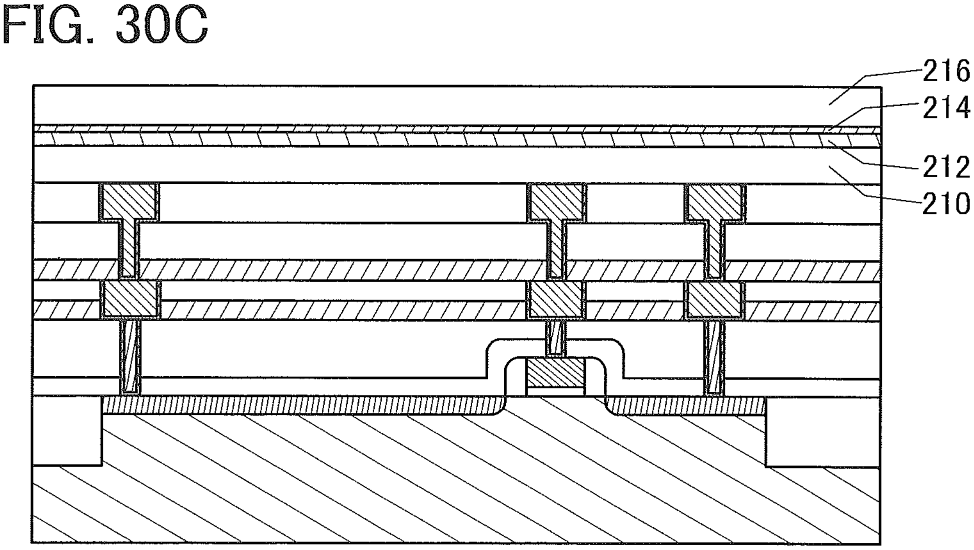

Then, the insulator 216 is formed over the insulator 214. The insulator 216 can be formed using a material and a method similar to those used for forming the insulator 210 (FIG. 30C).

Figure 31A:
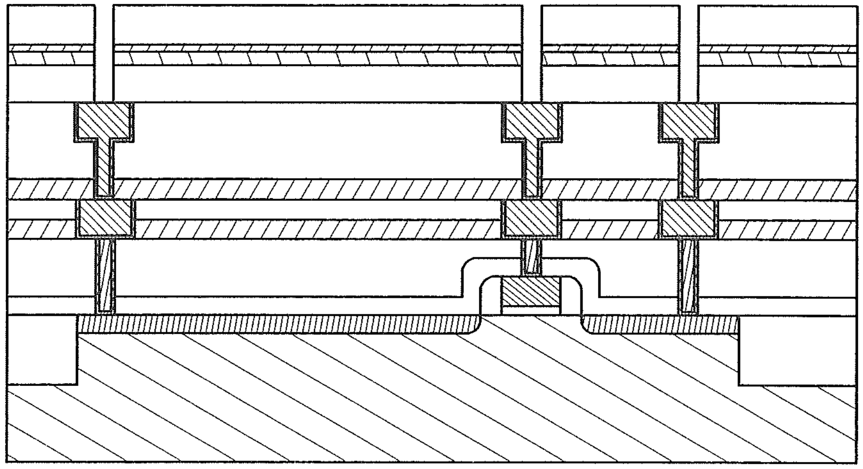
FIGS. 31A to 31C illustrate an example of a method for manufacturing a semiconductor device.

Next, openings that reach the conductor 358*a*, the conductor 358*b*, the conductor 358*c*, and the like are formed in the insulator 210, the insulator 212, the insulator 214, and the insulator 216 (FIG. 31A).

Figure 31B:
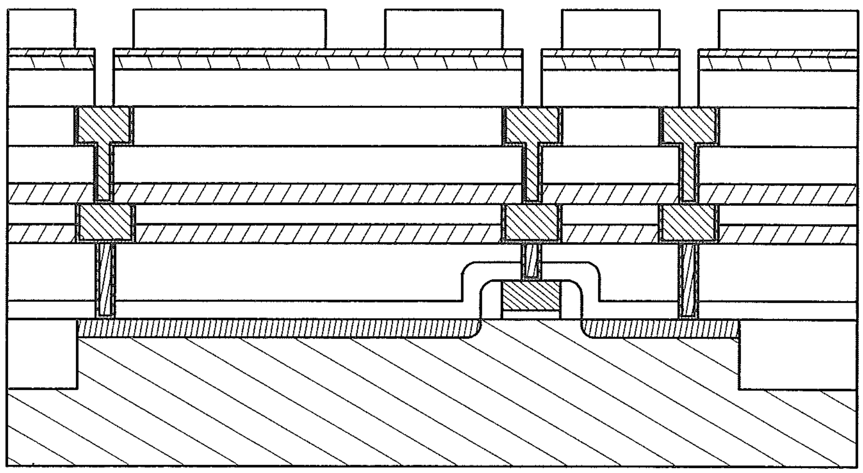

Subsequently, an opening is formed in a region of the insulator 216 where the gate electrode of the transistor 400 is to be formed. At this time, the openings that have been formed in the insulator 216 may be widened (FIG. 31B). By widening the openings formed in the insulator 216, an adequate design margin for plugs or wirings to be formed in a later step can be provided.

Figure 31C:
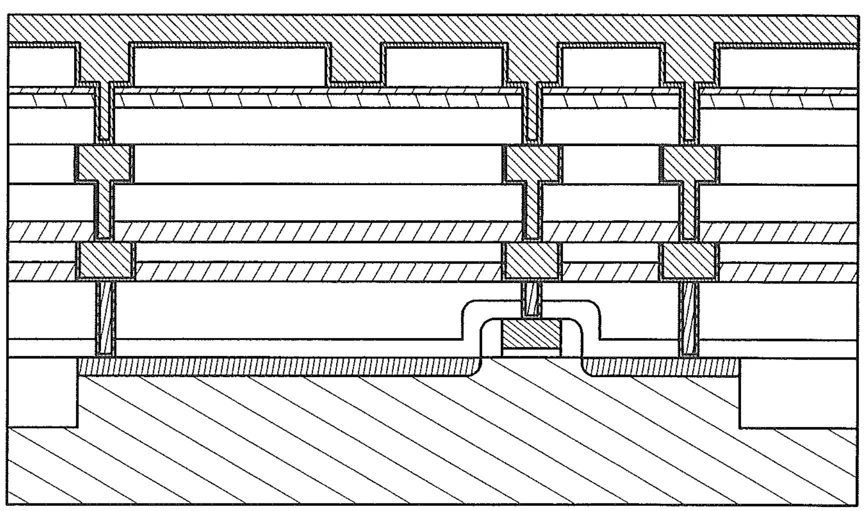
Figure 32A:
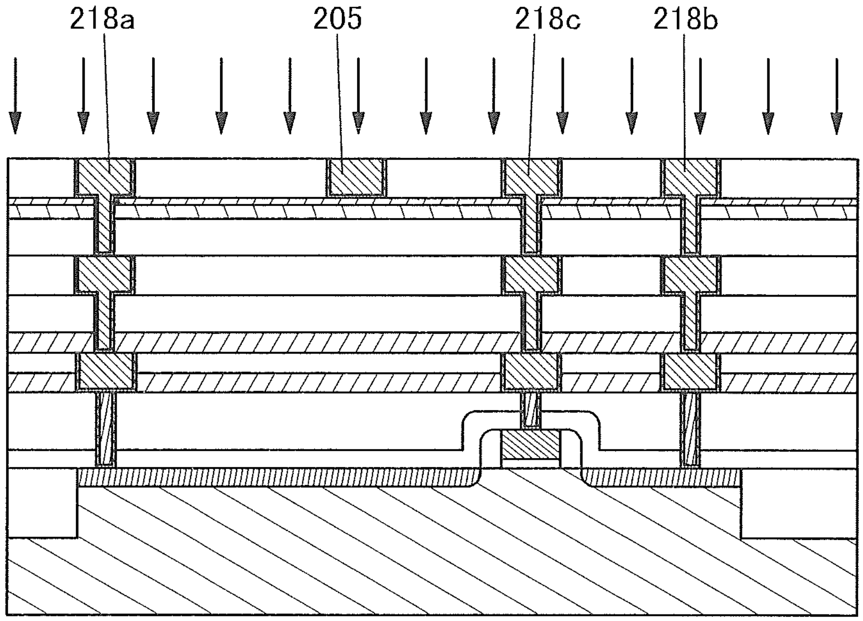
FIGS. 32A and 32B illustrate an example of a method for manufacturing a semiconductor device.

After that, a conductive film is formed to fill the openings (see FIG. 31C). The conductive film can be formed using a material and a method similar to those used for forming the conductor 328. Then, planarization treatment is performed on the conductive film to expose a top surface of the insulator 216, whereby a conductor 218*a*, a conductor 218*b*, a conductor 218*c*, and the conductor 205 are formed (FIG. 32A). Note that arrows in FIG. 32A represent CMP treatment.

Then, the insulator 220, the insulator 222, and the insulator 224 are formed. The insulator 220, the insulator 222, and the insulator 224 can be formed using a material and a method similar to those used for forming the insulator 210. It is particularly preferable to use a high-k material as the insulator 222.

Next, an oxide to be the oxide 230*a* and an oxide to be the oxide 230*b* are sequentially formed. The oxides are preferably formed successively without exposure to the air.

After the oxide to be the oxide 230*b* is formed, heat treatment is preferably performed. The heat treatment is performed at a temperature ranging from 250° C. to 650° C., preferably from 300° C. to 500° C. in an inert gas atmosphere, an atmosphere containing an oxidizing gas at 10 ppm or more, or a reduced-pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate released oxygen. The heat treatment may be performed directly after the formation of the oxide to be the oxide 230*b* or may be performed after the oxide to be the oxide 230*b* is processed into an island shape. By the heat treatment, oxygen can be supplied from the insulator formed under the oxide 230*a* to the oxide 230*a* and the oxide 230*b*, so that oxygen vacancies in the oxides can be reduced.

Then, a conductive film to be the conductor 240*a* and the conductor 240*b* is formed over the oxide to be the oxide 230*b*. Subsequently, a resist mask is formed by a method similar to that described above, and an unnecessary portion of the conductive film is removed by etching. After that, unnecessary portions of the oxides are removed by etching using the conductive film as a mask. Then, the resist mask is removed. In this manner, a stack including the island-shaped oxide 230*a*, the island-shaped oxide 230*b*, and the island-shaped conductive film can be formed.

Subsequently, a resist mask is formed over the island-shaped conductive film by a method similar to that described above, and an unnecessary portion of the conductive film is removed by etching. Next, the resist mask is removed; thus, the conductor 240*a* and the conductor 240*b* are formed.

Then, an oxide to be the oxide 230*c*, an insulator to be the insulator 250, and a conductive film to be the conductor 260 are sequentially formed. Next, a resist mask is formed over the conductive film by a method similar to that described above, and an unnecessary portion of the conductive film is removed by etching, whereby the conductor 260 is formed.

Then, an insulator to be the insulator 270 is formed over the insulator to be the insulator 250 and the conductor 260. The insulator to be the insulator 270 is preferably formed using a material with barrier properties against hydrogen and oxygen. Then, a resist mask is formed over the insulator by a method similar to that described above, and unnecessary portions of the insulator to be the insulator 270, the insulator to be the insulator 250, and the oxide to be the oxide 230*c* are removed by etching. After that, the resist mask is removed. Thus, the transistor 400 is completed.

Next, the insulator 280 is formed. The insulator 280 is preferably formed using an oxide containing oxygen in excess of that in the stoichiometric composition. After an insulator to be the insulator 280 is formed, planarization treatment using a CMP method or the like may be performed to improve the planarity of a top surface of the insulator.

To make the insulator 280 contain excess oxygen, the insulator 280 can be formed in an oxygen atmosphere, for example. Alternatively, a region containing excess oxygen may be formed by introducing oxygen into the insulator 280 that has been formed. Both the methods may be used in combination.

For example, oxygen (at least including any of oxygen radicals, oxygen atoms, and oxygen ions) is introduced into the insulator 280 that has been formed, whereby a region containing excess oxygen is formed. Oxygen can be introduced by an ion implantation method, an ion doping method, a plasma immersion ion implantation method, plasma treatment, or the like.

A gas containing oxygen can be used for the oxygen introduction treatment. Examples of a gas containing oxygen include oxygen, dinitrogen monoxide, nitrogen dioxide, carbon dioxide, and carbon monoxide. In the oxygen introduction treatment, a rare gas may be contained in the gas containing oxygen. For example, a mixed gas of carbon dioxide, hydrogen, and argon can be used.

An example of the oxygen introduction treatment is a method of stacking an oxide over the insulator 280 using a sputtering apparatus. For example, when the insulator 282 is formed in an oxygen gas atmosphere with a sputtering apparatus, oxygen can be introduced into the insulator 280 while the insulator 282 is formed.

Next, the insulator 284 is formed. The insulator 284 can be formed using a material and a method similar to those used for forming the insulator 210. The insulator 284 is preferably formed using aluminum oxide with a barrier property against oxygen or hydrogen, for example. In particular, when the insulator 284 is formed by an ALD method, it is possible to form a dense insulator that includes a small number of defects such as cracks or pinholes or has a uniform thickness.

Figure 32B:
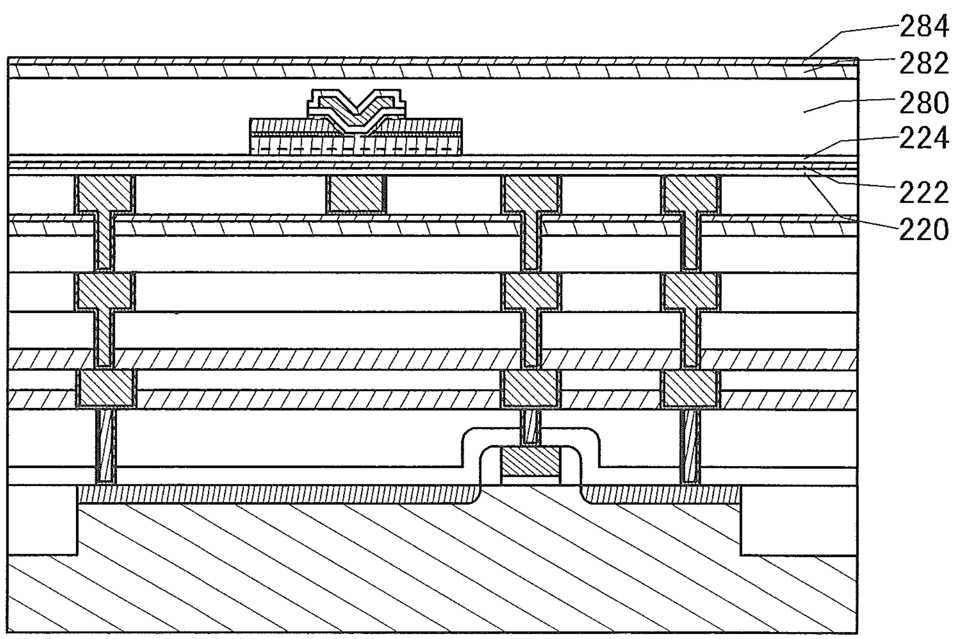

By stacking the insulator 284 having dense film quality over the insulator 282, excess oxygen introduced into the insulator 280 can be effectively sealed on the transistor 400 side (FIG. 32B).

Next, the capacitor 300 is formed in the following manner. First, the insulator 602 is formed over the insulator 284. The insulator 602 can be formed using a material and a method similar to those used for forming the insulator 210.

Then, openings that reach the conductor 218*a*, the conductor 218*b*, the conductor 218*c*, the conductor 240*a*, the conductor 240*b*, and the like are formed in the insulator 220, the insulator 222, the insulator 224, the insulator 280, the insulator 282, and the insulator 284.

After that, a conductive film is formed to fill the openings, and planarization treatment is performed on the conductive film to expose a top surface of the insulator 216. Thus, a conductor 244*a*, a conductor 244*b*, a conductor 244*c*, the conductor 246*a*, and the conductor 246*b* are formed. The conductive film can be formed using a material and a method similar to those used for forming the conductor 328.

Figure 33A:
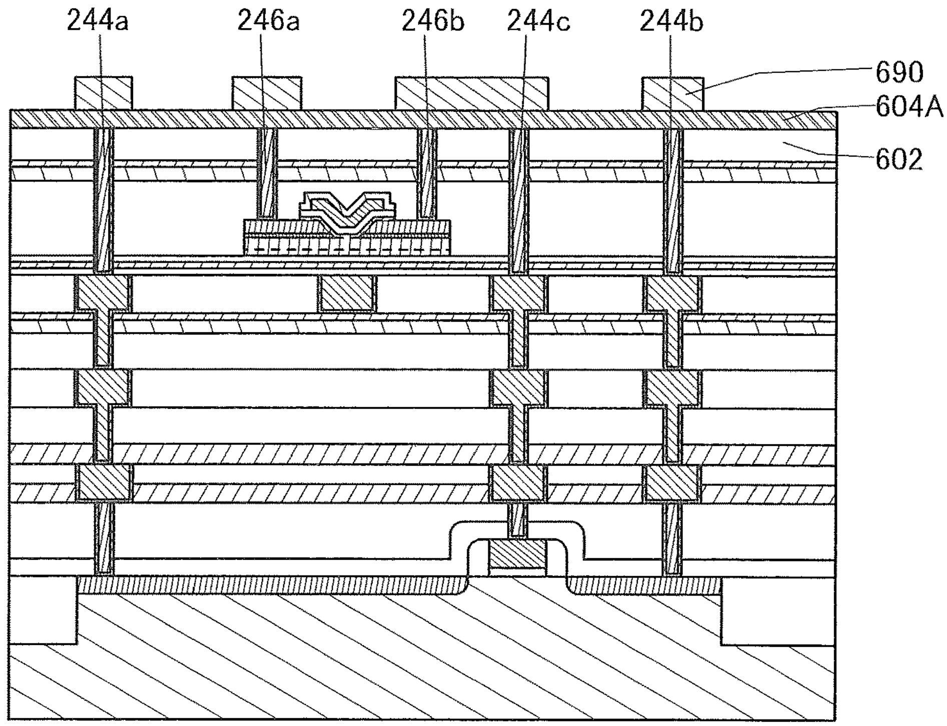
FIGS. 33A and 33B illustrate an example of a method for manufacturing a semiconductor device.

Next, a conductive film 604A is formed over the insulator 602. The conductive film 604A can be formed using a material and a method similar to those used for forming the conductor 328. Then, a resist mask 690 is formed over the conductive film 604A (FIG. 33A).

Figure 33B:
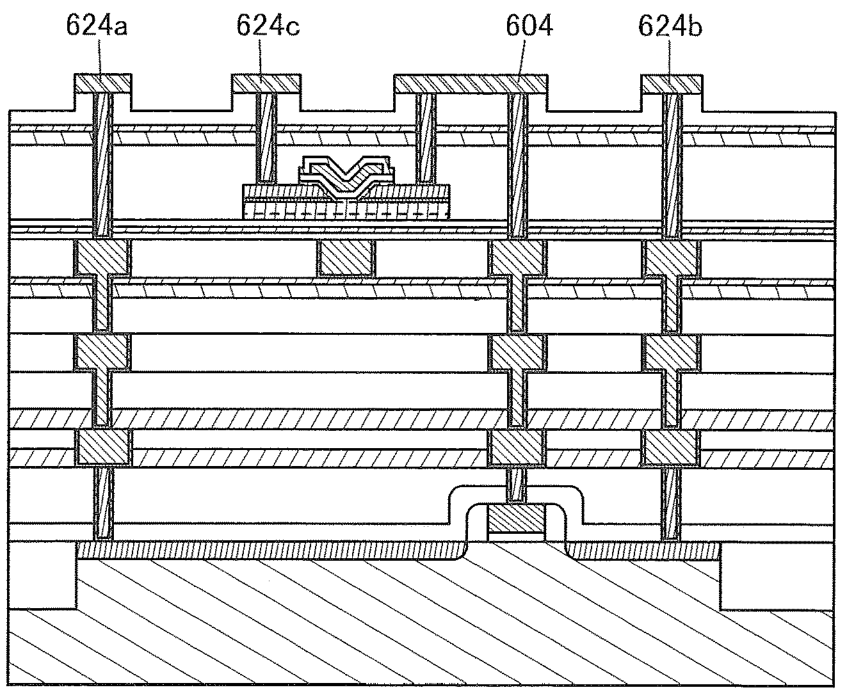

A conductor 624*a*, a conductor 624*b*, a conductor 624*c*, and the conductor 604 are formed by etching the conductive film 604A. Over-etching is performed as this etching treatment, whereby part of the insulator 602 can be removed at the same time (FIG. 33B). The depth of the removed portion of the insulator 602 needs to be larger than the thickness of the insulator 612 that is formed later. Formation of the conductor 604 with over-etching enables etching without an etching residue.

By switching the types of etching gases during the etching treatment, part of the insulator 602 can be removed efficiently.

As an alternative example, after the conductor 604 is formed, the resist mask 690 may be removed and part of the insulator 602 may be removed using the conductor 604 as a hard mask.

After the conductor 604 is formed, a surface of the conductor 604 may be subjected to cleaning treatment. By the cleaning treatment, an etching residue or the like can be removed.

Figure 25A:
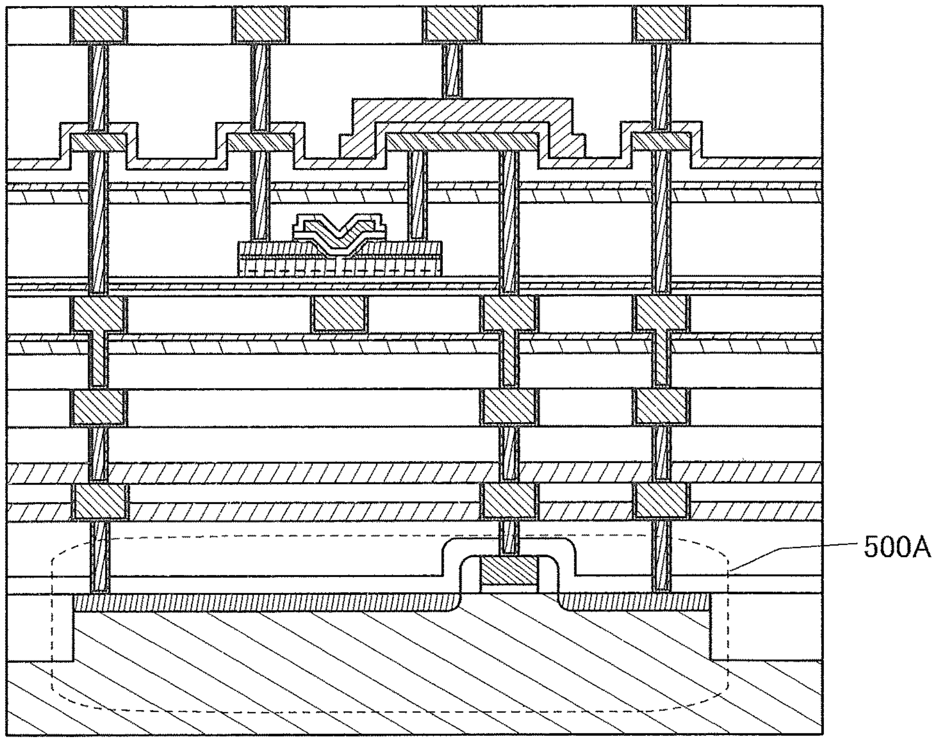
FIGS. 25A and 25B each illustrate a structure example of a semiconductor device.
Figure 25B:
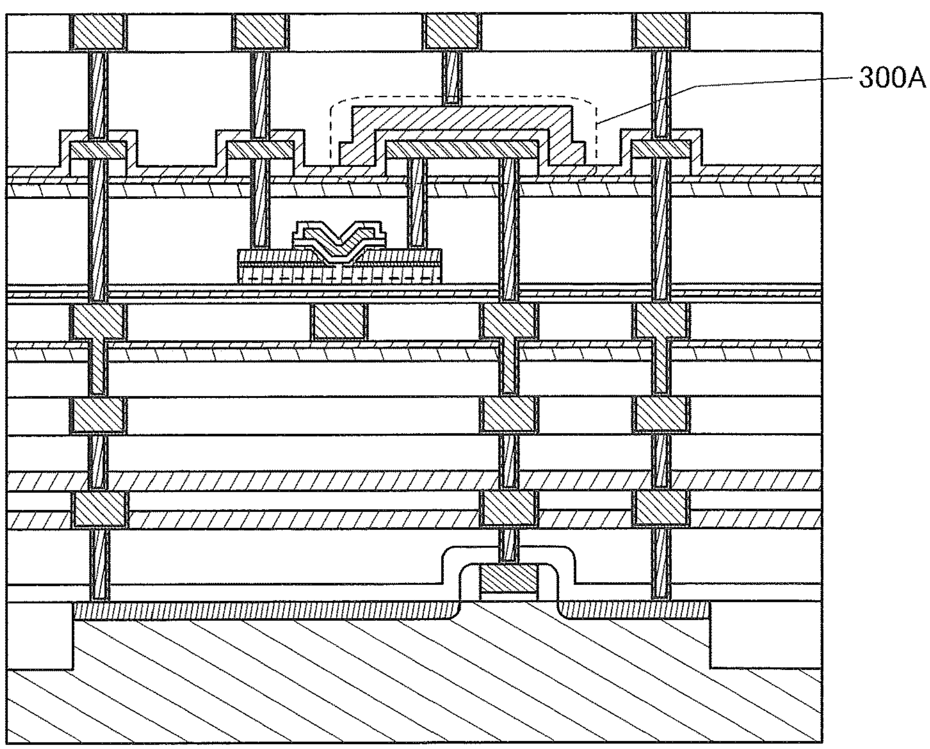

When the insulator 602 and the insulator 284 are films of different types, the insulator 284 may serve as an etching stopper film. In this case, the insulator 602 is formed in regions overlapped by the conductor 624 or the conductor 604 as illustrated in FIG. 25B.

Figure 34A:
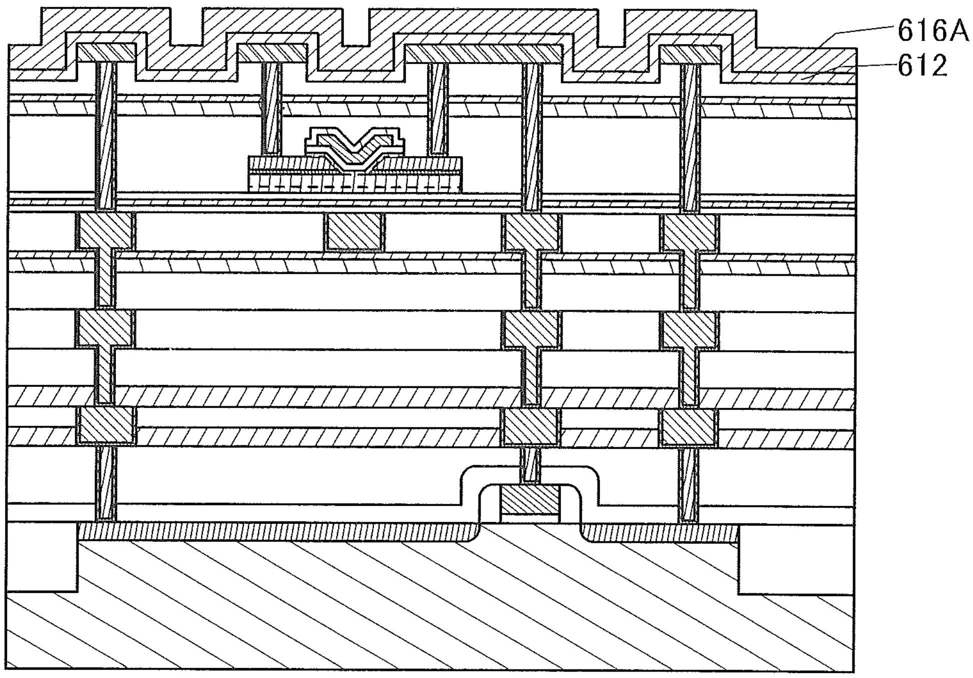
FIGS. 34A and 34B illustrate an example of a method for manufacturing a semiconductor device.

Then, the insulator 612 that covers the side surface and the top surface of the conductor 604 is formed (FIG. 34A). The insulator 612 has a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, the insulator 612 preferably has a stacked-layer structure of a high-k material (e.g., aluminum oxide) and a material with high dielectric strength (e.g., silicon oxynitride). Such a structure enables the capacitor 300 to have sufficient capacitance due to the high-k material and increased dielectric strength due to the material with high dielectric strength. Thus, the capacitor 300 can be prevented from being damaged by electrostatic discharge, which leads to improvement in the reliability of the capacitor 300.

Then, a conductive film 616A is formed over the insulator 612 (FIG. 34A). The conductive film 616A can be formed using a material and a method similar to those used for forming the conductor 604. Subsequently, a resist mask is formed over the conductive film 616A, and an unnecessary portion of the conductive film 616A is removed by etching. After that, the resist mask is removed, whereby the conductor 616 is formed.

Figure 34B:
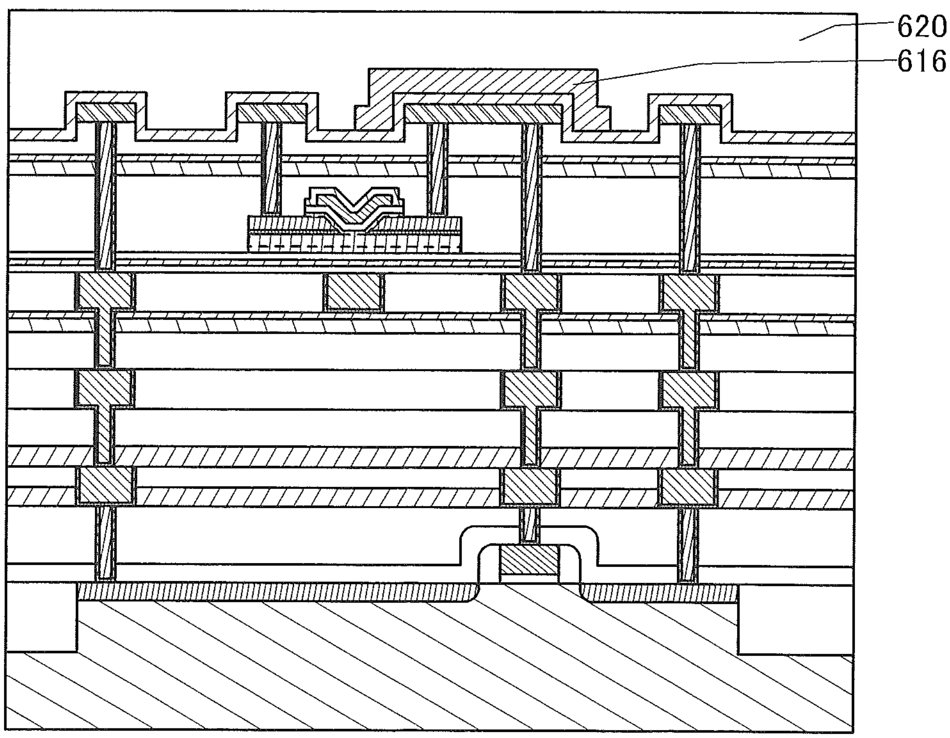

Then, the insulator 620 covering the capacitor 300 is formed (FIG. 34B). The insulator 620 can be formed using a material and a method similar to those used for forming the insulator 602 and the like.

Next, openings that reach the conductor 624*a*, the conductor 624*b*, the conductor 624*c*, the conductor 604, and the like are formed in the insulator 620.

Then, a conductive film is formed to fill the openings, and planarization treatment is performed on the conductive film to expose a top surface of the insulator 620. Thus, a conductor 626*a*, a conductor 626*b*, a conductor 626*c*, and a conductor 626*d* are formed. Note that the conductive film can be formed using a material and a method similar to those used for forming the conductor 244.

Subsequently, a conductive film to be the conductor 626 is formed. The conductive film can be formed by a sputtering method, a CVD method (including a thermal CVD method, an MOCVD method, and a PECVD method), an MBE method, an ALD method, a PLD method, or others. In particular, the conductive film is formed preferably by a CVD method, more preferably a PECVD method because coverage can be further improved. A thermal CVD method, an MOCVD method, or an ALD method is preferably used to reduce plasma damage.

The conductive film to be the conductor 626 can be formed using, for example, a metal selected from aluminum, chromium, copper, tantalum, titanium, molybdenum, and tungsten; an alloy containing any of these metals as a component; or an alloy containing any of these metals in combination. Moreover, one or both of manganese and zirconium may be used. A semiconductor typified by polycrystalline silicon doped with an impurity element (e.g., phosphorus) or a silicide such as nickel silicide may be used. For example, the conductive film can have any of the following structures: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order. Alternatively, an alloy film or a nitride film that contains aluminum and one or more elements selected from titanium, tantalum, tungsten, molybdenum, chromium, neodymium, and scandium may be used.

Next, a resist mask is formed over the conductive film to be the conductor 626 by a method similar to that described above, and an unnecessary portion of the conductive film is removed by etching. Then, the resist mask is removed, whereby the conductor 626*a*, the conductor 626*b*, the conductor 626*c*, and the conductor 626*d* are formed.

Figure 35:
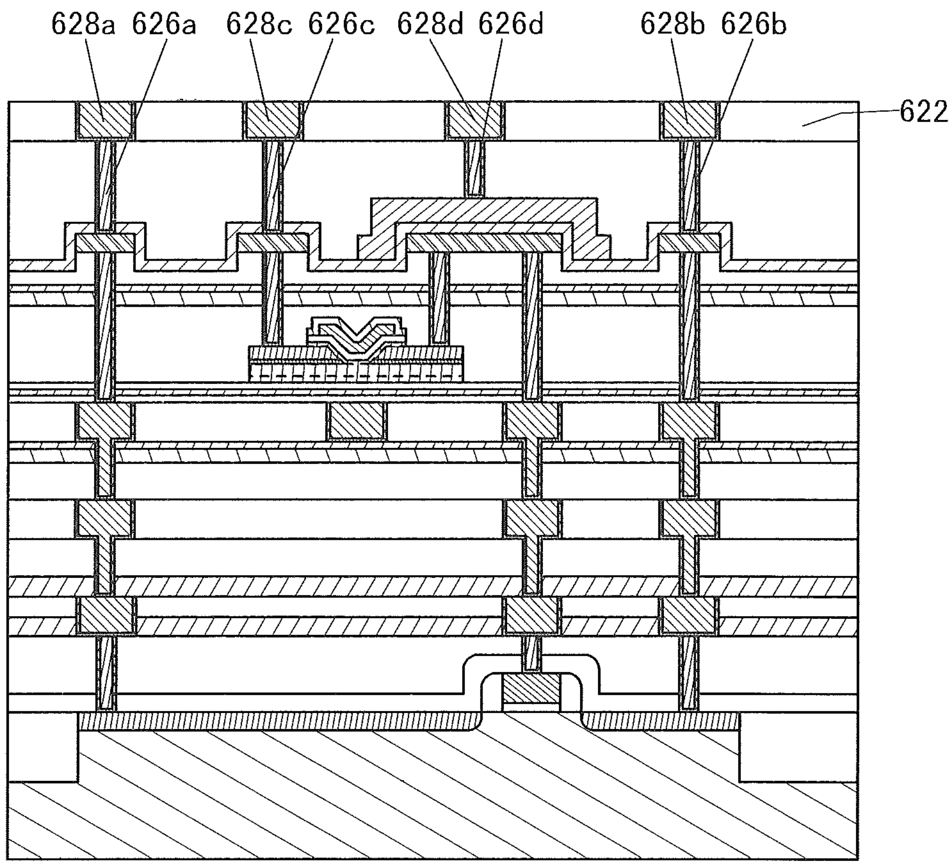
FIG. 35 illustrates an example of a method for manufacturing a semiconductor device.

Then, the insulator 622 is formed over the insulator 620 (FIG. 35). The insulator 622 can be formed using a material and a method similar to those used for forming the insulator 602 and the like.

Next, openings that reach the conductor 626*a*, the conductor 626*b*, the conductor 626*c*, and the conductor 626*d* are formed in the insulator 622.

Then, a conductive film is formed to fill the openings, and planarization treatment is performed on the conductive film to expose a top surface of the insulator 622; thus, a conductor 628*a*, a conductor 628*b*, a conductor 628*c*, and a conductor 628*d* are formed. Note that the conductive film can be formed using a material and a method similar to those used for forming the conductor 244.

Through the above steps, the semiconductor device in one embodiment of the present invention can be manufactured.

At least part of this embodiment can be implemented in combination with any of the other embodiments s described in this specification as appropriate.

(Embodiment 4)

In this embodiment, application examples of the semiconductor device described in the foregoing embodiment to a display panel, an application example of a display module, and application examples of the display module to an electronic device will be described with reference to FIGS. 36A and 36B, FIG. 37, and FIGS. 38A to 38E.

<Examples of Mounting Semiconductor Device on Display Panel>

Application examples of a semiconductor device functioning as a source driver IC to a display panel will be described with reference to FIGS. 36A and 36B.

Figure 36A:
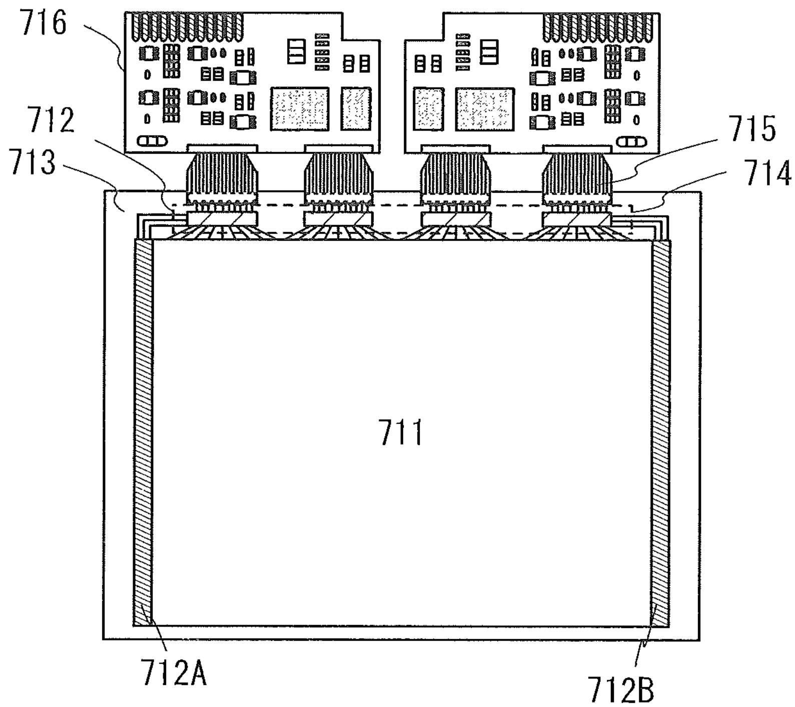
FIGS. 36A and 36B each illustrate an example of a display panel.

In the example of FIG. 36A, a source driver 712 and gate drivers 712A and 712B are provided around a display portion 711 of a display panel, and a source driver IC 714 including a semiconductor device is mounted on a substrate 713 as the source driver 712.

The source driver IC 714 is mounted on the substrate 713 using an anisotropic conductive adhesive and an anisotropic conductive film.

The source driver IC 714 is connected to an external circuit board 716 via an FPC 715.

Figure 36B:
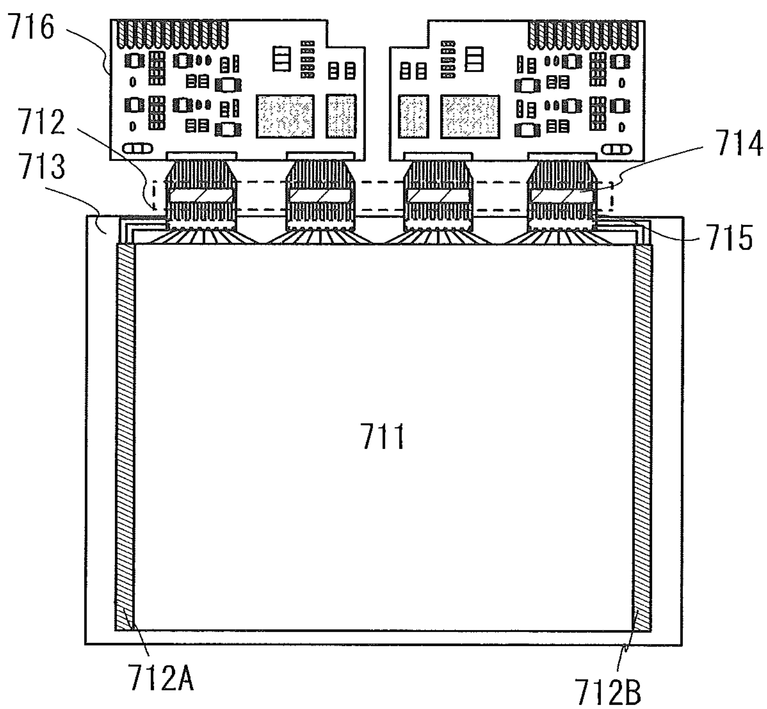

In the example of FIG. 36B, the source driver 712 and the gate drivers 712A and 712B are provided around the display portion 711, and the source driver IC 714 is mounted on the FPC 715 as the source driver 712.

Mounting the source driver IC 714 on the FPC 715 allows a larger display portion 711 to be provided over the substrate 713, resulting in a narrower frame.

<Application Example of Display Module>

Next, an application example of a display module using the display panel illustrated in FIG. 36A or FIG. 36B will be described with reference to FIG. 37.

Figure 37:
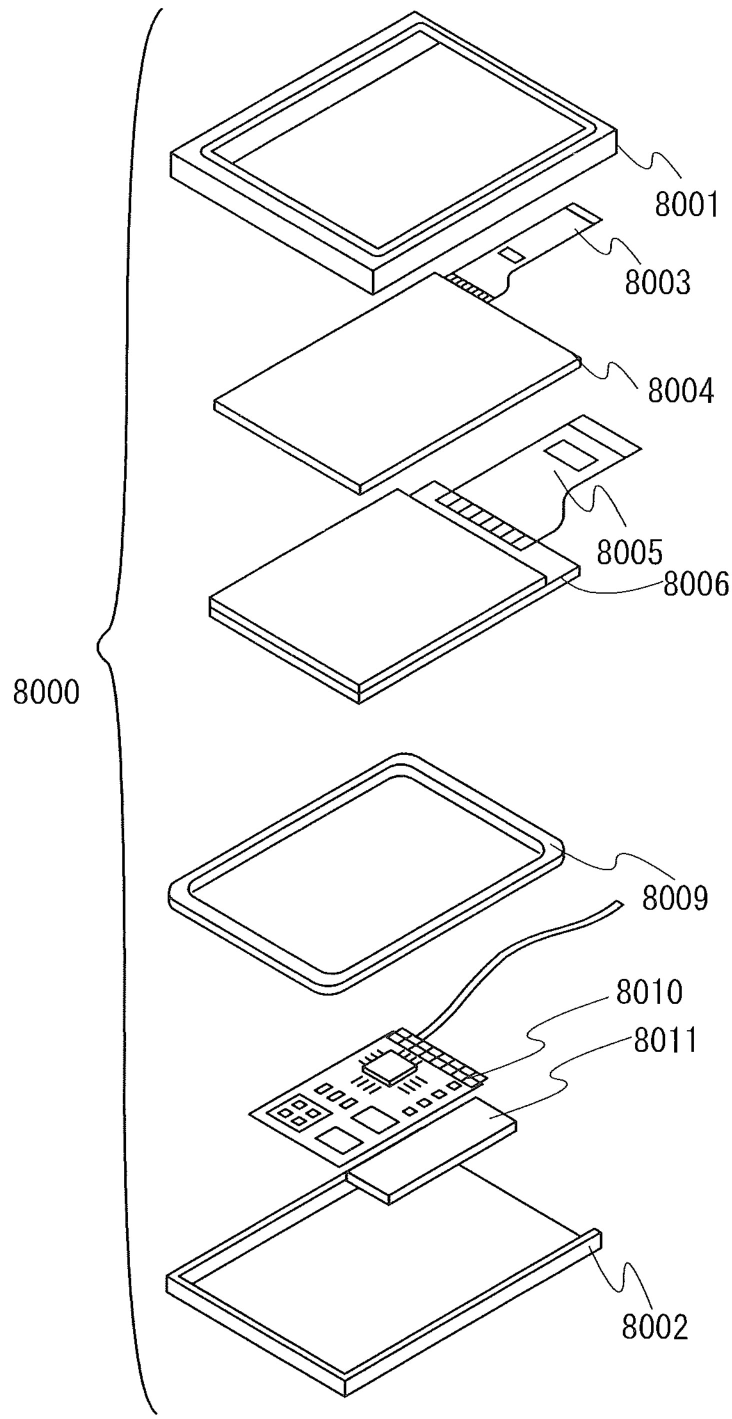
FIG. 37 illustrates an example of a display module.

In a display module 8000 in FIG. 37, a touch panel 8004 connected to an FPC 8003, a display panel 8006 connected to an FPC 8005, a frame 8009, a printed circuit board 8010, and a battery 8011 are provided between an upper cover 8001 and a lower cover 8002. Note that the battery 8011, the touch panel 8004, and the like are not provided in some cases.

The display panel illustrated in FIG. 36A or FIG. 36B can be used as the display panel 8006 in FIG. 37.

The shape and/or size of the upper cover 8001 and the lower cover 8002 can be changed as appropriate in accordance with the size of the touch panel 8004 and the display panel 8006.

The touch panel 8004 can be a resistive touch panel or a capacitive touch panel and can overlap the display panel 8006. A counter substrate (sealing substrate) of the display panel 8006 can have a touch panel function. Alternatively, a photosensor may be provided in each pixel of the display panel 8006 so that an optical touch panel is obtained. Further alternatively, an electrode for a touch sensor may be provided in each pixel of the display panel 8006 so that a capacitive touch panel is obtained. In such cases, the touch panel 8004 can be omitted.

The frame 8009 protects the display panel 8006 and functions as an electromagnetic shield for blocking electromagnetic waves generated by the operation of the printed circuit board 8010. The frame 8009 may also function as a radiator plate.

The printed circuit board 8010 is provided with a power supply circuit and a signal processing circuit for outputting a video signal and a clock signal. As a power source for supplying power to the power supply circuit, an external commercial power source or a separate power source using the battery 8011 may be used. The battery 8011 can be omitted in the case of using a commercial power source.

The display module 8000 may be additionally provided with a polarizing plate, a retardation plate, a prism sheet, or the like.

<Application Examples of Display Module to Electronic Device>

Next, an electronic device using the above display module for a display panel will be described. Examples of the electronic device include a computer, a portable information appliance (including a mobile phone, a portable game machine, and an audio reproducing device), electronic paper, a television device (also referred to as television or television receiver), and a digital video camera.

Figure 38A:
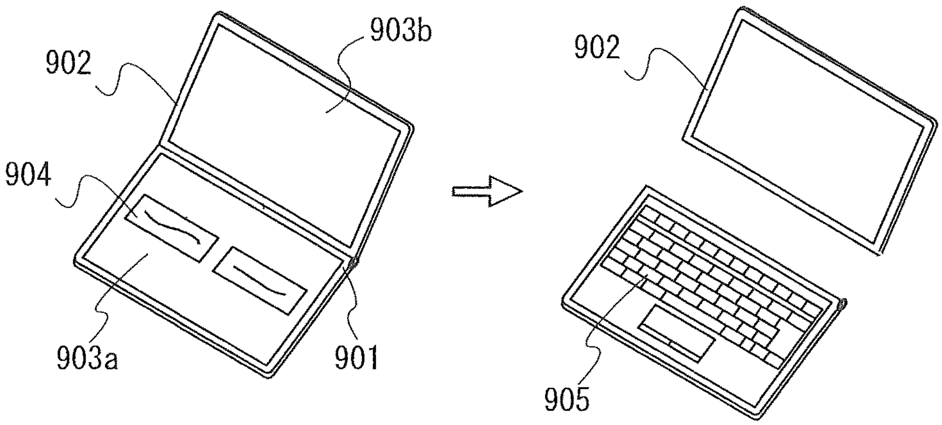
FIGS. 38A to 38E each illustrate an example of an electronic device.

FIG. 38A illustrates a portable information appliance that includes a housing 901, a housing 902, a first display portion 903*a*, a second display portion 903*b*, and the like. At least one of the housings 901 and 902 is provided with the display module including the semiconductor device of the foregoing embodiment. It is thus possible to obtain a portable information appliance with a smaller circuit area.

The first display portion 903*a* is a panel having a touch input function, and for example, as illustrated in the left of FIG. 38A, which of "touch input" and "keyboard input" is performed can be selected by a selection button 904 displayed on the first display portion 903*a*. Since selection buttons with a variety of sizes can be displayed, the information appliance can be easily used by people of any generation. For example, when "keyboard input" is selected, a keyboard 905 is displayed on the first display portion 903*a* as illustrated in the right of FIG. 38A. Thus, letters can be input quickly by keyboard input as in a conventional information appliance, for example.

One of the first display portion 903*a* and the second display portion 903*b* can be detached from the portable information appliance as shown in the right of FIG. 38A. Providing the second display portion 903*b* with a touch input function makes the information appliance convenient because a weight to carry around can be further reduced and the information appliance can operate with one hand while the other hand supports the housing 902.

The portable information appliance in FIG. 38A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. An external connection terminal (e.g., an earphone terminal or a USB terminal), a recording medium insertion portion, and the like may be provided on the back surface or the side surface of the housing.

The portable information appliance illustrated in FIG. 38A may transmit and receive data wirelessly. Through wireless communication, desired book data or the like can be purchased and downloaded from an electronic book server.

Furthermore, the housing 902 in FIG. 38A may be equipped with an antenna, a microphone function, and/or a wireless communication function so that the information appliance can be used as a mobile phone.

Figure 38B:
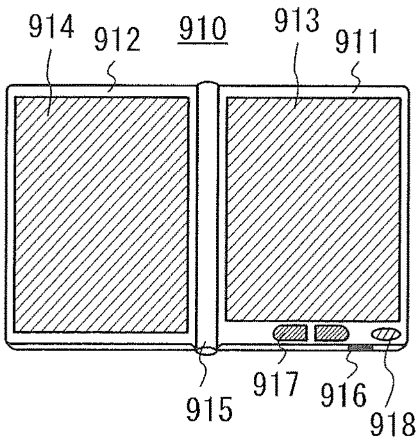

FIG. 38B illustrates an e-book reader 910 including electronic paper. The e-book reader 910 includes two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The display module including the semiconductor device of the foregoing embodiment is provided in at least one of the housings 911 and 912. It is thus possible to obtain an e-book reader with a smaller circuit area.

Figure 38C:
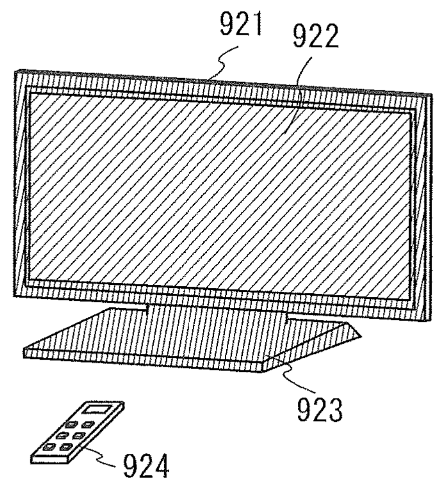

FIG. 38C illustrates a television device including a housing 921, a display portion 922, a stand 923, and the like. The television device can be controlled by a switch of the housing 921 and/or a remote controller 924. The display module including the semiconductor device of the foregoing embodiment is mounted on the housing 921 and the remote controller 924. Consequently, it is possible to obtain a television device with a smaller circuit area.

Figure 38D:
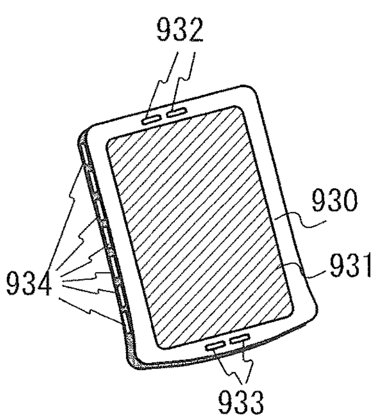

FIG. 38D illustrates a smartphone in which a main body 930 is provided with a display portion 931, a speaker 932, a microphone 933, an operation button 934, and the like. The display module including the semiconductor device of the foregoing embodiment is provided in the main body 930. It is thus possible to obtain a smartphone with a smaller circuit area.

Figure 38E:
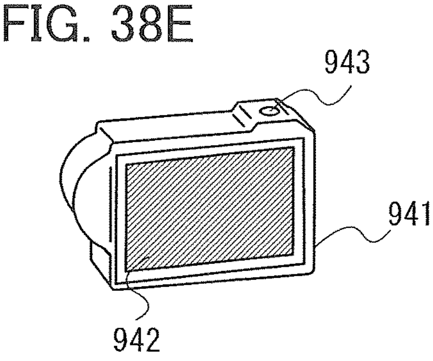

FIG. 38E illustrates a digital camera including a main body 941, a display portion 942, an operation switch 943, and the like. The display module including the semiconductor device of the foregoing embodiment is provided in the main body 941. Thus, it is possible to obtain a digital camera with a smaller circuit area.

As described above, the display module including the semiconductor device of the foregoing embodiment is provided in the electronic device shown in this embodiment. It is thus possible to obtain an electronic device with a smaller circuit area.

(Supplementary Notes on Description in this Specification and the Like)

The following are notes on the description of Embodiments 1 to 4 and the structures in Embodiments 1 to 4.

<Notes on One Embodiment of the Present Invention Described in Embodiments>

One embodiment of the present invention can be constituted by appropriately combining the structure described in an embodiment with any of the structures described in the other embodiments. In the case where a plurality of structure examples are described in one embodiment, any of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with a text in the specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

<Notes on Description for Drawings>

In this specification and the like, terms for explaining arrangement, such as "over" and "under," are used for convenience to indicate a positional relation between components with reference to drawings. The positional relation between components is changed as appropriate in accordance with a direction in which the components are described. Therefore, the terms for explaining arrangement are not limited to those used in the specification and can be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can also mean the case where another component is provided between the insulating layer A and the electrode B.

In a block diagram in this specification and the like, components are functionally classified and shown by blocks that are independent of each other. However, in an actual circuit and the like, such components are sometimes hard to classify functionally, and there is a case where one circuit is associated with a plurality of functions or a case where a plurality of circuits are associated with one function. Therefore, the segmentation of blocks in a block diagram is not limited by any of the components described in the specification and can be differently determined as appropriate depending on the situation.

In the drawings, the size, the layer thickness, or the region is determined arbitrarily for description convenience; therefore, embodiments of the present invention are not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

<Notes on Expressions that can be Rephrased>

In this specification and the like, the terms "one of a source and a drain" (or first electrode or first terminal) and "the other of the source and the drain" (or second electrode or second terminal) are used to describe the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground voltage, for example, "voltage" can be replaced with "potential." A ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, in some cases, the term “conductive film” can be used instead of “conductive layer,” and the term “insulating film” can be used instead of “insulating layer.”

This specification and the like show a 1T-1C circuit configuration where one pixel has one transistor and one capacitor and a 2T-1C circuit configuration where one pixel has two transistors and one capacitor; however, one embodiment of the present invention is not limited to these. It is possible to employ a circuit configuration where one pixel has three or more transistors and two or more capacitors. Moreover, a variety of circuit configurations can be obtained by formation of an additional wiring.

<Notes on Term Definitions>

The following are definitions of the terms mentioned in the above embodiments.

<<Switch>>

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the “on state” of the transistor refers to a state in which a source and a drain of the transistor are regarded as being electrically short-circuited. The “off state” of the transistor refers to a state in which the source and the drain of the transistor are regarded as being electrically disconnected. In the case where a transistor operates just as a switch, there is no particular limitation on the polarity (conductivity type) of the transistor.

An example of a mechanical switch is a switch formed using a microelectromechanical system (MEMS) technology, such as a digital micromirror device (DMD). Such a switch includes an electrode that can be moved mechanically, and its conduction and non-conduction is controlled with movement of the electrode.

<<Pixel>>

In this specification and the like, one pixel refers to one element whose brightness can be controlled, for example. Therefore, for example, one pixel corresponds to one color element by which brightness is expressed. Accordingly, in a color display device using color elements of red (R), green (G), and blue (B), the smallest unit of an image is formed of three pixels of an R pixel, a G pixel, and a B pixel.

Note that the number of colors for color elements is not limited to three, and more colors may be used. For example, RGBW (W: white) can be employed, or yellow, cyan, or magenta can be added to RGB.

<<Display Element>>

In this specification and the like, a display element includes a display medium whose contrast, luminance, reflectivity, transmittance, or the like is changed by electrical or magnetic effect. Examples of a display element include an electroluminescent (EL) element, an LED chip (e.g., a white LED chip, a red LED chip, a green LED chip, and a blue LED chip), a transistor (a transistor that emits light depending on current), an electron emitter, a display element using a carbon nanotube, a liquid crystal element, electronic ink, an electrowetting element, an electrophoretic element, a plasma display panel (PDP), a display element using micro-electromechanical systems (MEMS) (e.g., a grating light valve (GLV), a digital micromirror device (DMD), a digital micro shutter (DMS), Mirasol (registered trademark), an interferometric modulator display (IMOD) element, a MEMS shutter display element, an optical-interference-type MEMS display element, and a piezoelectric ceramic display), and a display element using a quantum dot. An example of a display device including EL elements is an EL display. Examples of a display device including electron emitters are a field emission display (FED) and an SED-type flat panel display (SED: surface-conduction electron-emitter display). Examples of a display device including liquid crystal elements include liquid crystal displays (e.g., a transmissive liquid crystal display, a transflective liquid crystal display, a reflective liquid crystal display, a direct-view liquid crystal display, and a projection liquid crystal display). An example of a display device including electronic ink, electronic liquid powder (registered trademark), or electrophoretic elements is electronic paper. An example of a display device containing quantum dots in each pixel is a quantum dot display. Note that quantum dots may be provided not as display elements but as part of a backlight. The use of quantum dots enables display with high color purity. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes; thus, power consumption can be further reduced. In the case of using an LED chip, graphene or graphite may be provided under an electrode or a nitride semiconductor of the LED chip. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED chip can be formed. Note that an AlN layer may be provided between graphene or graphite and the n-type GaN semiconductor layer including crystals. The GaN semiconductor layers included in the LED chip may be formed by MOCVD. Note that when graphene is provided, the GaN semiconductor layers included in the LED chip can also be formed by a sputtering method. In a display element using MEMS, a drying agent may be provided in a space where the display element is sealed (e.g., a space between an element substrate where the display element is placed and a counter substrate opposite to the element substrate). Providing a drying agent can prevent MEMS and the like from becoming difficult to move and/or deteriorating easily because of moisture or the like.

<<Connection>>

In this specification and the like, when it is described that “A and B are connected to each other,” the case where A and B are electrically connected to each other is included in addition to the case where A and B are directly connected to each other. Here, the expression “A and B are electrically connected” means that electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

This application is based on Japanese Patent Application serial no. 2015-249242 filed with Japan Patent Office on Dec. 22, 2015, the entire contents of which are hereby incorporated by reference.

What is claimed is:

1. A semiconductor device comprising:

a frame memory comprising a memory cell comprising a first transistor, a second transistor, and a capacitor;

a source driver comprising a first buffer circuit comprising a first operational amplifier; and a gate driver comprising a second buffer circuit comprising a second operational amplifier, wherein the first operational amplifier is supplied with a first positive power supply voltage and a ground potential, wherein the second operational amplifier is supplied with a second positive power supply voltage and a negative power supply voltage, wherein one of a source and a drain of the first transistor is electrically connected to a gate of the second transistor and one electrode of the capacitor, wherein the first transistor in an off state is configured to make the gate of the second transistor retain charge corresponding to data, and wherein a voltage applied to the gate of the first transistor to turn off the first transistor is lower than the ground potential, and is equal to the negative power supply voltage.

2. The semiconductor device according to claim 1, further comprising a voltage generator circuit, wherein the voltage generator circuit is configured to generate the first positive power supply voltage, the ground potential, and the voltage applied to the gate of the first transistor.

3. The semiconductor device according to claim 1, wherein a channel formation region of the first transistor comprises an oxide semiconductor.

4. The semiconductor device according to claim 1, wherein a channel formation region of the second transistor comprises silicon.

5. The semiconductor device according to claim 1, wherein a layer comprising the first transistor is placed above a layer comprising the second transistor.

6. A display panel comprising:

the semiconductor device according to claim 1; and a display device.

7. An electronic device comprising:

the display panel according to claim 6; and a control unit.

8. A semiconductor device comprising:

a frame memory comprising a memory cell comprising a first transistor, a second transistor, and a capacitor;

a source driver comprising a first buffer circuit comprising a first operational amplifier; and a gate driver comprising a second buffer circuit comprising a second operational amplifier, wherein the first operational amplifier is supplied with a first positive power supply voltage and a ground potential, wherein the second operational amplifier is supplied with a second positive power supply voltage and a negative power supply voltage, wherein one of a source and a drain of the first transistor is electrically connected to a gate of the second transistor and one electrode of the capacitor, wherein the first transistor in an off state is configured to make the gate of the second transistor retain charge corresponding to data, wherein a first voltage applied to the gate of the first transistor to turn off the first transistor is lower than the ground potential, wherein the negative power supply voltage is lower than the first voltage, and wherein a second voltage applied to the gate of the first transistor to turn on the first transistor is lower than the first positive power supply voltage.

9. The semiconductor device according to claim 8, further comprising a voltage generator circuit, wherein the voltage generator circuit is configured to generate the first positive power supply voltage, the ground potential, the first voltage, and the second voltage.

10. The semiconductor device according to claim 8, further comprising a display controller, wherein the display controller is configured to transfer the data retained in the frame memory to the source driver in a period during which an output voltage of the first buffer circuit is stable in one gate scan period.

11. The semiconductor device according to claim 8, wherein a channel formation region of the first transistor comprises an oxide semiconductor.

12. The semiconductor device according to claim 8, wherein a channel formation region of the second transistor comprises silicon.

13. The semiconductor device according to claim 8, wherein a layer comprising the first transistor is placed above a layer comprising the second transistor.

14. A display panel comprising:

the semiconductor device according to claim 8; and a display device.

15. An electronic device comprising:

the display panel according to claim 14; and a control unit.

* * * * *